United States Patent
El-Ahmadi et al.

(10) Patent No.: US 9,496,960 B2
(45) Date of Patent: Nov. 15, 2016

(54) PLUGGABLE OPTICAL TRANSCEIVERS WITH INTEGRATED ELECTRONIC DISPERSION COMPENSATION

(71) Applicants: Siraj Nour El-Ahmadi, Dallas, TX (US); Salam El Ahmadi, Dallas, TX (US); Adam R. Hotchkiss, Richardson, TX (US); Gabriel E. Cardona, Richardson, TX (US)

(72) Inventors: Siraj Nour El-Ahmadi, Dallas, TX (US); Salam El Ahmadi, Dallas, TX (US); Adam R. Hotchkiss, Richardson, TX (US); Gabriel E. Cardona, Richardson, TX (US)

(73) Assignee: Menara Networks, Inc., Dallas, TX (US)

(*) Notice: Subject to any disclaimer, the term of this patent is extended or adjusted under 35 U.S.C. 154(b) by 0 days.

(21) Appl. No.: 14/854,674

(22) Filed: Sep. 15, 2015

(65) Prior Publication Data
US 2016/0006513 A1    Jan. 7, 2016

Related U.S. Application Data

(63) Continuation of application No. 14/589,635, filed on Jan. 5, 2015, which is a continuation-in-part of application No. 13/784,998, filed on Mar. 5, 2013, now Pat. No. 8,929,744, which is a
(Continued)

(51) Int. Cl.
*H04B 10/00* (2013.01)
*H04B 10/40* (2013.01)
(Continued)

(52) U.S. Cl.
CPC .......... *H04B 10/40* (2013.01); *H04B 10/2569* (2013.01); *H04B 10/25133* (2013.01);
(Continued)

(58) Field of Classification Search
CPC H04B 10/40; H04B 10/43; H04B 10/25133; H04B 10/2569; H04L 1/0042; H04L 1/0057; G02B 6/4284; G02B 6/4292; H04J 3/1652; H04J 3/047; H04J 14/08; H04J 2203/006; H04J 2203/0085
USPC ................. 398/135, 138, 128, 130
See application file for complete search history.

(56) References Cited

U.S. PATENT DOCUMENTS

| | | | |
|---|---|---|---|
| 5,781,320 A | * | 7/1998 | Byers ................. H04Q 11/0478 370/395.51 |
| 7,106,968 B2 | | 9/2006 | Lahav et al. |

(Continued)

FOREIGN PATENT DOCUMENTS

CN    101662335 B    7/2013

OTHER PUBLICATIONS

Mark Telford; Shrinking Transceivers Drive InP Integration; Technical Feature—InP Circuit Integration—PCT/US2007/008848 Apr. 4, 2008; III-Vs Review the Advanced Semiconductor Magazine; vol. 16—No. 5, Jun./Jul. 2003.
(Continued)

*Primary Examiner* — M. R. Sedighian
(74) *Attorney, Agent, or Firm* — Clements Bernard PLLC; Lawrence A. Baratta, Jr.; Christopher L. Bernard

(57) ABSTRACT

Integrated performance monitoring (PM); optical layer operations, administration, maintenance, and provisioning (OAM&P); alarming; amplification, and the like is described in optical transceivers, such as multi-source agreement (MSA)-defined modules. A pluggable optical transceiver defined by an MSA agreement can include advanced integrated functions for carrier-grade operation which preserves the existing MSA specifications allowing the pluggable optical transceiver to operate with any compliant MSA host device with advanced features and functionality, such as Forward Error Correction (FEC), framing, and OAM&P directly on the pluggable optical transceiver. The advanced integrated can be implemented by the pluggable optical transceiver separate and independent from the host device.

17 Claims, 32 Drawing Sheets

Related U.S. Application Data continuation-in-part of application No. 13/025,947, filed on Feb. 11, 2011, now Pat. No. 8,412,051, which is a continuation-in-part of application No. 12/120,149, filed on May 13, 2008, now Pat. No. 8,107,820, and a continuation-in-part of application No. 11/581,201, filed on Oct. 13, 2006, now Pat. No. 7,580,637.

(60) Provisional application No. 61/029,821, filed on Feb. 19, 2008.

(51) Int. Cl.
| | |
|---|---|
| H04L 1/00 | (2006.01) |
| H04B 10/2513 | (2013.01) |
| H04B 10/2569 | (2013.01) |
| H04J 3/16 | (2006.01) |
| H04J 14/08 | (2006.01) |
| G02B 6/42 | (2006.01) |
| H04J 3/04 | (2006.01) |

(52) U.S. Cl.
CPC .............. *H04J3/1652* (2013.01); *H04J 14/08* (2013.01); *H04L 1/0042* (2013.01); *H04L 1/0057* (2013.01); *G02B 6/4284* (2013.01); *G02B 6/4292* (2013.01); *H04J 3/047* (2013.01); *H04J 2203/006* (2013.01); *H04J 2203/0085* (2013.01)

(56) References Cited

U.S. PATENT DOCUMENTS

| | | | | |
|---|---|---|---|---|
| 7,107,414 | B2* | 9/2006 | Hidai | H04B 10/40 711/154 |
| 7,286,762 | B2* | 10/2007 | Elahmadi | H04B 10/2513 398/77 |
| 7,941,053 | B2 | 5/2011 | Dallesasse | |
| 7,995,927 | B2 | 8/2011 | Aronson et al. | |
| 8,155,519 | B2 | 4/2012 | Sheth et al. | |
| 8,249,447 | B2 | 8/2012 | Cai et al. | |
| 8,705,973 | B2* | 4/2014 | Ekkisogloy | H04B 10/40 398/135 |
| 2003/0123493 | A1 | 7/2003 | Takahashi | |
| 2003/0215243 | A1 | 11/2003 | Booth | |
| 2004/0030965 | A1 | 2/2004 | Hadjihassan et al. | |
| 2004/0033079 | A1 | 2/2004 | Sheth et al. | |
| 2004/0114924 | A1 | 6/2004 | Holness et al. | |
| 2004/0159776 | A1 | 8/2004 | Richard et al. | |
| 2005/0063711 | A1 | 3/2005 | Rossi et al. | |
| 2005/0285164 | A1* | 12/2005 | Hanberg | H04B 10/66 257/290 |
| 2006/0093379 | A1 | 5/2006 | Aronson | |
| 2007/0122148 | A1 | 5/2007 | Welch et al. | |
| 2008/0050074 | A1 | 2/2008 | Dallesasse et al. | |
| 2008/0089693 | A1 | 4/2008 | El-Ahmadi et al. | |
| 2008/0095541 | A1 | 4/2008 | Dallesasse | |
| 2011/0013911 | A1 | 1/2011 | Alexander et al. | |

OTHER PUBLICATIONS

Kazuhiko Terada, Kenji Kawai, Osamu Ishida, Keiji Kishine, Nobaru Iwasaki and Haruhiko Ichino; Physical Layer OAM&P Signaling Method for 10 Gbit/s Ethernet Transport over Optical Networks; Paper; IEICE Trans. Commun., vol. E 88 8, No. 10, Oct. 2005.

Optical PMD Overview, Tutorial T1A: 40/100GbE: What's Happening?, Chris Cole.

CFP MSA Hardware Specification, Revision 1.4, Jun. 7, 2010.

100Gb/s Clients: ECOC 100Gb/s Workshop 5, Sep. 20, 2009, Chris Cole.

SFF-836 QSFP+, SFF Committee, INF-8438i Specification for QSFP (Quad Small Formfactor Pluggable) Transceiver, Rev. 1.0, Nov. 2006.

OIF Multisource Agreement for 100G Long-Haul DWDM Transmission Module—Electromechanical IA # OIF-MSA-100GLH-EM-01.0, Jun. 8, 2010.

MSA Group Members; A Cooperation Agreement for 10 Gigabit Ethernet Transceiver Package; Issue 3.0, Sep. 18, 2002; XENPAK MSA.

MSA Group Members; A Cooperation Agreement for a Small Versatile 10 Gigabit Transceiver Package—Issue 2.0b, Apr. 7, 2005; X2 MSA, ZENPAK MSA.

Simon Stanley; 10-Gbit/s Ethernet Components—Session 11, 10-Gig Ethernet Transponders; Driving Growth in the Enterprise Presentation; Aug. 17, 2004.

SFF Committee, INF-8077i, 10 Gigabit Small Form Factor Pluggable Module. Revision 4.5 Aug. 31, 2005.

* cited by examiner

| Interface Provisioning<br>Commissioning and Acceptance | Alarming<br>Field Ops and Troubleshooting | Performance Monitoring<br>End to End SLAs |
|---|---|---|
| Traffic Provisioning<br>• FEC On/Off<br><br>Maintenance Activity<br>• Loopback towards DWDM Line or Host<br>• PRBS On/Off<br><br>Trace<br>• Tx Trace (16-bits)<br>• Rx Expected Trace<br>• Trace Check On/Off | G.709 Standard Backward Alarming<br>• BDI Local Receive<br><br>Remotely Fetched Alarms<br>• FE-LOS/LOF<br>• FE-FCE Degrade<br>• FE-FCE Excessive<br>• FE-AIS<br>• Loss of Comms<br>• FE-TIM<br><br>FE = Far End<br>FCE = FEC Corrected Error<br>TIM = Trail Identifier Mismatch | Far End PMs derived from Overhead Link (ODU)<br>• FE-EB (Errored Blocks)<br>• FE-ES (Errored Seconds)<br>• FE-SES (Severely ES)<br>• FE-UAS (Unavailable Sec)<br><br>FEC Errors communicated over comms channel<br>• FE-FCE (Corrected Errors)<br>• FE-FCER (Corrected BER)<br><br>FECR = FEC Corrected Error Ratio (BER) |

| Item | Value |
|---|---|
| Form Factor | SFP MSA, SFP+ MSA |
| Bit Rates | 155M to 8G (SFP)<br>155M to 11.3G (SFP+) |
| Tx Options | 850nm (Uncooled)<br>1310nm (Uncooled)<br>1550nm Grey (Uncooled)<br>CWDM (Uncooled)<br>DWDM |
| Rx Options | PIN and APD |
| Dispersion Tolerance | 120km, 180km, 360km |
| Link Budget | 20dB, 28dB, 32dB |
| Power Supply | 3.3V |
| Product Compatibility | Ethernet switches, IP Routers, MSPPs, SAN Directors, CPE Demarc |

FIG. 22.

| Payload Bit Rate (Gbps) | Function | G.709 OTU bitrate (255/237) (Gbps) | G.709 OTU bitrate (255/238) (Gbps) |
|---|---|---|---|
| 0.15552 | OC-3/STM-1 | 0.16733 | 0.16663 |
| 0.62208 | OC-12/STM-4 | 0.66933 | 0.66651 |
| 1.0625G | 1G Fibre Channel | 1.1432 | 1.1384 |
| 1.25G | 1GbE | 1.3449 | 1.3393 |
| 2.125G | 2G Fibre Channel | 2.2864 | 2.2786 |
| 2.488G | OC-48/STM-16 | 2.6773 | 2.6661 |
| 4.25G | 4G Fibre Channel | 4.5728 | 4.5536 |

FIG. 23.

PLUGGABLE OPTICAL TRANSCEIVERS WITH INTEGRATED ELECTRONIC DISPERSION COMPENSATION

CROSS-REFERENCE TO RELATED APPLICATION(S)

This application is a continuation of U.S. patent application Ser. No. 14/589,635 filed Jan. 15, 2015, and entitled "40G/100G/200G/400G PLUGGABLE OPTICAL TRANSCEIVERS WITH ADVANCED FUNCTIONALITY," which claims priority as a continuation-in-part of co-pending U.S. patent application Ser. No. 13/784,998 filed Mar. 5, 2013, and entitled "40G/100G MSA-COMPLIANT OPTICAL TRANSCEIVERS WITH ADVANCED FUNCTIONALITY," which claims priority as a continuation-in-part of U.S. Pat. No. 8,412,051, issued on Apr. 2, 2013, and entitled "40G/100G OPTICAL TRANSCEIVERS WITH INTEGRATED FRAMING AND FORWARD ERROR CORRECTION," which claims priority to U.S. Pat. No. 8,107,820 issued Jan. 31, 2012, and entitled "SYSTEMS AND METHODS FOR THE INTEGRATION OF FRAMING, OAM&P, AND FORWARD ERROR CORRECTION IN SFP OPTICAL TRANSCEIVER DEVICES," which claims priority to U.S. Provisional Pat. Appl. No. 61/029,821, filed Feb. 19, 2008, and entitled "SYSTEMS AND METHODS FOR ETHERNET EXTENSION AND DEMARCATION," and which claims priority as a continuation-in-part of U.S. Pat. No. 7,580,637, issued on Aug. 25, 2009, and entitled "SYSTEMS AND METHODS FOR THE INTEGRATION OF FRAMING, OAM&P, AND FORWARD ERROR CORRECTION IN PLUGGABLE OPTICAL TRANSCEIVER DEVICES," all of which are incorporated in full by reference herein.

FIELD OF THE DISCLOSURE

The present disclosure relates generally to optical and data networking, and more specifically to 40 Gb/s, 100 Gb/s, 200 Gb/s, 400 Gb/s optical transceiver systems and methods with integrated framing; forward error correction (FEC); performance monitoring (PM); optical layer operations, administration, maintenance, and provisioning (OAM&P); alarming; and other advanced functionality.

BACKGROUND OF THE DISCLOSURE

Optical transceivers can be defined through multi-source agreements (MSAs) or equivalents. MSAs are agreements for specifications of optical transceivers agreed to by multiple vendors, organizations, etc. and promulgated for other vendors and network operators to utilize. MSAs allow other vendors to design transceivers to the same specifications reducing risk for vendors and operators, increasing flexibility, and accelerating the introduction of new technology. Exemplary MSAs include XFP, XPAK, XENPAK, X2, XFP-E, SFP, SFP+, and 300-pin. Exemplary MSAs for 40G, 100G, 200G, and 400G include CFP and variants thereof (e.g., CFP2, CFP4, CXP), CDFP and variants thereof (e.g., CDFP2, CDFP4, etc.), OIF-MSA-100GLH-EM-01.0—Multisource Agreement for 100G Long-Haul DWDM Transmission Module—Electromechanical (June 2010) (hereinafter MSA-100GLH), CCRx (Compact Coherent Receiver), Quad Small Form-factor Pluggable (QSFP) and variants thereof (e.g., future QSFP+, QSFP2), 10×10 MSA, and the like. Additionally, new MSAs are emerging to address new services, applications, and advanced technology. Each MSA defines the transceiver's mechanical characteristics, management interfaces, electrical characteristics, optical characteristics, and thermal requirements. Because of MSA specifications, MSA-compliant optical transceivers are standardized among equipment vendors and network operators to support multiple sources for optical transceivers and interoperability. As such, MSA-compliant optical transceivers have become the dominant form of optical transmitters and receivers in the industry finding widespread acceptance over proprietary implementations.

Advantageously, MSA-compliant optical transceivers ensure engineering re-use and compatibility between various applications and the physical media dependent (PMD) transceivers. Further, equipment vendors realize streamlined manufacturing and inventory control by removing wavelength specific decisions from the manufacturing process. For example, all line cards are manufactured the same, and the optical transceiver module with the desired wavelength (e.g. 850 nm, 1310 nm, 1550 nm, coarse wave division multiplexed (CWDM), dense wave division multiplexed (DWDM), etc.) is plugged in as a function of the specific application or development configuration. Network operators and service providers have adopted optical transceivers to reduce sparing costs. Further, significant cost reductions are realized by MSA standardization of optical transceivers because of multiple independent manufacturing sources. The MSA specifications tightly define the mechanical characteristics, management interfaces, electrical characteristics, optical characteristics, and thermal requirements of optical transceivers. Advantageously, this enables interoperability among equipment vendors of optical transceivers, i.e. any MSA-compatible optical transceiver can be used in any host system designed to the MSA specification; however, these tightly defined characteristics limit the performance of optical transceivers since the MSA specifications were designed to maximize density and minimize cost, and not to provide advanced optical performance or other integrated functions.

Due to the low-cost, high-density, and widespread deployment of optical transceivers, both equipment vendors and network operators recognize a need to extend the benefits of optical transceivers to metro, regional and core network applications to enable carrier-grade wavelength division multiplexed (WDM) transport without the need for additional equipment such as optical transponders or additional circuitry performance enhancements. Such a need also must preserve the MSA mechanical characteristics, management interfaces, electrical characteristics, optical characteristics, and thermal requirements to maintain interoperability with existing host systems.

BRIEF SUMMARY OF THE DISCLOSURE

In an exemplary embodiment, an optical transceiver configured to operate in a host device according to a multi-source agreement includes circuitry configured to provide framing and forward error correction integrated within the optical transceiver and to communicate with the host device; transmitter optical components communicatively coupled to the circuitry and configured to transmit a composite 40G or 100G optical signal; receiver optical components communicatively coupled to the circuitry and configured to receive the composite 40G or 100G optical signal; and a housing compliant to the multi-source agreement, the housing containing the circuitry, the transmitter optical components, and the receiver optical components; wherein the framing and forward error correction provided by the circuitry is performed in a transparent manner to the host device thereby providing advanced functionality in excess of the multi-source agreement while preserving backward compatibility for operation in the host device.

In another exemplary embodiment, a multi-source agreement (MSA) compliant optical transceiver includes an optical section including transmit optics and receive optics; an electrical section communicatively coupled to the optical section; circuitry in the electrical section configured to provide framing and forward error correction integrated within the MSA compliant optical transceiver and transparent to a host system housing the MSA compliant optical transceiver, wherein the host system is supports optical transceivers compliant to the MSA; a controller communicatively coupled to the optical section, the electrical section, and the host system; a housing compliant to the MSA, the housing containing the optical section, the electrical section, and the controller; and a communications port disposed on the housing and communicatively coupled to the controller, wherein the communications port is utilized to monitor and control operations, administration, maintenance, and provisioning (OAM&P) data associated with the circuitry thereby enabling a transparent manner of operation of the circuitry with respect to the host device.

In an exemplary embodiment, a pluggable optical transceiver configured to operate in a host device includes a communication link configured to interface with the host device for providing a high-speed signal therebetween; framing and forward error correction circuitry configured to provide framing and forward error correction related to the high-speed signal; transmitter optical components communicatively coupled to the framing and forward error correction circuitry and configured to transmit a composite optical output signal; and receiver optical components communicatively coupled to the circuitry and configured to receive a composite optical input signal; wherein the framing and forward error correction is performed within the pluggable optical transceiver separately and independently from the host device. The communication link can have N signaling lanes each at M Gb/s, and the high-speed signal is at least 40 Gb/s such that N×M is at least 40 Gb/s. The pluggable optical transceiver can further include a controller in the pluggable optical transceiver communicatively coupled to the framing and forward error correction circuitry and the host device, wherein the controller is configured to one of terminate operations, administration, maintenance, and provisioning (OAM&P) data in the pluggable optical transceiver independent of the host device, provide full access to the OAM&P data at the host device or provide reduced access to the OAM&P data at the host device.

The transmitter optical components can include a multiplexer section and a transmitter optics section and the receiver optical components comprise a demultiplexer section and a receiver optics section; wherein the multiplexer section is coupled to the framing and forward error correction circuitry through X signaling lanes and coupled to the transmitter optics section through Y signaling lanes; and wherein the receiver optics section is coupled to the demultiplexer section through Y signaling lanes and the demultiplexer section is coupled to the framing and forward error correction circuitry through X signaling lanes, X and Y are integers, and optionally X≠Y. The transmitter optics section transmits Y wavelengths and the receiver optics section receives Y wavelengths. The host device can be configured to accept a pluggable optical transceiver compliant to a multi-source agreement, and wherein the pluggable optical transceiver is compatible with the multi-source agreement. The multi-source agreement can be any of CFP and variants thereof including CFP2, CFP4, and CXP; CDFP and variants thereof including CDFP2 and CDFP4; MSA-100GLH; CCRx; QSFP and variants thereof including QSFP+ and QSFP2, 10×10, XFP, XPAK, XENPAK, X2, XFP-E, SFP, SFP+, and 300-pin. The pluggable optical transceiver can further include a communications port located on a housing and communicatively coupled to the framing and forward error correction circuitry, wherein the communications port is utilized to monitor and control operations, administration, maintenance, and provisioning (OAM&P) data in a transparent manner relative to the host device. The communications port can include an Ethernet port, and wherein the Ethernet port is configured to be communicatively coupled to a management system directly or in a daisy chain fashion with another communications port on another pluggable optical transceiver. The pluggable optical transceiver can further include one or more of a pre amplifier selectively connected to the receiver optical components; and a post amplifier selectively connected to the transmitter optical components. The pre amplifier and the post amplifier can be disposed within the pluggable optical transceiver in a manner that preserves backward compatibility for operation in the host device. The framing and the forward error correction can be based on G.709. The host device is a router or a switch communicatively coupled to another host device through the pluggable optical transceiver and another pluggable optical transceiver on the another host device over an optical link.

In a further exemplary embodiment, a method includes plugging a pluggable optical transceiver into a host device; interfacing a high-speed signal between the host device and the pluggable optical transceiver; applying framing and forward error correction related to the high-speed signal within the pluggable optical transceiver; and communicating the high-speed signal with another pluggable optical transceiver on another host device, wherein the framing and forward error correction is performed within the pluggable optical transceiver separately and independently from the host device. The host device can be configured to accept a pluggable optical transceiver compliant to a multi-source agreement, and wherein the pluggable optical transceiver is compatible with the multi-source agreement. The multi-source agreement can be any of CFP and variants thereof including CFP2, CFP4, and CXP; CDFP and variants thereof including CDFP2 and CDFP4; MSA-100GLH; CCRx; QSFP and variants thereof including QSFP+ and QSFP2, 10×10, XFP, XPAK, XENPAK, X2, XFP-E, SFP, SFP+, and 300-pin.

BRIEF DESCRIPTION OF THE DRAWINGS

The present disclosure is illustrated and described herein with reference to the various drawings of exemplary embodiments, in which like reference numbers denote like method steps and/or system components, respectively, and in which:

FIG. 19 is a table illustrating exemplary remote demarcation OAM&P functions available through optical transceivers;

FIG. 22 is a table illustrating exemplary specifications for the SFP transceiver in FIG. 21;

FIG. 23 is a table illustrating exemplary OTN bit rates utilized for various signal rates associated with SFP transceivers;

DETAILED DESCRIPTION OF THE DISCLOSURE

In various exemplary embodiments, the present disclosure provides integrated performance monitoring (PM); optical layer operations, administration, maintenance, and provisioning (OAM&P); alarming; and other advanced functionality in optical transceivers, such as multi-source agreement (MSA)-defined modules. The present disclosure provides an optical transceiver defined by an MSA agreement with integrated PM and alarming for carrier-grade operation. The integration preserves the existing MSA specifications allowing the optical transceiver to operate with any compliant MSA host device. Further, the host device can be configured through software to retrieve the PM and alarming from the optical transceiver. The optical transceiver can include CFP and variants thereof (e.g., CFP2, CFP4, CXP), CDFP and variants thereof (e.g., CDFP2, CDFP4, etc.), MSA-100GLH, CCRx, QSFP and variants thereof (e.g., future QSFP+, QSFP2), 10×10, XFP, XPAK, XENPAK, X2, XFP-E, SFP, SFP+, 300-pin, and the like.

Figure 1A:
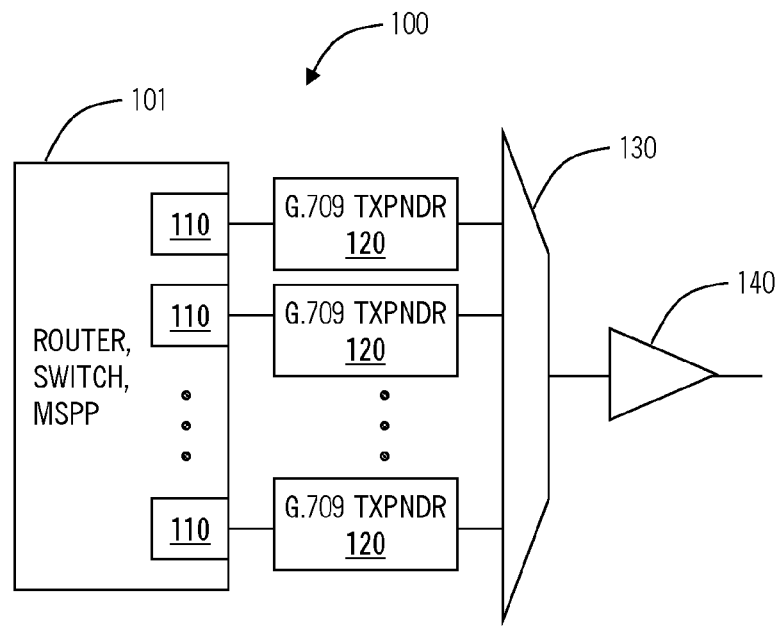
FIGS. 1a-1b are block diagrams of optical transceivers included on devices for wavelength division multiplexed (WDM) transmission into a multiplexer and an amplifier.
Figure 1B:
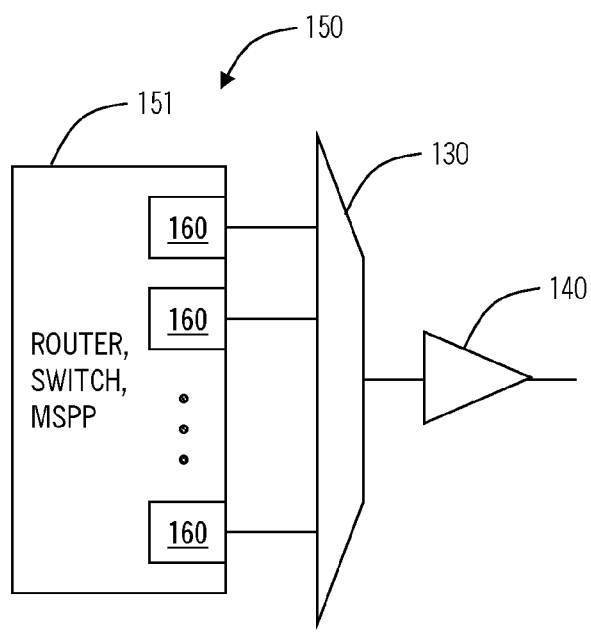

Referring to FIGS. 1a-1b, in exemplary embodiments, optical transceivers 110,160 can be included on devices 101,151 for wavelength division multiplexed (WDM) transmission into a multiplexer 130 and an amplifier 140. The devices 101,151 can include servers, routers, Ethernet switches, multi-service provisioning platforms (MSPPs), optical cross-connects, or any other device with requirements for optical transmission. The optical transceivers 110,160 are configured to plug into a line card, blade, or other device in the devices 101,151 to provide an optical signal for transmission. The optical transceivers 110,160 are designed to specifications such that they can be installed in any device 101,151 designed to host a optical transceiver 110,160. These specifications allow the design of the devices 101,151 to be de-coupled from the design of optical transceivers 110,160. Alternatively, the optical transceivers 110, 160 can also be used for single wavelength applications, i.e. non-WDM transmission. Further, the optical transceivers 110,160 can also be interfaced to a transponder client with the transponder client having access to the far-end client.

FIG. 1a illustrates the prior art with the device 101 equipped with optical transceivers 110 where the transceivers 110 are designed to support native optical line rates such as 9.96 Gbps for SONET OC-192 and SDH STM-64, 10.3 Gbps for GbE LAN PHY, and 10.5 Gbps for 10G Fiber Channel. Further, the transceivers 110 do not support G.709 wrappers, FEC, and optical layer OAM&P integrated within the transceiver 110. The transceivers 110 are configured to accept an electrical signal and to convert it to an optical signal without additional functions such as adding G.709 overhead, processing G.709 management bytes, encoding FEC overhead, etc. As such, devices 101 equipped with transceivers 110 require transponders such as G.709 transponders 120 to offer G.709 wrappers, FEC, and G.709/OTN OAM&P. The transceivers 110 typically provide un-amplified optical reach up to 80 km with no transparency and optical layer OAM&P.

FIG. 1b illustrates an exemplary embodiment with the device 151 equipped with optical transceivers 160 where the transceivers 160 include integrated G.709 wrapper, FEC, and OAM&P functionality. The transceivers 160 remove the need for external transponders to support G.709, FEC, and OAM&P by incorporating these functions internal to the transceiver 160 while maintaining the same interface to the device 151 as the transceiver 110 does with the device 101. This is done by adding the G.709 wrapper, FEC, and OAM&P within the specifications of the transceiver 110.

Transceivers 160 extend the OTN framework benefits for seamless interconnection applications and for OAM&P functions necessary for metro, regional, and core applications. Further, the transceivers 160 are configured to transparently transport asynchronous traffic such as IEEE 802.3 10 Gigabit Ethernet (10 GbE), 10 Gbps Fiber Channel traffic, or any 10 Gbps constant bit-rate (CBR) traffic seamlessly and efficiently across multiple networks using the OTN framework. This removes the need to sacrifice bandwidth utilization such as in SONET concatenation or the need to introduce another layer of adaptation such as generic framing procedure (GFP). Some vendors also want GFP mapping to limit the bandwidth to SONET/SDH rates, and the transceivers 160 can rate limit the client traffic to provide rate compatibility to other G.709 OTN systems, if required.

ITU-T G.709 (Interfaces for the optical transport network (OTN)) is an example of a framing and data encapsulation technique. Of note, ITU-T G.709/Y.1331 (December 2009) was recently standardized for various purposes including covering higher bit rates such as 40G and 100G. G.709 is a standardized method for managing optical wavelengths in an optical network. G.709 allows for transparency in wavelength services, improvement in optical link performance through out-of-band forward error correction (FEC), improved management through full transparency, and interoperability with other G.709 clients. G.709 defines a wrapper in which a client signal (e.g. OC-48, STM-16, OC-192, STM-64, 10 GbE, 1 GbE, etc.) is encapsulated. The G.709 wrapper includes overhead bytes for optical layer OAM&P and FEC overhead for error correction. Traditionally, G.709 signals are used in a carrier-grade network to provide robust performance and OAM&P while transporting client signals with full transparency. Currently, MSA specifications such as CFP and variants thereof (e.g., CFP2, CFP4, CXP), CDFP and variants thereof (e.g., CDFP2, CDFP4, etc.), MSA-100GLH, CCRx, QSFP and variants thereof (e.g., QSFP+, QSFP2), 10×10, XFP, XPAK, XENPAK, X2, XFP-E, SFP, SFP+, 300-pin, etc. do not address integration of G.709 within the optical transceiver.

Figure 2:
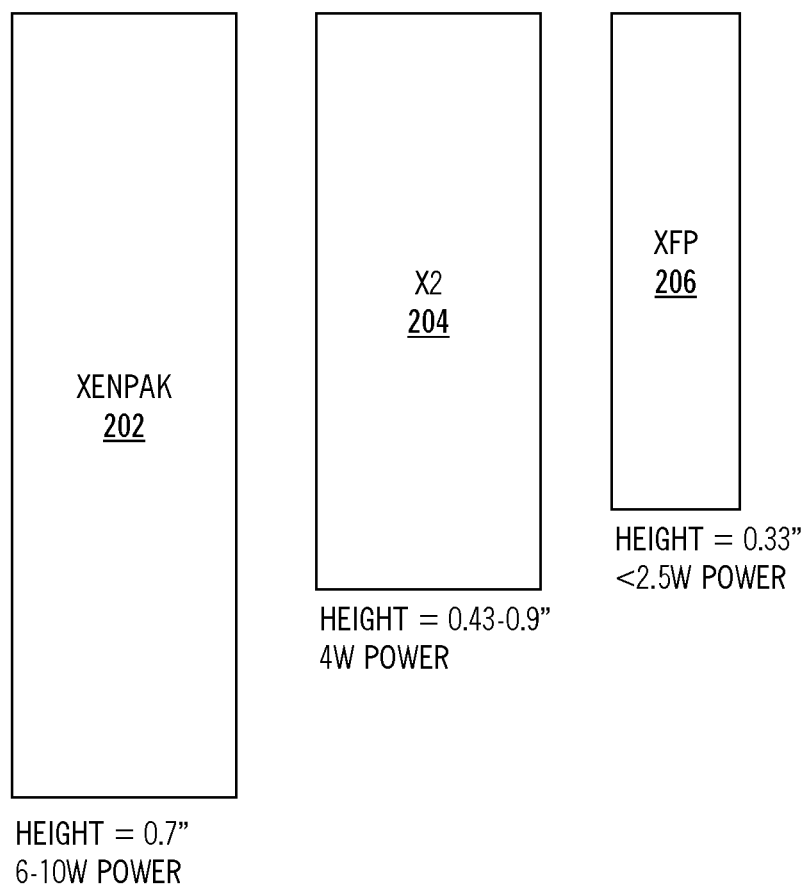
FIG. 2 is a block diagram illustrating several MSA specifications for optical transceivers including XENPAK, X2, and XFP.

Referring to FIG. 2, in an exemplary embodiment, several MSA specifications currently exist for optical transceivers including, for example, XENPAK 202, X2 204, and XFP 206. Power and space is limited in each of the specifications in FIG. 2. The optical MSAs were developed with intent to maximize port density; hence the power and foot-print constraints. The intent of the MSA specifications was to have framing, G.709, FEC, and OAM&P reside outside the optical transceiver. The XFP MSA, for example, states that the XFP transceiver must accept data input up to 11.1 Gbps FEC rate but not that the functions must be carried out inside the XFP due to the limited space and power available inside the XFP. However, these MSAs do not prevent the addition of additional functions such as G.709, FEC, and OAM&P internal to the optical transceiver. The present disclosure provides a system to integrate these functions while maintaining the MSA specifications through use of unused, undefined, reserved, optional, etc. communication ports for OAM&P access and circuitry designed to fit within the space and power constraints of the MSA specification.

The XENPAK 202 MSA supports the proposed 802.3ae IEEE 10 Gigabit Ethernet (10 GbE) standard, and specifies a uniform form factor, size, connector type and electrical pin-outs. XENPAK 202 simplifies management of architecture shifts and integration, minimizes system costs, ensures multiple vendors for market supply, and guarantees thermal performance for high density 10 GbE ports. XENPAK 202 requires power dissipation of no more than 6 W for 1310 nm and 850 nm wavelengths and power dissipation of no more than 10 W for 1550 nm wavelengths. The XENPAK 202 MSA is available at www.xenpak.org/MSA.asp and is hereby incorporated by reference.

The X2 204 MSA defines a small form-factor 10 Gbps optical fiber optic transceiver optimized for 802.3ae Ethernet, ANSI/ITUT OC192/STM-64 SONET/SDH interfaces, ITU-T G.709, OIF OC192 VSR, INCITS/ANSI 10GFC (10 Gigabit Fiber Channel) and other 10 Gigabit applications. X2 204 is physically smaller than XENPAK 202 but maintains the same electrical I/O specification defined by the XENPAK 202 MSA and continues to provide robust thermal performance and electromagnetic shielding. X2 204 uses the same 70-pin electrical connectors as XENPAK 202 supporting four wire XAUI (10-gigabit attachment unit interface). X2 204 supports an input signal of G.709, but does not support framing a non-G.709 signal internal to the optical transceiver and also does not support FEC and optical layer OAM&P. The X2 204 MSA is available at www.x2msa.org/MSA.asp and is hereby incorporate by reference.

The XFP (10 Gigabit Small Form Factor Optical) 206 is a hot-swappable, protocol independent optical transceiver, typically operating at 1310 nm or 1550 nm, for 10 Gigabit SONET/SDH, Fiber Channel, Gigabit Ethernet and other applications. The XFP 206 MSA is available from www.xfpmsa.org and is hereby incorporated by reference. The XFP 206 MSA defines a specification for a module, cage hardware, and IC interfaces for a 10 Gbps hot optical module converting serial electrical signals to external serial optical or electrical signals. The technology is intended to be flexible enough to support bit rates between 9.95 Gbps and 11.1 Gbps for services such as OC-192/STM-64, 10G Fiber Channel, G.709, and 10G Ethernet. XFP 206 supports native G.709 signals, but does not support the ability to frame a non-G.709 signal into a G.709 wrapper with FEC and OAM&P internal to the XFP 206 module. Currently, these features are done external to the XFP 206 module and a G.709 signal is sent to the XFP 206 module for optical transmission. XFP-E (not shown in FIG. 2) is an extension of the XFP 206 MSA for ultra-long haul DWDM applications and tunable optical transmitters.

XPAK (not shown in FIG. 2) is a reduced-sized, optical 10 Gigabit Ethernet (GbE) module customized for enterprise, storage area network (SAN), and switching center market segment applications. The XPAK specifications define mechanical, thermal, and electromagnetic interference (EMI) mitigation features of the form factor, as well as reference 10-GbE optical and XENPAK 202 MSA electrical specifications. XPAK offers higher density and better power efficiency than XENPAK 202 and offers 10 GbE links up to 10 km and eventually 40 km. The SFP+(not shown in FIG. 2) MSA is a specification for an optical, hot-swappable optical interface for SONET/SDH, Fiber Channel, Gigabit Ethernet, and other applications. SFP+ is designed for up to 80 km reach and supports a full-range of applications. SFP+ is similar in size and power with the XFP 206 specification, and similarly accepts a serial electrical input.

The CFP and variants thereof (e.g., CFP2, CFP4, CXP) (www.cfp-msa.org/), CDFP and variants thereof (e.g., CDFP2, CDFP4, etc.) (www.cdfp-msa.com/), MSA-100GLH, CCRx, QSFP and variants thereof (e.g., future QSFP+, QSFP2), 10×10, XFP, XPAK, XENPAK, X2, XFP-E, SFP, and SFP+MSAs all share similar design constraints in power and space. Some of these MSAs have been designed to accept G.709 framed signals (i.e. 10.7 Gbps and 11.1 Gbps), but the MSAs do not disclose integrated G.709 framing, optical layer OAM&P, and FEC internal to the optical transceivers. MSAs define input signal interfaces, mechanical, thermal, and software management interfaces. The present disclosure introduces G.709 framing, OAM&P, and FEC without changing any of the MSA interfaces or mechanical characteristics.

Figure 3A:
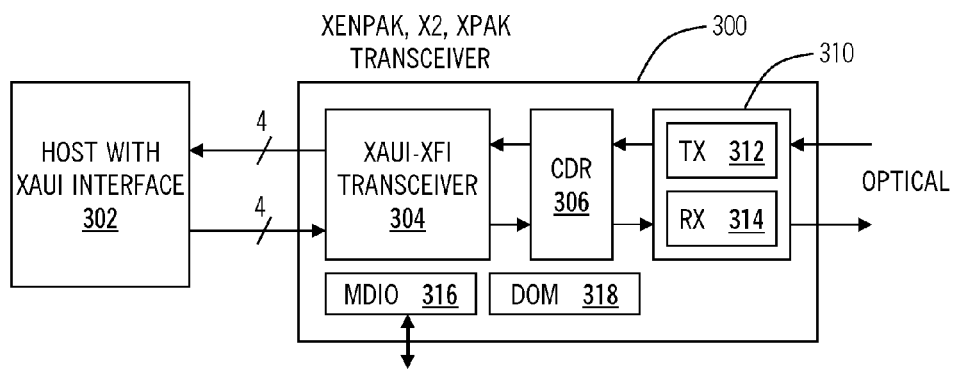
FIGS. 3a-3b are block diagrams of existing optical transceivers which do not include circuitry for data encapsulation, integrated G.709 framing, OAM&P, and FEC.
Figure 3B:
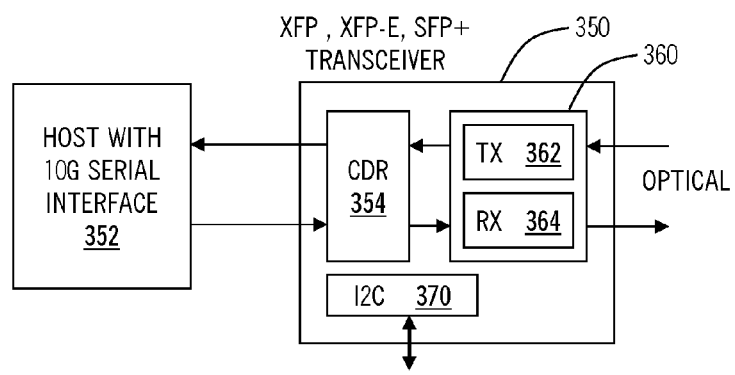

Referring to FIGS. 3a-3b, in exemplary embodiments, existing optical transceivers do not include circuitry for data encapsulation, integrated G.709 framing, OAM&P, and FEC. FIG. 5a illustrates a functional block diagram of a XENPAK, XPAK, and X2 optical transceiver 300, and FIG. 5b illustrates a functional block diagram of an XFP, XFP-E, and SFP+ optical transceiver 350. In FIG. 3a, the XENPAK, XPAK, and X2 optical transceiver 300 includes an optical module 310 connected to a clock and data recovery (CDR) 306 module which is connected to a XAUI-XFI transceiver 304. Typically the CDR 306 can be integrated into the XAUI-XFI transceiver 304. The XAUI-XFI transceiver 304 is configured to connect to a host device with an XAUI interface 302. The host device includes a socket in which the optical transceiver 300 plugs into to connect to the host 302. XAUI is a 4×3.125 Gbps electrical connection compliant with the IEEE 802.3ae 10 GbE specification. XFI is a standard interface for connecting 10 Gig Ethernet MAC devices to an optical interface. The XAUI-XFI transceiver 304 includes multiplexer/demultiplexer functions and encoding/decoding functions to perform 8B/10B and 64B/66B coding. XAUI provides four lanes running at 3.125 Gbps using 8B/10B encoding and XFI provides a single lane running at 10.3125 Gbps using 64B/66B encoding. Additionally, the XAUI-XFI transceiver 304 can include a SONET framer called a WAN Interface Sublayer (WIS).

The XAUI-XFI transceiver 304 accepts the XAUI signal and converts it into a serial connection such as a 10.3125 Gbps XFI signal for transmission by the optical module 310. The optical module 310 includes a transmitter (TX) 312 and a receiver (RX) 314. The TX/RX 312,314 can include 850 nm, 1310 nm, 1550 nm, DWDM, CWDM, and the like depending on the application requirements. The TX/RX 312,314 connect to the CDR 306 module where a clock is generated by retrieving the phase information of an input signal and retiming occurs on an output signal. In some embodiments, the functionality of the CDR 306 is included in the XAUI-XFI transceiver 304. While the optical transceiver 300 provides functionality to convert between XAUI and XFI, the transceiver 300 does not include integrated G.709 framing, OTN layer OAM&P (e.g., ITU-T G.798, G.826, G.8201, etc.), and FEC functionality.

Additionally, the optical transceiver 300 includes management data input/output (MDIO) 316 and digital optical monitoring (DOM) 318 for communications and performance monitoring between the transceiver 300 and the host 302. MDIO 316 is a standard-driven, dedicated-bus approach that is specified by IEEE workgroup 802.3. The MDIO 316 interface is implemented by two pins, an MDIO pin and a Management Data Clock (MDC) pin. The MDIO 316 interface is defined in relationship to the accessing and modification of various registers within physical-layer (PHY) devices, and how they relate to connecting to media access controllers (MACs) in 1- and 10-Gbit/s Ethernet solutions. One MDIO 316 interface can access up to 32 registers, in 32 different devices. A device driving an MDIO 316 bus is called a station management entity (STA), and the device being managed by the STA is called the MDIO Manageable Device (MMD). The STA drives the MDC line. It initiates a command using an MDIO frame and provides the target register address. During a write command, the STA also provides the data. In the case of a read command, the MMD takes over the bus and supplies the STA with the data. DOM 318 is an optical monitoring scheme utilized by each MSA specification for performance monitoring on the optical transceiver. For example, the DOM 318 can provide performance monitoring data such as optical output power, optical input power, laser bias current, etc. While DOM 318 provides some performance monitoring capabilities, it does not provide OTN OAM&P capable of operating carrier-grade networks. DOM 318 provides component level performance monitoring information and DOM 318 does not provide optical link layer OAM&P.

In FIG. 3b, the XFP and XFP-E optical transceiver 350 includes a clock and data recovery (CDR) 354 module configured to accept a serial input from a host with a 10G serial interface 352. The CDR 354 module generates a clock by retrieving the phase information of an input signal and retiming occurs on an output signal. The CDR 354 module connects to an optical module 360 which includes a transmitter (TX) 362 and a receiver (RX) 364. The TX/RX 362,364 can include 850 nm, 1310 nm, 1550 nm, DWDM, CWDM, and the like depending on the application requirements. Additionally, the optical transceiver 350 includes an inter-integrated circuit (I2C) 370 serial bus. I2C is a serial communications bus through which a optical transceiver 350, such as XFP, XFP-E, SFP, and SFP+, communicates to the host system. The optical transceiver 350 provides no multiplexer/demultiplexer or encoding/decoding functionality and solely provides an electrical to optical conversion of a signal. Similar to the XENPAK, XPAK, and X2 optical transceiver 300, the XFP, XFP-E, and SFP+ optical transceiver 350 provides no G.709 framing, OAM&P, and FEC functionality. Note, existing SFP and SFP+ optical transceivers are different. SFP optical transceivers do not include the CDR 354 and the CDR 354 is located in the host.

Figure 4A:
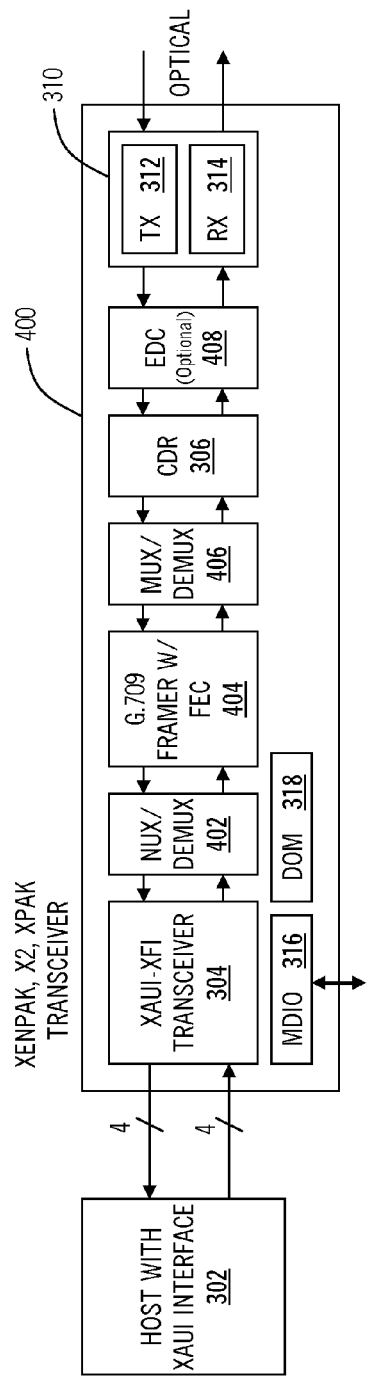
FIGS. 4a-4b are block diagrams of XENPAK, X2, and XPAK optical transceivers including integrated circuitry to perform G.709 framing, optical layer OAM&P, and FEC internal to the optical transceiver while preserving specifications of the XENPAK, X2, and XPAK MSAs.
Figure 4B:
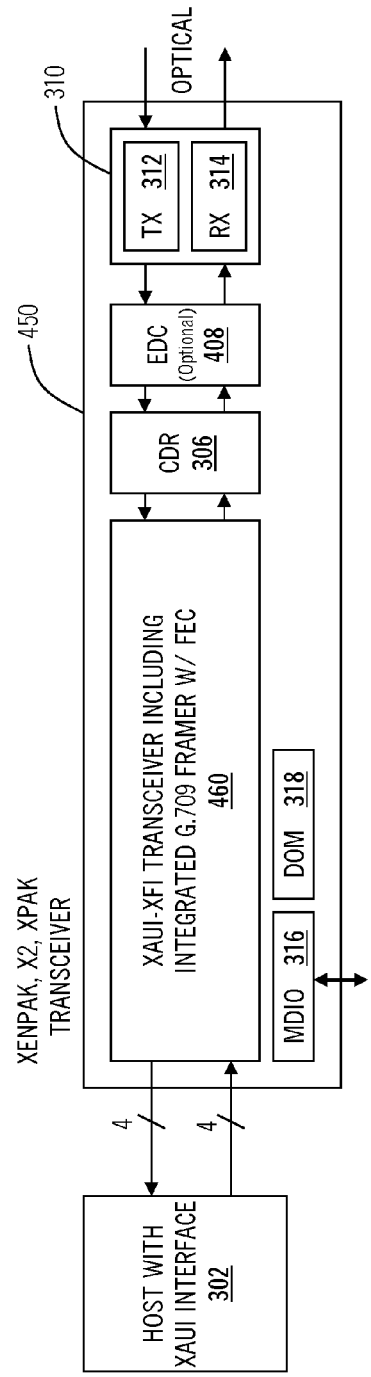

Referring to FIGS. 4a-4b, in an exemplary embodiment, XENPAK, X2, and XPAK optical transceivers 400,450 include integrated circuitry to perform G.709 framing, optical layer OAM&P, and FEC internal to the optical transceiver 400,450 while preserving the power, space, and communication specifications of the XENPAK, X2, and XPAK MSAs. FIG. 4a illustrates a optical transceiver 400 with G.709 framing circuitry external to a XAUI-XFI transceiver 304. FIG. 4b illustrates a optical transceiver 450 with G.709 framing circuitry integrated within a XAUI-XFI transceiver 460. Optionally, both optical transceivers 400, 450 can also include an electrical dispersion compensation (EDC) 408 module.

In FIG. 4a, the optical transceiver 400 includes the same functionality as the optical transceiver 300 in FIG. 3a with a XAUI-XFI transceiver 304, a CDR 306 module, an optical module 310, MDIO 316, and DOM 318. Additionally, the optical transceiver 400 includes a G.709 framer with FEC 404 which is configured to frame an input signal to the transceiver 400 with a G.709 compliant frame. Further, the G.709 framer 404 is configured to provide optical layer OAM&P on the G.709 frame and to provide FEC through the G.709 frame. Additionally the EDC 408 can be located behind the CDR 306 for some designs. The optical transceiver 400 includes two multiplexers/de-multiplexers 402, 406 connected to the G.709 framer with FEC 404. The input and output from the XAUI-XFI transceiver 304 is a 10 Gbps XFI signal. The multiplexer/de-multiplexer 402 is configured to adapt the input and output from the XAUI-XFI transceiver 304 to an appropriate rate for the G.709 framer with FEC 404 to operate on the signal to perform framing, OAM&P, and FEC. The input and output to the CDR 306 is a 10 Gbps XFI signal. The multiplexer/de-multiplexer 406 is configured to adapt the input and output from the G.709 framer with FEC 404 back to the XFI rate for input and output to the CDR 306. Optionally, the multiplexer/de-multiplexer 406 can be integrated with the FEC 404 and the CDR 306 in a single chip. Also, the multiplexer/de-multiplexer 406 are not necessary and can be optional in the design (i.e. the FEC 404 can stand alone without the multiplexer/de-multiplexer 406).

In the exemplary embodiments of FIGS. 4a-4b, the G.709 framer with FEC 404 is configured to accept an unframed signal such as a 10 GbE or 10G FC signal from the XAUI-XFI transceiver 304 and to pass a G.709 framed signal to the CDR 306. The G.709 framer with FEC 404 includes integrated circuitry to add a G.709 frame to the unframed signal including G.709 OAM&P and FEC and to pass the framed signal to the CDR 306. Further, the G.709 framer with FEC 404 includes integrated circuitry to remove a G.709 frame including processing the G.709 OAM&P and FEC and to pass the unframed signal to the XAUI-XFI transceiver 304. The G.709 frame includes overhead bytes for OAM&P and FEC data.

The G.709 framer with FEC 404 is configured to pass overhead to the host 302 either through the MDIO 316 or through a direct connection. Using the MDIO 316, the optical transceiver 400 utilizes unused, undefined, reserved, or optional MDIO 316 registers to communicate overhead data in a manner fully supported by the MSA specifications. For example, the XENPAK, XPAK, and X2 MSAs include unused, undefined, reserved, or optional registers which can be used to implement advanced features such as passing management overhead externally from the optical transceiver 400. These registers can be used both for passing G.709 OAM&P and FEC information when the overhead is terminated on the transceiver 400. In the case of terminating the overhead on the transceiver 400, a subset of G.709 overhead is terminated due to limitations in the MDIO 316 access. The present disclosure can provide all or a subset of G.709 OAM&P to comply with the communication requirements in the MSAs. Additionally, the G.709 framer with FEC 404 can be configured to pass the entire G.709 overhead to the host 302 through a direct connection. The G.709 framer with FEC 404 is an integrated circuit such as a custom built application specific integrated circuit (ASIC). The design of G.709 framer with FEC 404 is such to minimize power dissipation and each device is designed for power consumption to ensure the optical transceiver 400 preserves the XPAK, XENPAK, and X2 MSA specifications.

Additionally, the G.709 framer with FEC 404 is configured to add/remove and process FEC overhead on an optical signal. The addition of FEC in the optical transceiver 400 provides an additional 6 to 9 dB of coding gain that can provide improved link budgets, higher system margins for robust connections, relaxed specifications on the optical components, real time monitoring of the link health status and historical BER data, and real-time monitoring of link degradation without affecting the quality of the link. In one exemplary embodiment, the FEC is Reed-Solomon (255, 239) code as defined in G.709 and is capable of correcting eight symbol errors per block. Additionally, the present disclosure can be modified by one skilled in the art to enable other framing and FEC techniques on optical transceivers 400.

In FIG. 4b, the optical transceiver 450 includes the same functionality as the optical transceiver 300 in FIG. 3a with a XAUI-XFI transceiver including an integrated G.709 framer with FEC 460, a CDR 306 module, an optical module 310, MDIO 316, and DOM 318. The optical transceiver 450 includes G.709 framing, OAM&P, and FEC within the XAUI-XFI transceiver 460. The XAUI-XFI transceiver 460 includes the same functionality as the components 304,402, 404,406 in FIG. 4a in a single module. For example, the XAUI-XFI transceiver 460 can include a single ASIC combining the XAUI-XFI transceiver functionality with multiplexer/de-multiplexer, G.709 framing, OAM&P, and FEC functionality. Additionally, the XAUI-XFI transceiver 460 can include the CDR 406 functionality, removing the need for a separate module.

Optionally, the optical transceivers 400,450 can include an electronic dispersion compensating (EDC) 408 circuit configured to electronically compensate for the optical fiber chromatic and/or polarization mode dispersion on the TX 312 and RX 314. The EDC 408 circuit removes the requirement to include dispersion compensating elements such as dispersion compensating fiber (DCF) in-line with the optical transceivers 400,450. Such DCF modules increase system cost and reduce system performance. Additionally, the EDC 408 can include the functionality of the CDR 306, removing the need to have a separate CDR 306 circuit.

Figure 5:
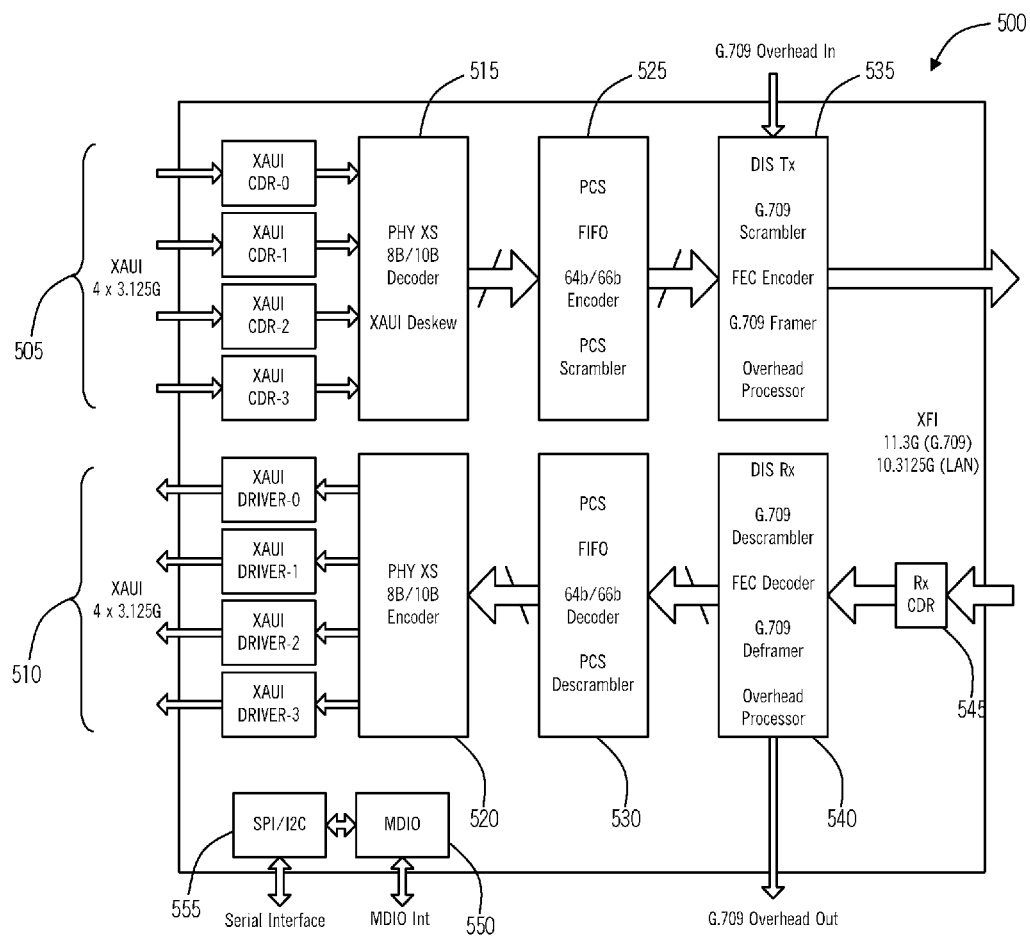
FIG. 5 is a block diagram of an exemplary embodiment of a XAUI-XFI transceiver including integrated G.709 framing and FEC includes integrated circuitry to multiplex/de-multiplex, encode/decode, frame/un-frame, and process overhead and FEC.

Referring to FIG. 5, an exemplary embodiment of a XAUI-XFI transceiver 500 including integrated G.709 framing and FEC includes integrated circuitry to multiplex/de-multiplex, encode/decode, frame/un-frame, and process overhead and FEC. XAUI clock and data recover (CDR) 505 inputs are configured to accept four 3.125 Gbps signals from a host system, to retime, recover the clock, and pass the four 3.125 Gbps signals to a PHY XS 8B/10B decoder 515. The decoder 515 is configured to de-multiplex four XAUI signals running at 3.125 Gbps using 8B/10B encoding and pass the output to a physical coding sub-layer (PCS) 525 module. The PCS 525 module performs 64B/66B encoding to provide a single lane XFI signal running at 10.3125 Gbps and PCS scrambling. The PCS 525 module outputs to a G.709 framer 535.

The G.709 framer 535 accepts an output from the PCS 525 module and de-multiplexes it to an appropriate rate for the G.709 framer 535 to operate on the signal. The G.709 framer 535 is configured to provide G.709 framing, G.709 scrambling, FEC encoding, and G.709 overhead processing. The G.709 framer 535 is configured to communicate with the MDIO 550 utilizing unused, undefined, reserved, or optional registers to communicate overhead to the host system or to communicate through a direct connection to receive G.709 overhead from the host system. Further, the G.709 framer 535 multiplexes the framed signal to input the signal to an optical transmitter off the transceiver 500.

A receiver (RX) clock and data recovery circuit 545 is configured to accept an input from an optical receiver external to the transceiver 500 and to retime, recover the clock, and pass the inputted signal to a G.709 de-framer 540. The G.709 de-framer 540 de-multiplexes the signal to an appropriate rate for the G.709 de-framer 540 to operate on the signal. The G.709 de-framer 540 is configured to provide G.709 de-framing, G.709 de-scrambling, FEC decoding, and G.709 overhead processing. The G.709 de-framer 540 is configured to communicate with the MDIO 550 utilizing unused, undefined, reserved, or optional registers to communicate overhead to the host system or to communicate through a direct connection to pass G.709 overhead to the host system. Further, the G.709 de-framer 540 provides an unframed signal to a PCS 530 module.

The PCS 530 module performs 64B/66B decoding and PCS de-scrambling. The PCS 530 module outputs to a PHY XS 8B/10B encoder 520. The encode 520 is configured to de-multiplex an XFI signal into four XAUI signals running at 3.125 Gbps using 8B/10B encoding and pass the output to four XAUI drivers 510. The XAUI drivers 510 provide four 3.125 Gbps signals to the host system. Additionally, the XAUI-XFI transceiver 500 includes a serial packet interface (SPI) and I2C interface 555 for communications to the host system. The MDIO 550 interface is utilized to provide standard MSA-compliant communications to the host system. Additionally, the present disclosure utilizes the MDIO 550 to communicate a subset of OAM&P and FEC overhead to the host system from the G.709 framer 535 and G.709 de-framer 540 through unused, undefined, reserved, or optional MDIO registers.

Figure 6:
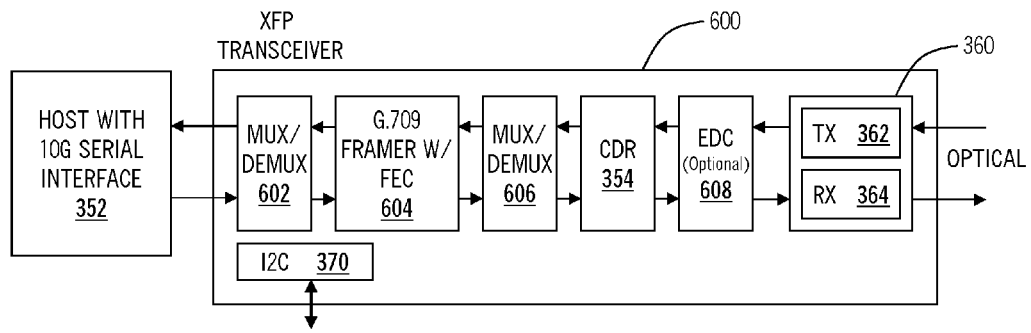
FIG. 6 is a block diagram of a optical transceiver for the XFP, XFP-E, and SFP+MSAs including a G.709 framer with FEC integrated within the optical transceiver.

Referring to FIG. 6, in another exemplary embodiment, a optical transceiver 600 for the XFP, XFP-E, and SFP+ MSAs includes a G.709 framer with FEC 604 integrated within the transceiver 600. The optical transceiver 600 includes the same functionality as the optical transceiver 350 in FIG. 3*b* with a CDR 354 module, an optical module 360, and an I2C 670. Additionally, the optical transceiver 600 includes a G.709 framer with FEC 604 which is configured to frame an input signal to the transceiver 600 with a G.709 compliant frame. Further, the G.709 framer 604 is configured to provide optical layer OAM&P on the G.709 frame and to provide FEC through the G.709 frame.

The optical transceiver 600 includes two multiplexers/de-multiplexers 602,606 connected to the G.709 framer with FEC 604. The input and output from the CDR 354 is a 10 Gbps serial signal. The multiplexer/de-multiplexer 602 is configured to adapt the input and output from a host with a 10 Gbps serial interface 352 to an appropriate rate for the G.709 framer with FEC 604 to operate on the signal to perform framing, OAM&P, and FEC. The input and output to the CDR 354 is a 10 Gbps serial signal. The multiplexer/de-multiplexer 606 is configured to adapt the input and output from the G.709 framer with FEC 604 back to the 10 Gbps rate for input and output from the CDR 354.

In the exemplary embodiment of FIG. 6, the G.709 framer with FEC 604 is configured to accept an unframed signal such as a 10 GbE or 10G FC signal or a framed signal such as an OC-192 or STM-64 from the host 352 and to pass a G.709 framed signal to the CDR 354. The G.709 framer with FEC 604 includes integrated circuitry to add a G.709 frame to the unframed signal including G.709 OAM&P and FEC and to pass the framed signal to the CDR 406. Further, the G.709 framer with FEC 604 includes integrated circuitry to remove a G.709 frame including processing the G.709 OAM&P and FEC and to pass the unframed signal to the host 352. The G.709 frame includes overhead bytes for OAM&P and FEC data.

The G.709 framer with FEC 604 is configured to pass overhead to the host 352 either through the I2C 370 or through a direct connection. Using the I2C 370, the optical transceiver 600 communicates overhead data in a manner fully supported by the MSA specifications. In the case of terminating the overhead on the transceiver 600, a subset of G.709 overhead is terminated due to limitations in the I2C 370 access. The present disclosure provides a subset of G.709 OAM&P to comply with the communication requirements in the MSAs. Additionally, the G.709 framer with FEC 604 can be configured to pass the entire G.709 overhead to the host 352 through a direct connection. The G.709 framer with FEC 604 is an integrated circuit such as a custom built application specific integrated circuit (ASIC). The design of G.709 framer with FEC 604 is such to minimize power dissipation and to keep the power as small as possible to fit within thermal requirements of the host system. Further, the functionality of the multiplexer/de-multiplexer 602,606 and the CDR 354 can be integrated within the G.709 framer with FEC 604 in a single ASIC.

Additionally, the G.709 framer with FEC 604 is configured to add/remove and process FEC overhead on an optical signal. The addition of FEC in the optical transceiver 600 provides an additional 6 to 9 dB of coding gain that can provide improved link budgets, higher system margins for robust connections, relaxed specifications on the optical components, real time monitoring of the link health status and historical BER data, and real-time monitoring of link degradation without affecting the quality of the link. In one exemplary embodiment, the FEC is Reed-Solomon (255, 239) code as defined in G.709 and is capable of correcting eight symbol errors per block. Additionally, the present disclosure can be modified by one skilled in the art to enable other framing and FEC techniques on optical transceivers 600.

Optionally, the optical transceiver 600 can include an electronic dispersion compensating (EDC) 608 circuit configured to electronically compensate for the optical fiber chromatic and/or polarization mode dispersion on the TX 362 and RX 364. The EDC 608 circuit removes the requirement to include dispersion compensating elements such as dispersion compensating fiber (DCF) in-line with the optical transceiver 600. Such DCF modules increase system cost and reduce system performance. Additionally, the EDC 608 can include the functionality of the CDR 354, removing the need to have a separate CDR 354 circuit. The G.709 framer with FEC 404,604 and XAUI-XFI transceiver including integrated G.709 framer with FEC 460 in FIGS. 6*a*, 6*b*, and 8 can be added to any optical transceiver. These include currently defined MSAs such as XENPAK, X2, XPAK, XFP, XFP-E, and SFP+ as well as new and emerging specifications which do not incorporate framing integrated with the optical transceiver.

Figure 7:
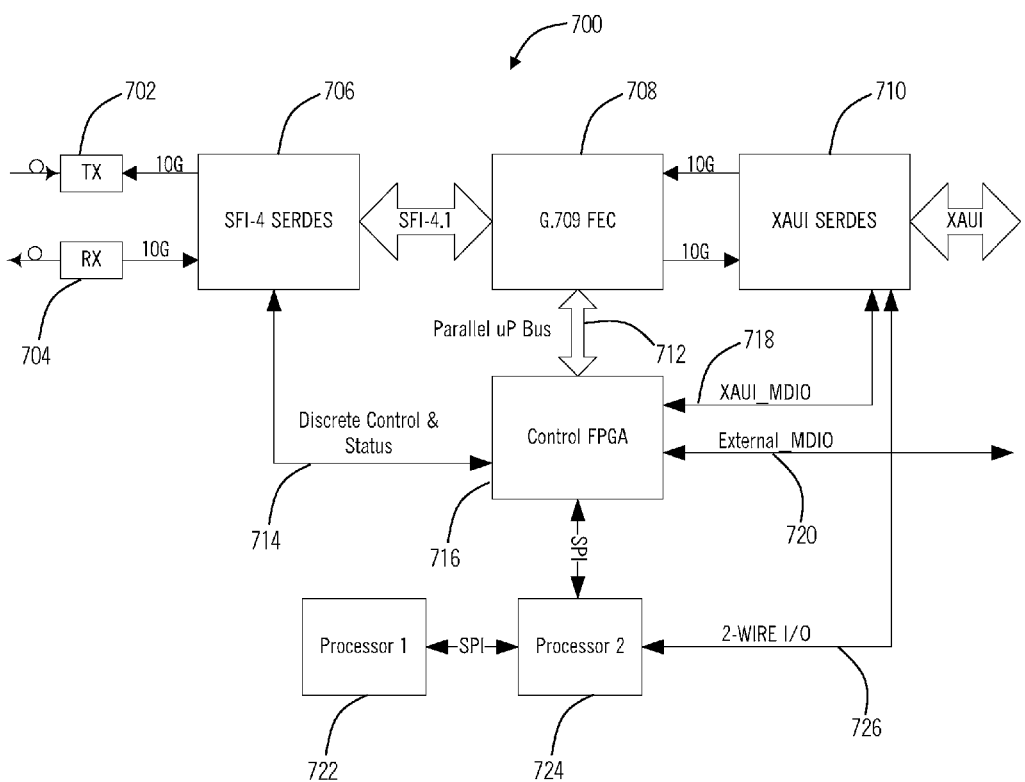
FIG. 7 is a signal flow diagram of a optical transceiver with an MDIO bridge to provide a mechanism to communicate to the MDIO from a G.709 framer with FEC and from a XAUI serializer/de-serializer (SerDes)

Referring to FIG. 7, an exemplary embodiment of an optical transceiver 700 with an MDIO bridge provides a mechanism in the present disclosure to communicate to the MDIO from a G.709 framer with FEC 708 and from a XAUI serializer/de-serializer (SerDes) 710. The MDIO bridge preserves the standard MDIO functionality found in MSA specifications such as XENPAK, XPAK, and X2 and allows the G.709 framer with FEC 708 to communicate utilizing the same MDIO. As such, a host system configured to communicate with a optical transceiver can operate with a optical transceiver 700 with an integrated G.709 framer. The host system can be modified in software only to receive MDIO communications from the MDIO bridge. The optical transceiver 700 includes a transmitter (TX) 702 and a receiver (RX) 704 connected at 10 Gbps to an SFI-4 SerDes 706. SFI-4 is SerDes Framer Interface standard level 4 from the Optical Internetworking Forum (OIF). SIF-4 is one example of an interface to the G.709 framer 708. Other interfaces to the G.709 frame can include XGMII, XFI, and XAUI. The SFI-4 SerDes 706 connects to the G.709 framer 708 with an SFI 4.1 signal. The G.709 framer 708 connects at 10 Gbps to the XAUI SerDes 710 which in turn connects to a host device.

The MDIO bridge includes a control field programmable gate array (FPGA) 716 which is configured to bridge the MDIO interface between the G.709 framer 708 and the XAUI SerDes 710. The FPGA 716 connects to the G.709 framer 708 and to the XAUI SerDes 710 and provides a single external MDIO 720 interface to the host device. This external MDIO interface 720 includes data from both the XAUI SerDes 710 and the G.709 framer 708. The FPGA 716 connects to the XAUI SerDes 710 through a XAUI MDIO 718 connection and to the G.709 framer 708 through a parallel microprocessor bus 712. Additionally, the FPGA 716 provides discrete control and status 714 to the SFI-4 SerDes 706. The FPGA 716 has a serial packet interface (SPI) to a processor 724 which in turn has a 2-wire input/output (I/O) connection 726 to the XAUI SerDes 710 and a SPI interface to another processor 722. The FPGA 716 is configured to decode MDIO addresses and pass MDIO data between both the G.709 framer 708 and the XAUI SerDes 710. Also, the FPGA 716 is configured to combine MDIO data from both the G.709 framer 708 and the XAUI SerDes 710 to the external MDIO 720. As such, the MDIO bridge provides a mechanism for a single, MSA-compliant MDIO interface to operate with the additional circuitry of the G.709 framer with FEC 708.

Figure 8:
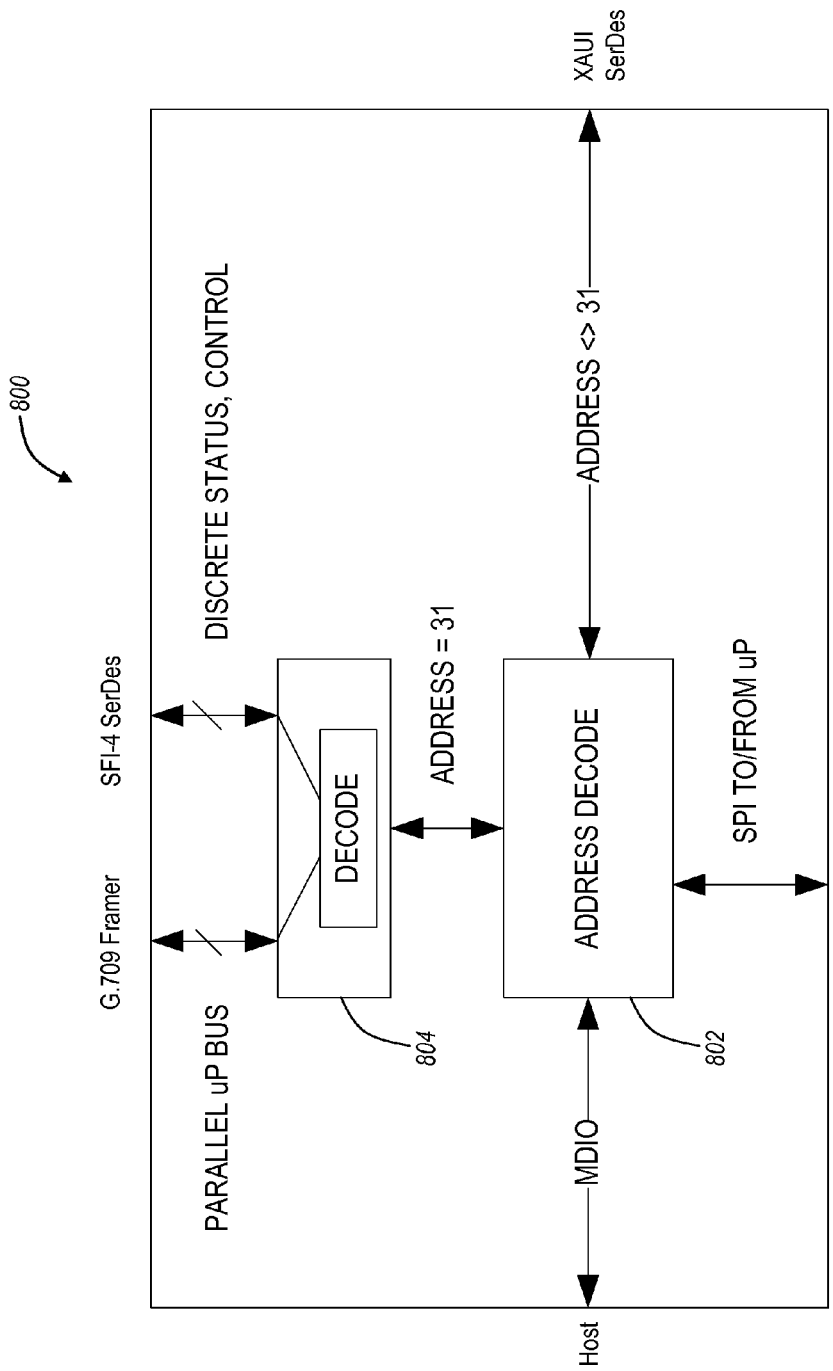
FIG. 8 is a signal flow diagram of an MDIO bridge to perform an address decode to split MDIO data between a G.709 framer and a XAUI SerDes.

Referring to FIG. 8, in an exemplary embodiment, the MDIO bridge performs an address decode 802 to split MDIO data between the G.709 framer and the XAUI SerDes. The address decode 802 receives/transmits MDIO data to/from the host device and checks the MDIO address. If the MDIO is a specific address, then the address decode sends it to decode 804. If not, then the address decode 802 sends it to the XAUI SerDes. For example, if the MDIO address is 31, then the address is sent to decode 804. If the address is not 31, then it sends the data to the XAUI SerDes. The address corresponds to the register in the MDIO, and register 31 can be undefined in some of the MSA specifications allowing register 31 to be used to pass overhead between the G.709 framer and the host system. Any other register in the MDIO which is undefined can be used to pass overhead. The decode 804 determines whether the data with address 31 should go to the parallel microprocessor bus to the G.709 framer or to the SFI-4 SerDes for discrete status and control. Additionally, the present disclosure can perform processing of overhead onboard the optical transceiver, such as in the FEC chip and the like. The overhead is analyzed to provide the overhead in a readable format to a user. The MDIO can be utilized to pass analyzed overhead to a host system.

Figure 9:
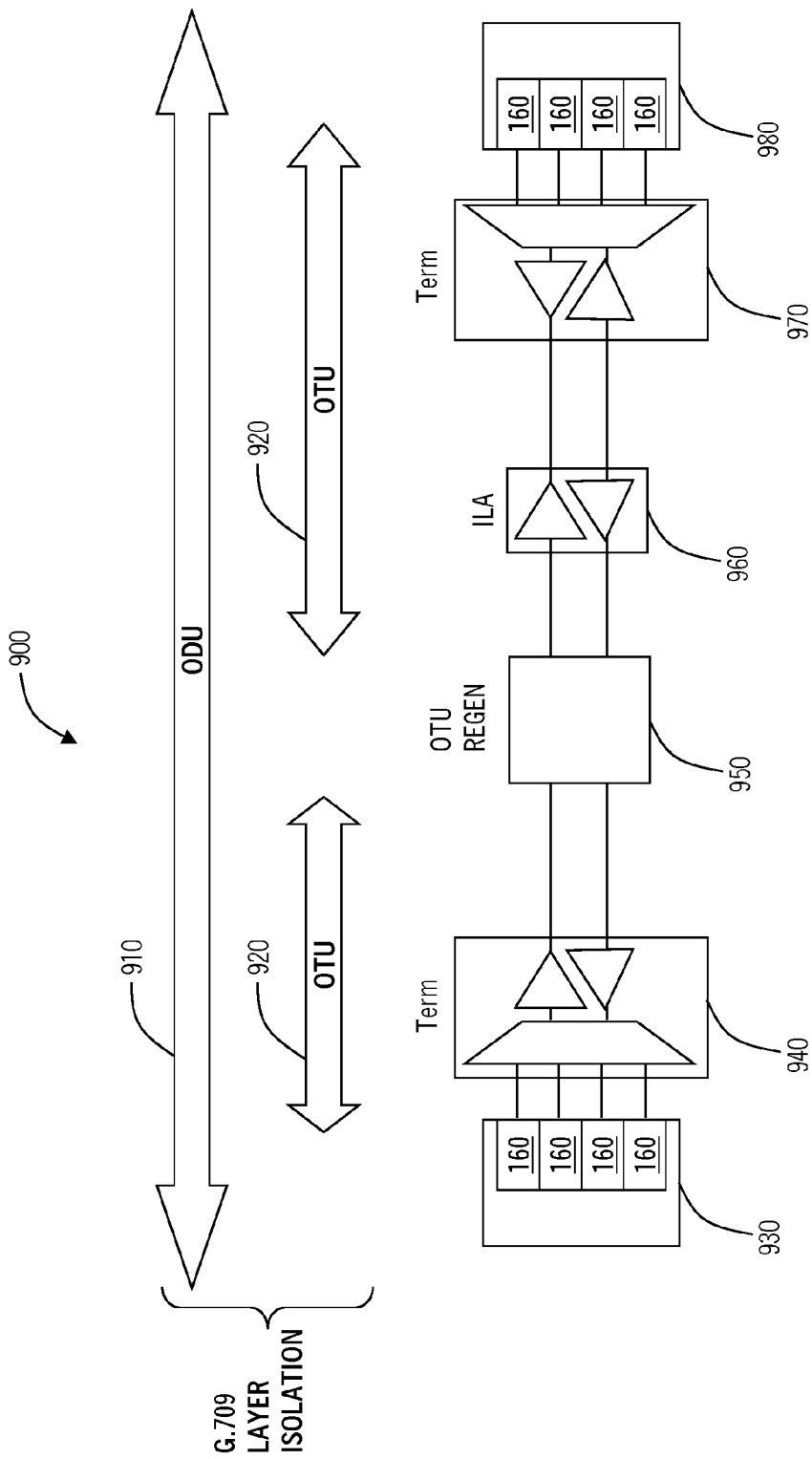
FIG. 9 is a network diagram of a layered approach to management and monitoring of sections in an optical network from ITU-T Recommendation G.709.

Referring to FIG. 9, ITU-T Recommendation G.798 defines a layered approach to management and monitoring of sections in an optical network 900. G.798 provides for transparency in wavelength services, improvement in optical link performance through out-of-band forward error correction (FEC), improved management through full transparency, and interoperability with other G.709 clients. G.709 defines a wrapper in which a client signal is encapsulated. The G.709 wrapper includes overhead bytes for optical layer OAM&P and FEC overhead for error correction. G.709 provides the framing, alarms and PM error information. G.826 and G.8201 explain how to display the PMs. G.975 and G.975.1 specify the FEC algorithms.

Figure 11:
FIG. 11 is a diagram of G.709 overhead.

The optical network 900 includes client devices 930,980 each equipped with one or more optical transceivers 160. The optical transceivers 160 of the client device 930 are connected to an optical terminal 940, an optical transport unit (OTU) regen 950, an in-line line amplifier (ILA) 960, and a second optical terminal 970 which is connected to the optical transceivers 160 of the second client device 980. The optical channel data unit (ODU) 910 layer is between optical client elements. In the example of FIG. 11, the ODU 910 layer is between each optical transceiver 160 of the first client device 930 and each optical transceiver 160 of the second client device 980. The ODU 910 layer is similar to the line layer in the SONET standard. The optical transport unit (OTU) 920 is between the OTU regen 950 and each of the optical transceivers 160 of the client devices 930,980 similar to the SONET section layer.

In an exemplary embodiment, G.709 framing is integrated into optical transceivers specified by MSAs such as CFP and variants thereof (e.g., CFP2, CFP4, CXP), CDFP and variants thereof (e.g., CDFP2, CDFP4, etc.), MSA-100GLH, CCRx, QSFP and variants thereof (e.g., future QSFP+, QSFP2), 10×10, XFP, XPAK, XENPAK, X2, XFP-E, SFP, SFP+, 300-pin, and the like. The G.709 framing in the optical transceivers provides the ability to monitor OAM&P associated with the G.709 ODU 910 and OTU 920 layers to enable optical layer OAM&P functions necessary for metro, regional and core applications direct from optical transceivers. The monitoring of the ODU 910 and OTU 920 layers allows isolation of OAM&P and error monitoring between optical sections of the optical transceivers. Further, the optical transceivers are capable of being monitored by industry-compliant network management systems (NMS) through the I2C or MDIO. The optical transceivers of the present disclosure can support any framing method capable of OAM&P at the optical layer in addition to G.709.

Figure 10A:
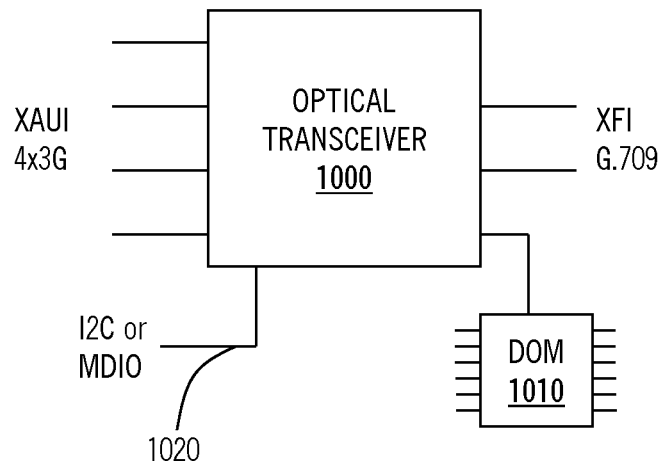
FIGS. 10a-10b are block diagrams illustrating frame overhead management data terminated internally in a optical transceiver or passed to a host system.
Figure 10B:
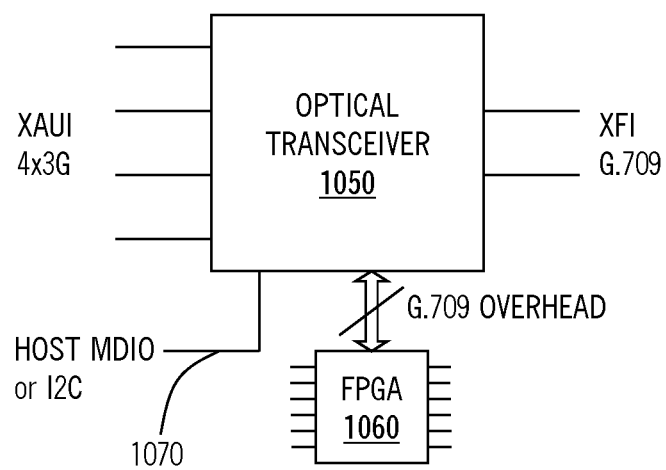
Figure 12A:
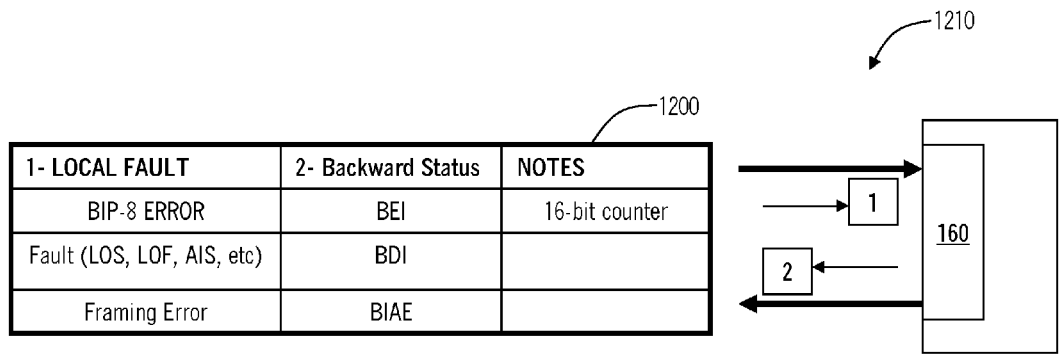
FIGS. 12a-12b are diagrams illustrating frame error reporting in G.709 and an network discovery and connection management.

Referring to FIGS. 10a-10b, the present disclosure terminates frame overhead management data internally in a optical transceiver or passes the frame overhead management data to a host system. In FIG. 12a, the MDIO or I2C 1020 is configured for on-chip OAM&P access in a optical transceiver 1000. The optical transceiver 1000 includes circuitry to frame an incoming signal, to add FEC to the signal, and to manage the optical output signal through OAM&P mechanisms. For example, the optical transceiver 1000 can include a XENPAK, XPAK, or X2 MSA type transceiver configured to accept XAUI inputs and provide an XFI output with the framing circuitry configured to provide a G.709 optical signal with the XFI signal encapsulated.

The optical transceiver 1000 includes circuitry configured to manage OAM&P through the frame overhead. In an example embodiment, the framing technique is G.709 and the optical transceiver 1000 is configured to terminate selected overhead bytes from the G.709 overhead to provide for optical layer OAM&P. The data terminated from these bytes can be provided to the host system (i.e. line card, blade) through vendor-specific (i.e., unused, undefined, reserved, or optional) MDIO registers in the MSA specification. For example, XENPAK, XPAK, and X2 include MDIO registers reserved for future use. OAM&P access can be implemented on these registers while maintaining compliance with the MSA specification. Optical transceiver 1000 provides access to a subset of G.709 management overhead similar to WAN PHY in that it does not terminate all OAM&P on G.709 due to power, space, and host communication constraints, but it does allow for carrier grade OAM&P on the transceiver 1000 without the extra features not current defined or commonly used. From a hardware perspective, the host system is designed to read the MDIO according to the MSA specification. The host system can be modified through software only to read and process the OAM&P data received on the MDIO registers.

With regards to XFP, XFP-E, SFP, and SFP+, the OAM&P data access is done through the inter-integrated circuit (I2C) serial bus. I2C is a serial communications bus through which a optical transceiver, such as XFP, XFP-E, and SFP+, communicates to the host system. DOM 1010 is a monitoring scheme for physical layer parameters utilized by each MSA specification for performance monitoring on the optical transceiver. For example, the DOM 1010 can provide PMs such as optical output power, optical input power, laser bias current, etc.

In FIG. 10b, the frame overhead is configured to pass the frame overhead off-chip in a optical transceiver 1050 to a field programmable gate assembly (FPGA) 1060 for terminating the entire frame overhead. The optical transceiver 1050 includes circuitry to frame an incoming signal, to add FEC to the signal, and to manage the optical output signal through OAM&P mechanisms. For example, the optical transceiver 1050 can include a XENPAK, XPAK, or X2 MSA type transceiver configured to accept XAUI inputs and provide an XFI output with the framing circuitry configured to provide a G.709 optical signal with the XFI signal encapsulated. The optical transceiver 1050 includes circuitry configured to manage OAM&P through the frame overhead. In an example embodiment, the framing technique is G.709 and the optical transceiver 1050 is configured to terminate selected overhead bytes from the G.709 overhead to provide for optical layer OAM&P. The data terminated from these bytes can be provided to the host system (i.e. line card, blade) through the FPGA 1060. The host system can be modified to receive and process all of the OAM&P from the FPGA 1060. Additionally, FIGS. 10a-10b can include an XFI 10G serial input to both the optical transceiver 1000, 1050 instead of a XAUI interface.

Referring to FIG. 11, the G.709 overhead 1100 is partitioned into OTU frame alignment bytes in row 1, columns 1-7; ODU overhead bytes in rows 2-4, columns 1-14; OTU overhead bytes in row 1, columns 8-14; and OPU overhead in rows 1-4, columns 15-16. Further, the G.709 overhead 1100 includes FEC data (not shown) in the frame. As discussed in FIGS. 12a-12b, the present disclosure discloses two methods of terminating frame management overhead by either terminating a subset of the overhead in the optical transceiver or by passing the entire overhead off-chip to the host system. In an exemplary embodiment, FIG. 11 depicts an example of the subset of G.709 overhead that is terminated on-chip in the optical transceiver.

The subset of G.709 overhead terminated on chip includes the frame alignment signal (FAS) bytes and the multi-frame alignment signal (MFAS) which are the OTU frame alignment bytes. Also, the subset of G.709 overhead includes the section monitoring (SM) bytes and the path monitoring (PM) bytes to provide optical layer error management between optical section and path in G.709. The SM bytes include dedicated BIP-8 monitoring to cover the payload signal, and these are accessible at each optical transceiver. The first byte of the SM used for Trail Trace Identifier (TTI) which is a 64-byte character string similar to a section trace in SONET. The SM/PM bytes include dedicated BIP-8 monitoring to cover the payload signal, and these are accessible at each optical transceiver. The first byte of the SM/PM is used for TTI which is similar to path trace in SONET. The general communication channel 0 (GCC0) bytes provide a communications channel between adjacent G.709 nodes.

Additionally, the subset of G.709 overhead terminated on chip includes the payload signal identifier (PSI), justification control (JC), and negative justification opportunity (NJO). For asynchronous clients such as 10 GbE and 10G FC, NJO and PJO are used as stuff bytes similar to PDH. If the client rate is lower than OPU rate, then extra stuffing bytes may be inserted to fill out the OPU. Similarly, if the incoming signal to the optical transceiver is slightly higher than the OPU rate, NJO and PJO bytes may be replaced with signal information, i.e. the OPU payload capacity is increased slightly to accommodate the extra traffic on the optical transceiver, and the JC bytes reflect whether NJO and PJO are data or stuff bytes the JC bytes are used at the off-ramp to correctly de-map the signal. The PSI provides an identification of the payload signal.

Because the current MSA specifications were never envisioned to carry full OAM&P overhead data on and off an optical transceiver, the present disclosure provides a subset of OAM&P access to minimize power, space, cost, and host communications in the circuitry on the optical transceiver to fit within the MSA specification and to continue offering the benefits of optical transceivers such as low cost. However, this subset of OAM&P still allows network operators to realize carrier-grade optical layer performance monitoring directly off optical transceivers without additional hardware. Further, the above exemplary embodiment with G.709 OAM&P can be utilized in any framing technique on a optical transceiver. The subset of G.709 overhead terminated in FIG. 13 can be modified depending on the application requirements.

In an exemplary embodiment, unused, undefined, reserved, or optional bytes in the G.709 overhead 1100 can be utilized to create a closed loop communications channel between a near end and a far end optical transceiver. For example, the EXP (experimental) overhead in the ODU path overhead could be used. The EXP overhead does not impact the payload bit rate or transparency and is transparent to OTU regenerators. The closed loop communications channel can be configured to provide far end PM counts, far end loopback initiation and release, far end PRBS injection, far end alarms, far end general communications, and the like. The closed loop communications channel can be utilized for accessing the far end optical transceiver in the Ethernet demarcation application. Here, the far end optical transceiver can be configured to not provide OAM&P to a remote host system since the host system is a CPE device which likely is not configured for accessing OAM&P from the optical transceiver. Instead, the far end provides its OAM&P to the near end through the communications channel allowing for Ethernet demarcation at the far end to be monitored and executed locally.

Figure 12B:
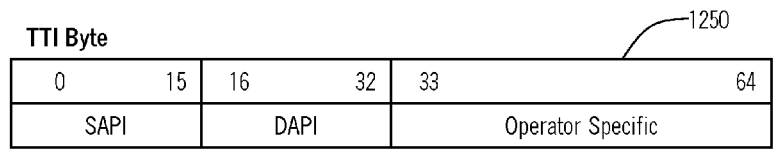

Referring to FIGS. 12a-12b, an exemplary embodiment of frame error reporting in G.709 is depicted in FIG. 12a and an exemplary embodiment of network discovery and connection management is depicted in FIG. 12b. FIG. 12a includes a table 1200 illustrating local faults 1 such as a BIP-8 error, fault (loss-of-signal, loss-of-frame, alarm indication signal, etc.), and framing error along with the corresponding backward status 2. Network element 1210 is equipped with a optical transceiver 160 equipped with a TX and RX and configured to provide overhead and framing internal to the transceiver 160. The local fault 1 is seen on the RX side of transceiver 160 and the corresponding backward status 2 is transmitted over the overhead. In an exemplary embodiment, the MDIO reports OTU BIP-8 error counts for the near end (NE) and far end (FE) in a 16-bit register, ODU BIP-8 error counts for the NE and FE in a 16-bit register, and the corrected FEC error count for the NE in a 32-bit register.

FIG. 12b includes a table 1250 illustrating a TTI byte used for connection management and network discovery. The optical transceiver of the present disclosure includes OTU and ODU trail trace identifier (TTI) support through, for example, the 64-byte G.709 standard implementation which includes a 16-byte Source Access Point Identifier (SAPI)/Destination Access Point Identifier (DAPI), and a 32-byte user specific field. Further, the optical transceiver supports a TTI mismatch alarm. The TTI mismatch alarm can be utilized in troubleshooting fiber misconnection issues.

In an exemplary embodiment, providing G.709 framing support in a optical transceiver, the optical transceiver can be configured to provide support of G.709 standardized alarms for fault isolation at the far or near end including:

| Alarms | Description |
| --- | --- |
| LOS | Loss of Signal |
| LOF | Loss of Frame |
| OOF | Out of Frame |
| OOM | Out of Multi Frame |
| OTU-AIS | Alarm Indication Signal |
| OTU-IAE | Incoming Alignment Error |
| OTU-BDI | Backward Defect Indicator |
| ODU-AIS | Alarm Indication Signal |
| ODU-OCI | Open Connection indicator |
| ODU-LCK | Locked |
| ODU-BDI | Backward Error indicator. |
| FAS | Frame Alignment Error |
| MFAS | Multi Frame Alignment Error |
| OTU TTI-M | OTU TTI Mismatch |
| ODU TTI-M | ODU TTI Mismatch |

Further, the MDIO interface provides full control support of the optical transceiver including:

| Control | Description |
| --- | --- |
| Loop back | Loop back towards client |
| Loop back | Loop back towards line |
| Low Power | Low Power mode |
| Reset | Reset |
| PRBS31 enable | PRBS payload test pattern |
| Test Pattern Selection | Square Wave or Mixed Frequency |

Further, the optical transceiver module status and error registers include the following:

| | Description |
| --- | --- |
| Status | |
| Fault | Fault Yes/No |
| Link Status | Link Up or Down |
| PMs Registers | |
| OTU BIP NE | OTU BIP Errors - Near End |
| OTU BIP FE | OTU BIP Errors - Far End |
| ODU BIP NE | ODU BIP Errors - Near End |
| ODU BIP FE | ODU BIP Errors - Far End |
| OTU FEC Corrected | OTU FEC Corrected |
| OTU Uncorrected errors | OTU Uncorrected errors |
| BER | Bit Error Rate |

Figure 13:
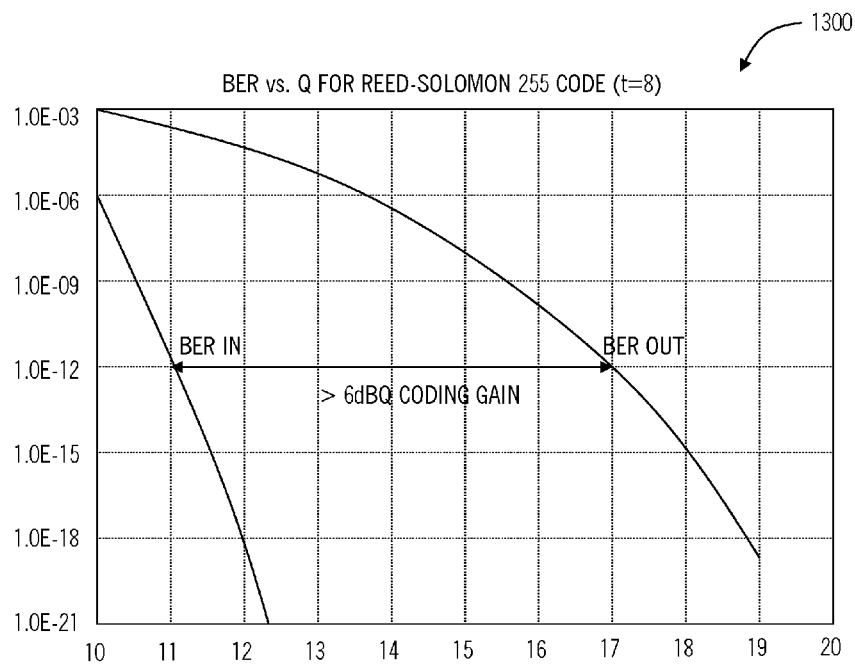
FIG. 13 is a graph of the Reed Solomon FEC code, RS (255, 239)

Referring to FIG. 13, the Reed Solomon FEC code, RS (255, 239), provides 6 dB or more of coding gain to an optical signal. FEC codes operate by encoding additional overhead on a signal at the transmit stage and decoding at the receive stage to utilize the additional overhead to correct errors in the received signal. In optical systems, FEC has been utilized to increase optical margin, to increase transmission distances, lower cost, and relax component specifications in design. The optical transceivers of the present disclosure are configured to implement FEC internally in a optical transceiver by encoding FEC overhead on a signal and decoding at the receive stage. In an exemplary embodiment, the optical transceiver is configured to implement RS (255, 239) as specified by the G.709 standards. The present disclosure is also applicable to utilize any other FEC algorithm capable of implementation within the confines of power, space, and line-rate associated with the optical transceiver MSA specifications. Graph 1300 illustrate bit-error rate (BER) vs. signal quality Q and shows an input BER (BER in) versus the output BER (BER out) after the FEC is processed and errors corrected in the optical transceiver. As shown in FIG. 13, a FEC code such as RS (255, 239) provides 6 dB or more coding gain for a BER of 10e-12. This coding gain can be utilized in optical transceivers to extend the reach beyond 80 km, to loosen component specifications in the transceiver, and to provide robust carrier-grade performance.

Figure 14:
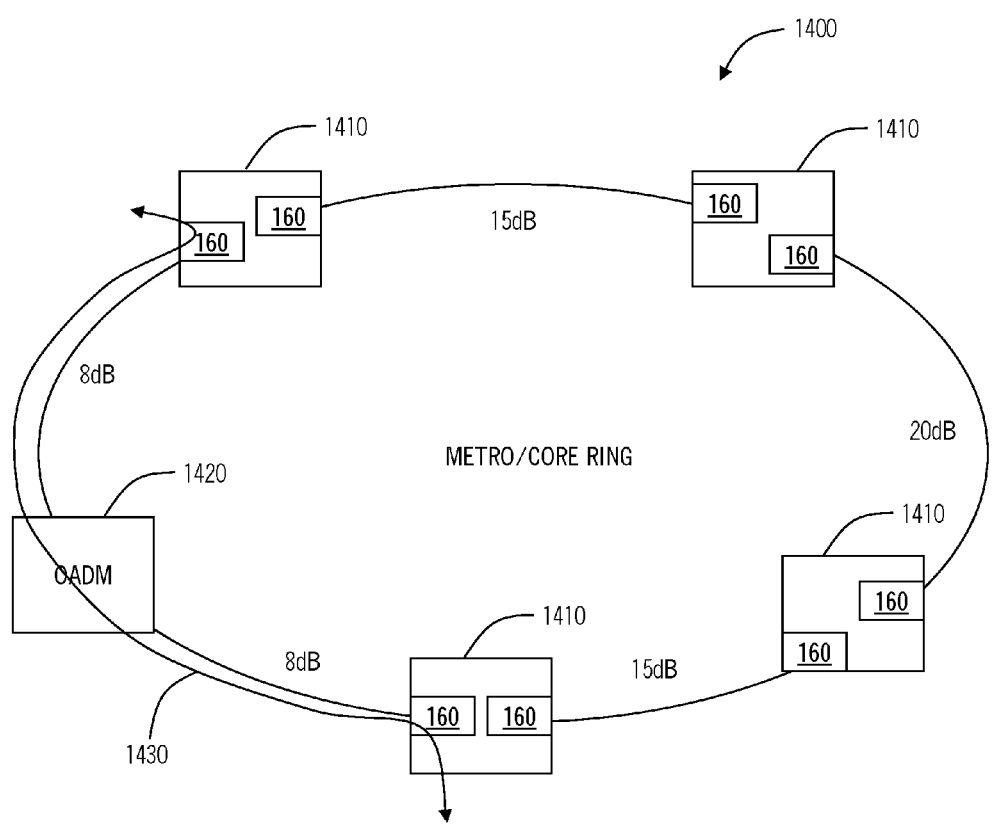
FIG. 14 is a network diagram of an exemplary application of a metro/core ring.

Referring to FIG. 14, an exemplary application includes a metro/core ring 1400 including optical terminals 1410 and an optical add-drop multiplexer (OADM) 1420. The optical terminals 1410 include network elements with line cards or blades configured with optical transceivers 160. The optical transceivers 160 support framing, optical layer OAM&P, and FEC directly without the need for additional equipment such as transponders. Examples of optical terminals 1410 include routers, Ethernet switches, servers, MSPPs, SONET add-drop multiplexers, DWDM terminals, and cross-connects. The metro/core ring 1400 includes multiple optical terminals 1410 in a ring topology with each optical link including an east and west transceiver 160. Additionally, a single OADM 1420 is including in the metro/core ring 1400 where no transceivers 160 are equipped.

The optical transceivers 160 support robust, carrier-grade features directly, allowing the application space for optical transceivers to move beyond short, interconnect applications. In metro/core ring 1400, the optical transceivers 160 reduce the amount of amplifiers required, enable more flexible routing options for wavelengths, and provide overall more design flexibility. Existing optical transceivers are generally limited to less than 80 km (20 dB or less) and offer no G.709 layer OAM&P. The present disclosure extends the benefits of optical transceivers into metro, regional, and core applications.

Figure 15:
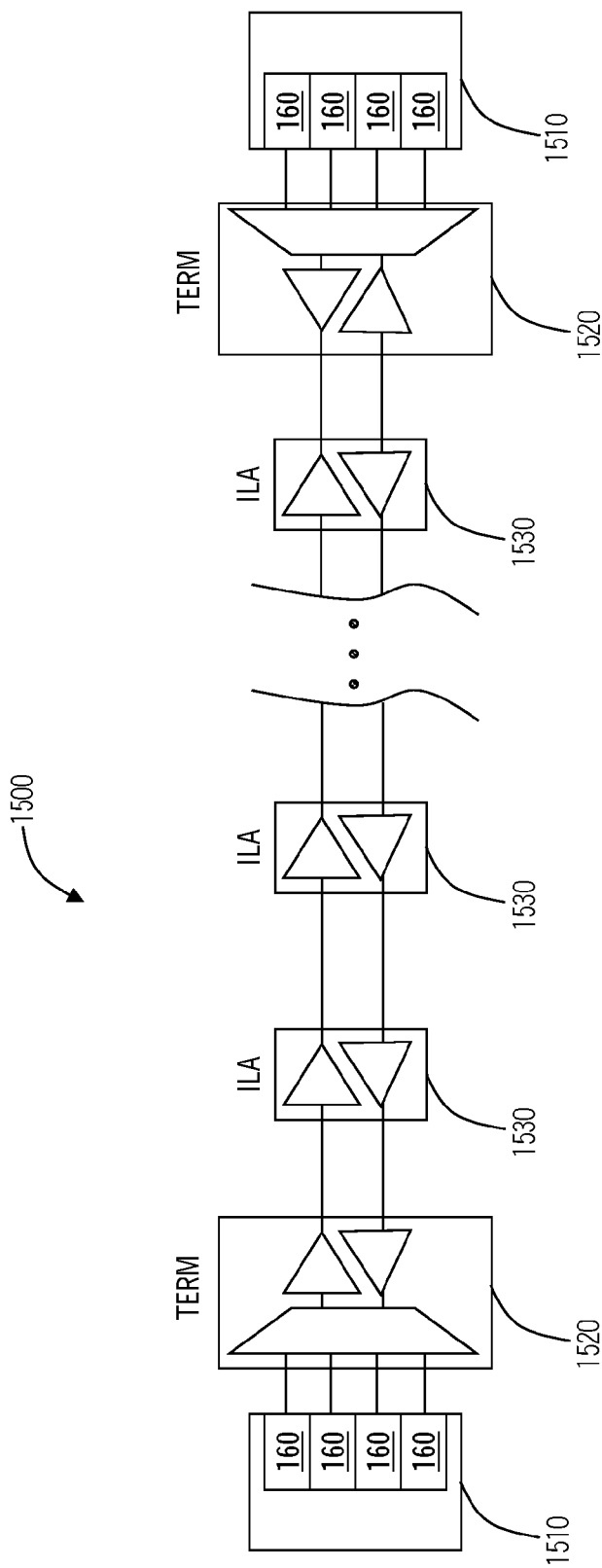
FIG. 15 is network diagram of an exemplary application of regional/core DWDM system.

Referring to FIG. 15, a regional/core DWDM system 1500 includes a terminal 1510 equipped with multiple optical transceivers 160 connected to an optical terminal 1520, multiple inline line amps (ILA) 1530, and another optical terminal 1520 and terminal 1510. The terminals 1510 can include DWDM terminals, MSPPs, SONET ADMs, routers, switches, and cross-connects. Traditionally, terminals 1510 included optical transceivers for short, interconnect applications to another device such as a transponder. The optical transceiver 160 eliminates the need for transponders by supporting framing, optical layer OAM&P, and FEC internally to the transceiver 160. The present disclosure supports a greater than 2.5 times distance increase over traditional optical transceivers. For example, distances up to 1500 km with ILAs 1530 can be achieved with the present disclosure. Further, the optical transceiver 160 supports any optical wavelength type including DWDM wavelengths, eliminating the requirement for transponders to convert to a DWDM wavelength.

The present disclosure, by incorporating framing such as G.709 and FEC in optical transceivers specified by MSAs, significantly enhances performance and OAM&P functions. This allows optical transceivers to be used in IP/Ethernet/ATM/Frame Relay/Fiber Channel over WDM, high density/high performance applications, G.709 interconnection applications, and applications requiring comprehensive optical OAM&P. Traditionally, optical transceivers have accorded benefits to equipment vendors and network operators such as engineering re-use, streamlined manufacturing and sparing, low cost and multiple manufacturing sources. The present disclosure builds upon the existing benefits of optical transceivers by increasing the application space of optical transceivers from short, interconnect applications to metro, regional, and core network applications requiring carrier-grade, robust monitoring and performance.

Figure 16:
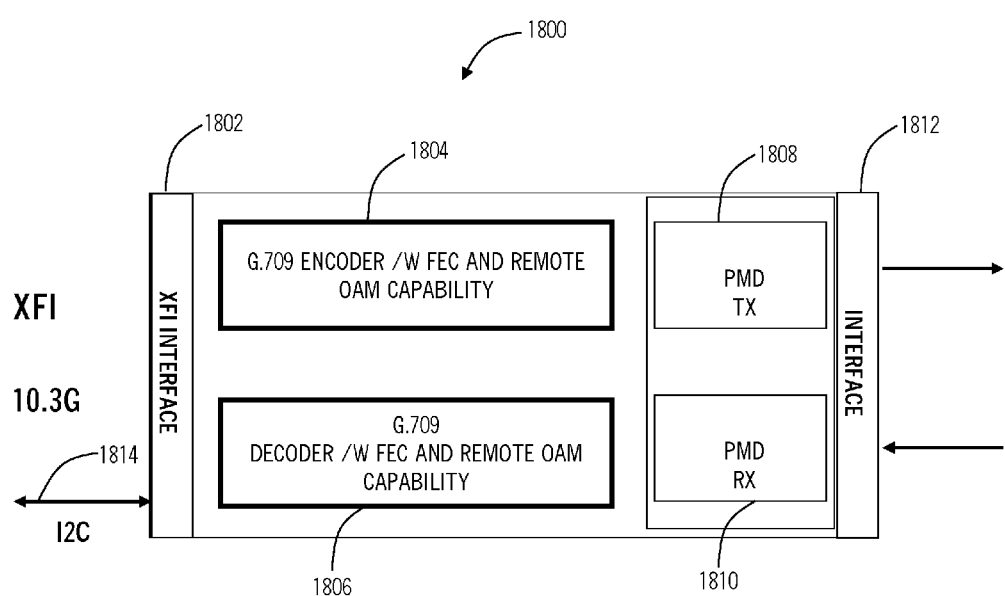
FIG. 16 is a block diagram of an XFP optical transceiver for providing Ethernet extension and demarcation.

Referring to FIG. 16, an XFP optical transceiver 1800 is illustrated for providing Ethernet extension and demarcation according to an exemplary embodiment. The XFP optical transceiver 1800 is configured to plug into any device configured to accept MSA-complaint transceivers, such as CPE routers/switches, etc. The optical transceiver 1800 is utilized to provide Ethernet demarcation at a customer device. Here, the customer device is configured to utilize XFP devices based on the MSA specification. The optical transceiver 1800 also includes additional circuitry to provide G.709 framing, FEC, and remote OAM&P capabilities. The customer device requires no hardware or software modification. Rather, the G.709 framing, FEC, and remote OAM&P capabilities are completely integrated within the optical transceiver 1800 providing a demarcation point from the customer device to a far end port on a service provider's network. Additionally, the far end point has full OAM&P visibility of the optical transceiver based on the remote OAM&P capabilities, such as through a closed loop communication channel. Also, other MSA-type optical transceivers (i.e. CFP and variants thereof (e.g., CFP2, CFP4, CXP), CDFP and variants thereof (e.g., CDFP2, CDFP4, etc.), MSA-100GLH, CCRx, QSFP and variants thereof (e.g., future QSFP+, QSFP2), 10×10, XPAK, XENPAK, X2, XFP-E, SFP, SFP+, 300-pin) can also be utilized for the same Ethernet extension and demarcation functionality.

The XFP optical transceiver 1800 includes an XFI interface 1802 configured to interconnect to a host device in a host system. The XFI interface 1802 is configured to transmit/receive a 10.3 Gb/s signal to/from the host system. The XFI interface 1802 connects to both a G.709 encoder 1804 and a G.709 decoder 1806. The G.709 encoder 1804 includes FEC, Remote OAM capability, G.709 framing, SERDES, and CDR functionality as described herein. The G.709 encoder 1804 is configured to receive a signal from the XFI interface 1802, such as an Ethernet client or the like, and provide framing, OAM&P processing, and FEC encoding. The G.709 decoder 1806 includes FEC, remote OAM capability, G.709 de-framing, SERDES, and CDR functionality as described herein. The G.709 decoder 1806 is configured to de-frame a G.709 signal, process OAM&P, and decode FEC and to provide a signal, such as an Ethernet client or the like, to the XFI interface 1802.

The XFP optical transceiver 1800 includes a Physical Medium Dependent (PMD) transmitter (Tx) and receiver (Rx) 1808,1810. The PMD Tx 1808 is configured to receive a framed signal from the G.709 encoder 1804 and transmit an optical signal on an interface 1812. For example, the interface 1812 can include an XFI interface, a parallel interface, or the like. The PMD Rx 1810 is configured to receive an optical signal on the interface 1812 and to provide the received optical signal to the G.709 decoder 1806. The PMD Tx/Rx 1808,1810 can include 850 nm, 1310 nm, 1550 nm, DWDM, CWDM, and the like depending on the application requirements. The XFP optical transceiver 1800 is configured to interface to any host device configured to operate with optical transceivers compliant to the XFP MSA. For example, the host device can include a router, switch, optical network element, and the like. The host device can include customer premises equipment (CPE) and service provider equipment. The XFP optical transceiver 1800 includes an I2C interface 1814 for communications with the host device. The XFP optical transceiver 1800 is configured to utilize the communications detailed in the XFP MSA specification.

When the XFP optical transceiver 1800 is configured in a CPE device or other remote device for demarcation, the XFP optical transceiver 1800 is configured to only provide standard XFP MSA-based communications over the I2C interface 1814 to the host device. Accordingly, the host device is unaware of the additional framing, FEC, and OAM&P functionality. This enables any XFP-compliant host device to utilize the XFP optical transceiver 1800 for demarcation. Here, the OAM&P is provided to a host device at a far end, such as described herein with a closed loop communication channel. When the XFP optical transceiver 1800 is configured in a service provider device or the like, the XFP optical transceiver 1800 is configured to provide standard XFP MSA-based communications and G.709 OAM&P information over the I2C interface 1814, such as described in FIGS. 10a-10b. Here, the host device can be configured to utilize the I2C interface 1814 for G.709 OAM&P management of the optical transceiver 1800 in the host device and for remote far-end management of another optical transceiver 1800 over the closed loop communication channel. The I2C interface 1814 is configured for access to OTN alarms, PMs, and overhead.

Figure 17:
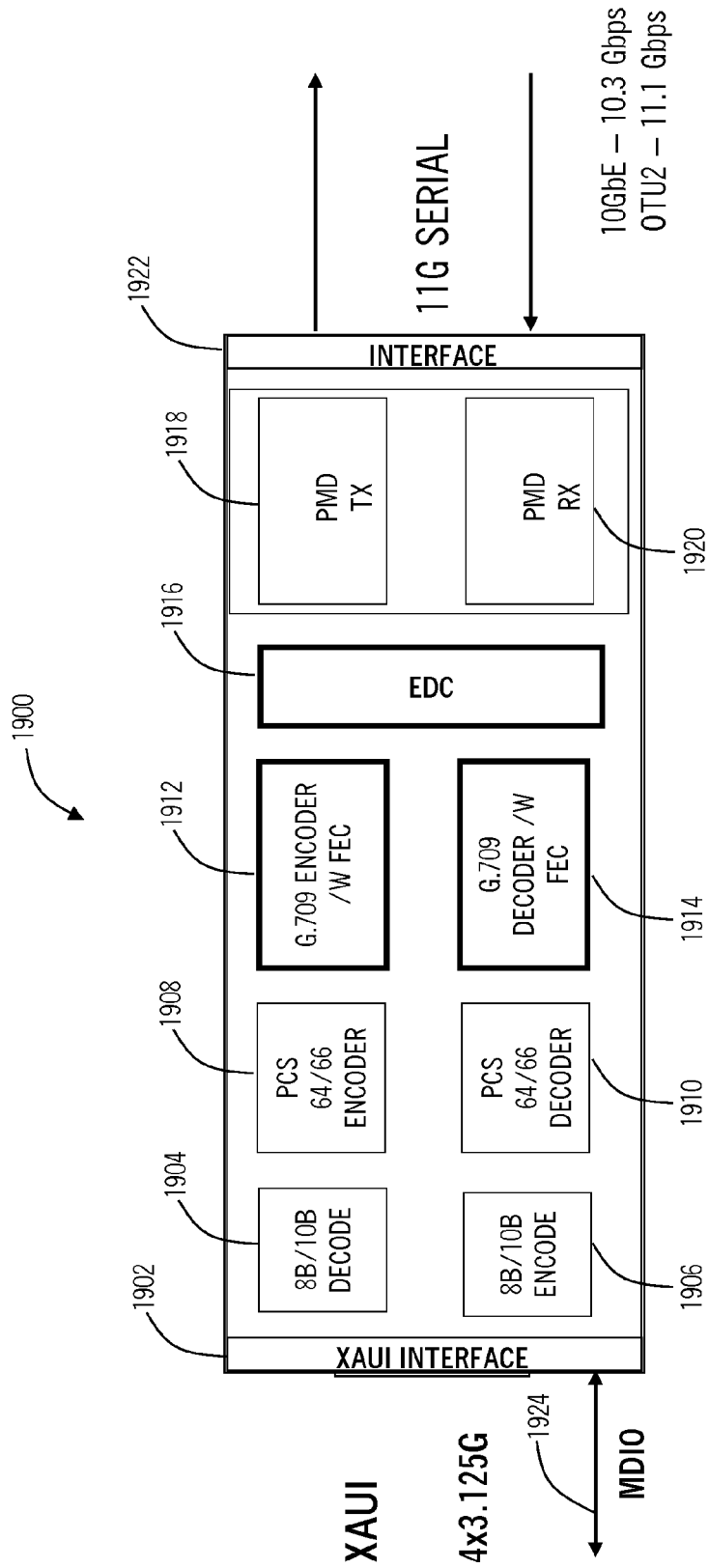
FIG. 17 is a block diagram of a XENPAK optical transceiver for providing Ethernet extension and demarcation.

Referring to FIG. 17, a XENPAK optical transceiver 1900 is illustrated for providing Ethernet extension and demarcation according to an exemplary embodiment. The XENPAK optical transceiver 1900 is configured to plug into any device configured to accept XENPAK-complaint transceivers, such as CPE routers/switches, etc. The XENPAK optical transceiver 1900 is utilized to provide Ethernet demarcation at a customer device. Here, the customer device is configured to utilize XENPAK devices based on the MSA specification. The XENPAK optical transceiver 1900 also includes additional circuitry to provide G.709 framing, FEC, and remote OAM&P capabilities. The customer device requires no hardware or software modification. Rather, the G.709 framing, FEC, and remote OAM&P capabilities are completely integrated within the XENPAK optical transceiver 1900 providing a demarcation point from the customer device to a far end port on a service provider's network. Additionally, the far end point has full OAM&P visibility of the optical transceiver based on the remote OAM&P capabilities, such as through a closed loop communication channel.

The XENPAK optical transceiver 1900 includes a XAUI interface 1902 configured to interconnect to a host device in a host system. The XAUI interface 1902 is configured to transmit/receive a 4×3.125 Gb/s signal to/from the host system. The XAUI interface 1902 connects to both an 8B/10B decoder 1904 and an 8B/10B encoder 1906 which are configured to perform 8B/10B decoding and encoding, respectively, on a signal from/to the XAUI interface 1902. The 8B/10B decoder 1904 connects to a PCS 64/66 encoder 1908 configured to perform 64/66 encoding on the output signal from the 8B/10B decoder 1904. The 8B/10B encoder 1906 receives an input signal from a PCS 64/66 decoder 1910 which is configured to perform 64/66 decoding.

The XENPAK optical transceiver 1900 includes a G.709 encoder with FEC 1912 and a G.709 decoder with FEC 1914. The G.709 encoder 1912 includes FEC, Remote OAM capability, G.709 framing, SERDES, and CDR functionality as described herein. The G.709 encoder 1912 is configured to receive a signal from the PCS 64/66 encoder 1908, such as an Ethernet client or the like, and provide framing, OAM&P processing, and FEC encoding. The G.709 decoder 1914 includes FEC, remote OAM capability, G.709 de-framing, SERDES, and CDR functionality as described herein. The G.709 decoder 1914 is configured to de-frame a G.709 signal, process OAM&P, and decode FEC and to provide a signal, such as an Ethernet client or the like, to the PCS 64/66 decoder 1910. Optionally, the XENPAK optical transceiver 1900 can include an EDC 1916 configured to perform electronic dispersion compensation.

The XENPAK optical transceiver 1900 includes a Physical Medium Dependent (PMD) transmitter (Tx) and receiver (Rx) 1918,1920. The PMD Tx 1918 is configured to receive a framed signal from the G.709 encoder 1912 (or the EDC 1916) and transmit an optical signal on an interface 1922. For example, the interface 1922 can include an XFI interface, a parallel interface, or the like. The PMD Rx 1920 is configured to receive an optical signal on the interface 1922 and to provide the received optical signal to the G.709 decoder 1914 (or the EDC 1916). The PMD Tx/Rx 1918, 1920 can include 850 nm, 1310 nm, 1550 nm, DWDM, CWDM, and the like depending on the application requirements. Additionally, the XENPAK optical transceiver 1900 can include a WIS encoder/decoder between the PCS 1908, 1910 and G.709 1912,1914 blocks.

The XENPAK optical transceiver 1900 is configured to interface to any host device configured to operate with optical transceivers compliant to the XENPAK MSA. For example, the host device can include a router, switch, optical network element, and the like. The host device can include customer premises equipment (CPE) and service provider equipment. The XENPAK optical transceiver 1900 includes an MDIO interface 1924 for communications with the host device. The XENPAK optical transceiver 1900 is configured to utilize the communications detailed in the XENPAK MSA specification.

When the XENPAK optical transceiver 1900 is configured in a CPE device or other remote device for demarcation, the XENPAK optical transceiver 1900 is configured to only provide standard XENPAK MSA-based communications over the MDIO interface 1924 to the host device. Accordingly, the host device is unaware of the additional framing, FEC, and OAM&P functionality. This enables any XENPAK-compliant host device to utilize the XENPAK optical transceiver 1900 for demarcation. Here, the OAM&P is provided to a host device at a far end, such as described herein with a closed loop communication channel.

When the XENPAK optical transceiver 1900 is configured in a service provider device or the like, the XENPAK optical transceiver 1900 is configured to provide standard XENPAK MSA-based communications and G.709 OAM&P information over the MDIO interface 1924, such as described in FIGS. 10a-10b. Here, the host device can be configured to utilize the MDIO interface 1924 for G.709 OAM&P management of the XENPAK optical transceiver 1900 in the host device and for remote far-end management of another XENPAK optical transceiver 1900 over the closed loop communication channel. The MDIO interface 1924 is configured for access to OTN alarms, PMs, and overhead. The present disclosure also contemplates similar operation with other MSA-compliant optical transceivers, such as X2, SFP+, and the like. With respect to Ethernet demarcation, the XFP optical transceiver 1800 and XENPAK optical transceiver 1900 provides network operators and customers significant advantages. For example, demarcation through a optical device significantly reduces capital costs, footprint, power, and installation/turn-up requirements.

Figure 18:
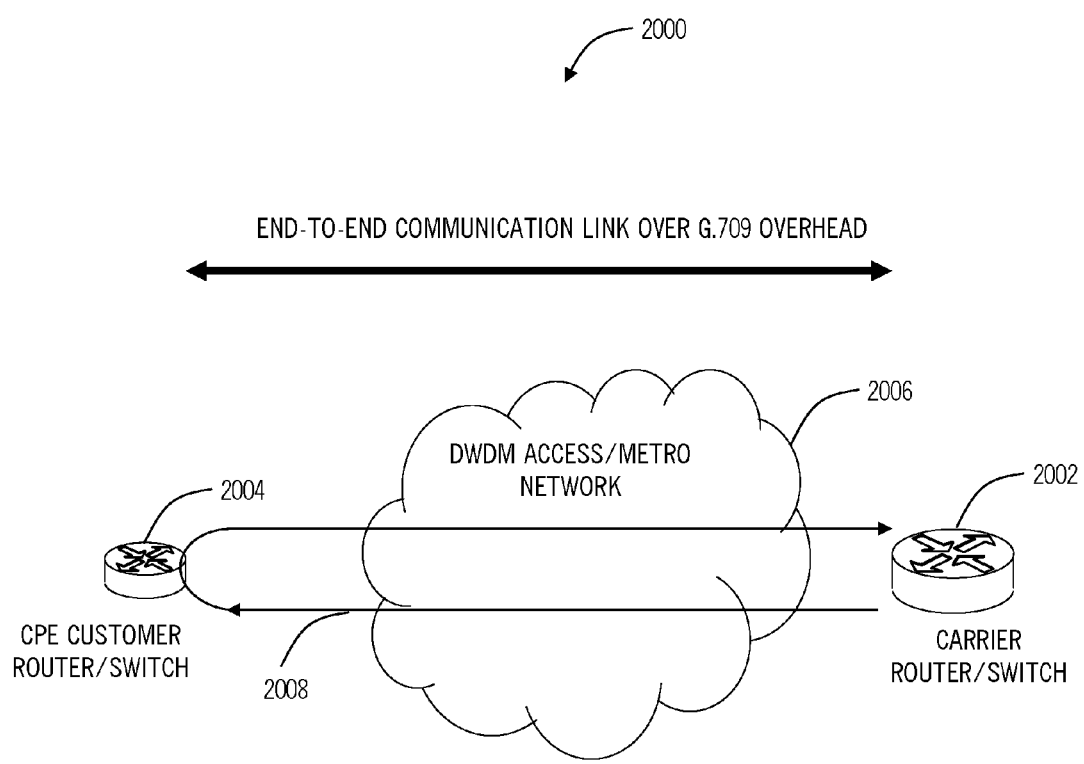
FIG. 18 is a network diagram illustrating an exemplary application of far end demarcation and control.

Referring to FIG. 18, a network 2000 illustrates an exemplary application of far end demarcation and control according to an exemplary embodiment. The network 2000 includes a carrier router/switch 2002 connected to a CPE customer router/switch 2004 through a network 2006. For example, the network 2006 can include a DWDM access/metro network or the like. Both of the routers/switches 2002,2004 are configured with optical transceivers configured with framing, OAM&P, and FEC as described herein. The optical transceivers enable a carrier to demarcate their connection to a customer physically at the router/switch 2004 through the optical transceiver itself. Also, the router/switch 2004 is only required to operate an MSA-compliant optical transceiver without any additional hardware or software functionality.

The router/switch 2002 can establish end-to-end communication through G.709 overhead between the optical transceivers in both of the routers/switches 2002,2004. For example, a communication channel 2008 can be established between the optical transceiver in the router/switch 2002 and the optical transceiver in the router/switch 2004. This can be through the GCC, EXP, or other bytes in the G.709 overhead with no impact on standard G.709 overhead usage. For example, it is possible to obtain some remote PMs from the SM/PM. Also, BDI is from the SM/PM bytes. The communication channel 2008 is utilized to provide alarming, PM, provisioning, and the like from the remote end at the router/switch 2004 to the carrier at the router/switch 2002.

Referring to FIG. 19, a table 2100 illustrates exemplary remote demarcation OAM&P functions available through optical transceivers according to an exemplary embodiment. From an optical transceiver at a far end, a remote end optical transceiver can be provisioned, troubleshot, and monitored. With respect to provisioning, the remote optical transceiver can be commissioned and accepted. Remote provisioning functions can include traffic provisioning, maintenance activities, and traces. With respect to alarming, the remote optical transceiver can be monitored and troubleshot to determine where faults occur, i.e. traditional demarcation functions. Alarming can include G.709 standard backward alarming and remotely fetched alarms. With respect to performance monitoring, the remote optical transceiver can be monitored for end-to-end service level agreements (SLAs) as are typical of demarcation devices. This can include monitoring far end PMs and FEC errors.

Figure 20:
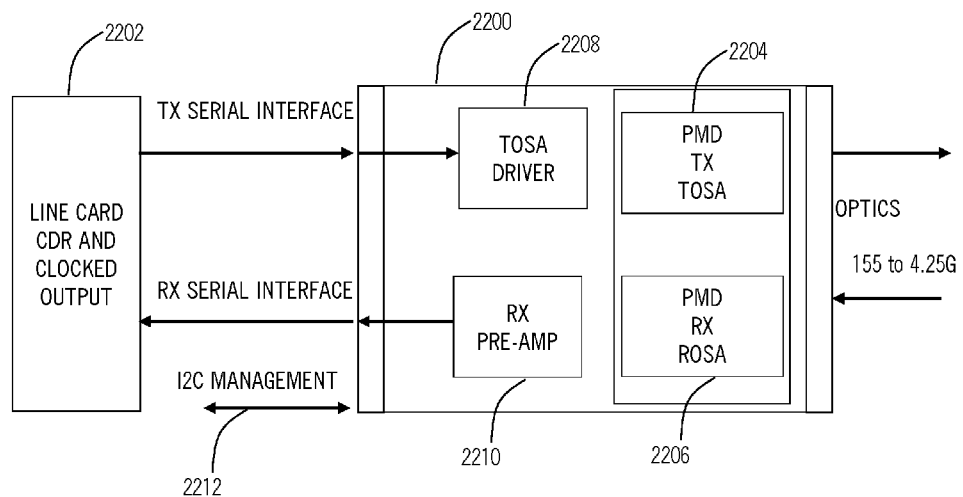
FIG. 20 is a block diagram of a conventional SFP module.

Referring to FIG. 20, a conventional SFP module 2200 is illustrated. The SFP module 2200 is a compact optical transceiver used in optical communications for both telecommunication and data communications applications. It interfaces a network device line card 2202 (for a switch, router or similar device) to a fiber optic or unshielded twisted pair networking cable. The SFP module 2200 is a popular industry format supported by several fiber optic component vendors. SFP transceivers 2200 are designed to support SONET, Gigabit Ethernet, Fibre Channel, and other communications standards.

SFP transceivers are available with a variety of different transmitter (Tx) 2204 and receiver (Rx) 2206 types, allowing users to select the appropriate transceiver for each link to provide the required optical reach over the available optical fiber type (e.g. multi-mode fiber or single-mode fiber). Optical SFP modules 2200 are commonly available in four different categories: 850 nm (SX), 1310 nm (LX), 1550 nm (ZX), and DWDM. SFP transceivers 2200 are also available with a "copper" cable interface, allowing a host device designed primarily for optical fiber communications to also communicate over unshielded twisted pair networking cable. There are also CWDM and single-optic (1310/1490 nm upstream/downstream) SFPs. The different categories of SFP modules 2200 are based on different PMD Tx Transmitter Optical Subassemblies (TOSA) 2204 and PMD Rx Receiver Optical Subassemblies (ROSA) 2206.

The SFP transceiver 2200 is specified by a multi-source agreement (MSA) between competing manufacturers. The SFP transceiver 2200 is commercially available with capability for data rates up to 4.25 Gbit/s or higher. The SFP transceiver 2200 supports digital optical monitoring (DOM) functions according to the industry-standard SFF-8472 Multi Source Agreement (MSA). This feature gives an end user the ability to monitor real-time parameters of the SFP, such as optical output power, optical input power, temperature, laser bias current, and transceiver supply voltage.

The SFP transceiver 2200 includes a TOSA driver 2208 which is configured to interface to a Tx serial interface on the line card 2202. The TOSA driver 2208 provides the serial input to the PMD Tx TOSA 2204. The PMD Rx ROSA 2206 is configured to receive an optical signal and provide the received optical signal to a Rx pre-amp 2210 which interfaces to a Rx serial interface on the line card 2204. In conventional SFP transceivers 2200, the line card 2200 (or other host device) includes a CDR and clocked output, and this functionality is not included on the SFP transceiver 2200, i.e. the SFP transceiver 2200 does not include an internal reference clock. Additionally, the SFP transceiver 2200 includes an I2C management interface 2212 which interfaces to the line card 2202 to provide the DOM and other MSA-based communications. Note, in the SFP MSA, the I2C management interface 221 has very limited functions.

Figure 21:
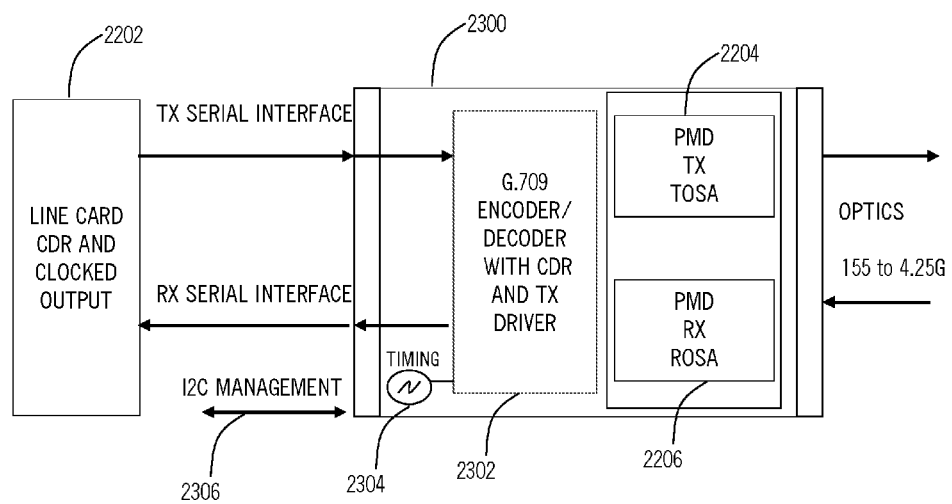
FIG. 21 is a block diagram of a SFP transceiver with integrated framing, FEC, and OAM&P functionality.

Referring to FIG. 21, a SFP transceiver 2300 is illustrated with integrated framing, FEC, and OAM&P functionality according to an exemplary embodiment. The SFP transceiver 2300 is configured to provide G.709 framing, FEC, and OAM&P functionality within the SFP transceiver 2300 while preserving all of the SFP MSA specifications. The SFP transceiver 2300 is configured to interface to the line card 2202 or any other device configured according to the SFP MSA. The SFP transceiver 2300 can include the same PMD Tx TOSA 2204 and PMD Tx ROSA 2206 as utilized in conventional SFP modules. Additionally, the SFP transceiver 2300 includes a G.709 encoder/decoder 2302, integrated timing 2304, and an advanced I2C management interface 2306. The G.709 encoder/decoder 2302 is utilized in place of the TOSA driver 2208 and Rx pre-amp 2210, and includes the same Tx driver and Rx pre-amp functionality. The G.709 encoder/decoder 2302 also includes an integrated CDR, and connects to the integrated timing 2304 for synchronization.

The G.709 encoder/decoder 2302 is configured to frame/un-frame a signal from/to the line card 2202. The framing utilizes G.709 to provide OAM&P and FEC integrated within the SFP transceiver 2300. The SFP transceiver 2300 is configured to frame any input signal from the line card 2202 within SFP specifications, i.e. 155 Mb/s to 4.25 Gb/s. This is done utilizing non-standard OTN rates described herein. The I2C management interface 2306 can communicate standard MSA defined information to the line card 2202 as well as OAM&P information. For example, the line card can be configured to read unused, undefined, reserved, or optional registers on the SFP transceiver 2300 through the I2C management interface 2306 to interface to the overhead information. Alternatively, the line card 2202 does not have to interface with the overhead information as is the case in the demarcation application where the SFP transceiver 2300 is installed in a CPE device, and utilizes the closed loop communication channel to report OAM&P information to the far end.

Referring to FIG. 22, a table 2350 illustrates exemplary specifications for the SFP transceiver 2300 according to an exemplary embodiment. The SFP transceiver 2300 conforms to the SFP MSA form factor, and can support bit rates from 155 Mb/s to 4.25 Gb/s which corresponds to OC-3 to 4 Gigabit Fibre Channel. The Tx can be any type including 1550 nm gray (uncooled), CWDM (uncooled), and DWDM. The Rx can include a PIN or avalanche photo diode (APD). The SFP transceiver 2300 has varying amounts of dispersion tolerance from 120 km to 360 km and associated link budgets from 20 dB to 32 dB. As described herein, the SFP transceiver 2300 can be used in any device capable of utilizing an SFP-compliant transceiver including Ethernet switches, IP routers, MSPPs, SAN directors, CPE demarcation, and the like.

Referring to FIG. 23, a table 2360 illustrates exemplary OTN bit rates utilized for various signal rates associated with SFP transceivers according to an exemplary embodiment. The lowest standardized OTN bit rates are for 2.5 Gb/s signals. The present disclosure utilizes the same OTN framing structure with different, proprietary OTU bitrates. The present disclosure can utilize either 255/237 or 255/238 bit rates. The 255/237 bit rate can utilize an OTU2 type frame with 64 byte stuffing per OTU2 frame, and the 255/238 bit rate can utilize an OTU1 type frame without byte stuffing. For example, an OC-3/STM-1 has an input bit rate into an SFP of 0.1555 Gb/s. The SFP transceiver 2300 is configured to frame the input OC-3/STM-1 into an OTN frame with a G.709 bit rate of 0.16733 Gb/s (255/237) or 0.16663 Gb/s (255/238). The overhead and FEC are utilized with the additional bit rate. The table 2360 also illustrates different bit rates for OC-12/STM-4, 1G FC, 1 GbE, 2G FC, OC-48/ STM-16, and 4G FC for both 255/237 and 255/238 bit rates.

Figure 24:
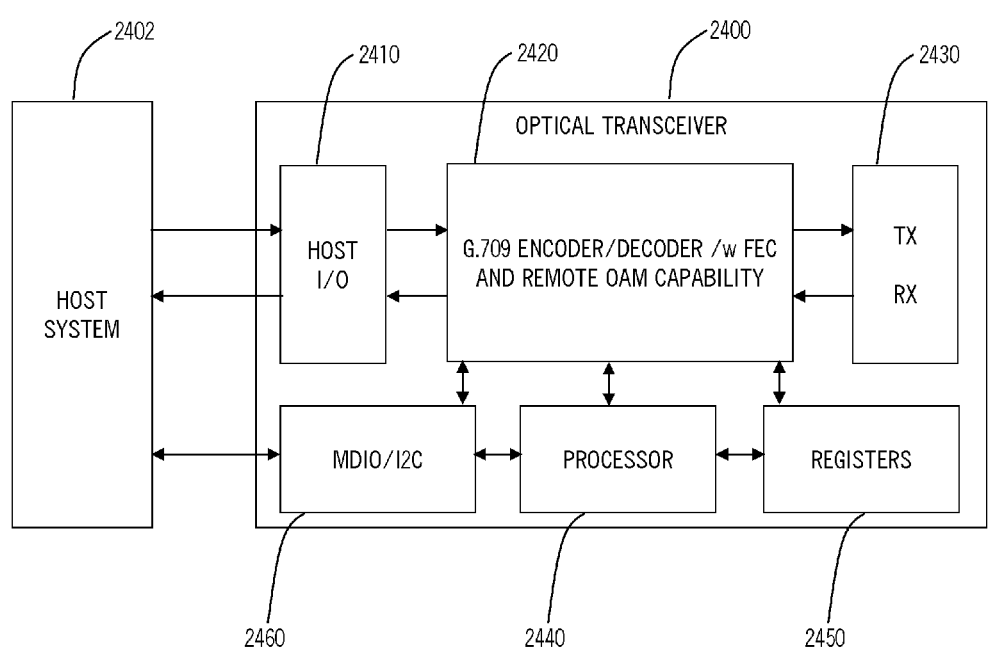
FIG. 24 is a block diagram illustrating functionality of an optical transceiver with integrated framing functionality, optical layer OAM&P, FEC, data encapsulation, performance monitoring, and alarming.

Referring to FIG. 24, a block diagram illustrates functionality of an optical transceiver 2400 according to an exemplary embodiment. The optical transceiver 2400 can include any MSA-compatible optical transceiver, such as CFP and variants thereof (e.g., CFP2, CFP4, CXP), CDFP and variants thereof (e.g., CDFP2, CDFP4, etc.), MSA-100GLH, CCRx, QSFP and variants thereof (e.g., future QSFP+, QSFP2), 10×10, XFP, XPAK, XENPAK, X2, XFP-E, SFP, SFP+, 300-pin, and the like. As described herein, the present disclosure includes additional circuitry on the optical transceiver 2400 to provide integrated framing functionality, optical layer OAM&P, FEC, data encapsulation, performance monitoring, and alarming in the optical transceiver 2400. This additional circuitry is configured to preserve the specifications of the MSA defining the optical transceiver 2400. Accordingly, the optical transceiver 2400 is configured to operate in any host system 2402 configured to operate according to the MSA specifications.

The optical transceiver 2400 includes a host input/output (I/O) module 2410, a G.709 encoder/decoder 2420, a Tx/Rx module 2430, a processor 2440, registers 2450, and an MDIO/I2C interface 2460. Note, the various modules 2410-2460 can be integrated within various ASICs on the optical transceiver 2400. The host I/O module 2410 is configured to interface to the host system 2402 according to the MSA specifications. For example, the module 2410 can include a XAUI, serial interface, or the like. As described herein, the G.709 encoder/decoder 2420 is configured to frame/unframe, encode/decode FEC, and process overhead integrated within the optical transceiver 2400 while preserving the MSA specifications. The Tx/Rx module 2430 provides the physical optical input/output.

The optical transceiver 2400 includes a processor 2440 which is communicatively coupled to the G.709 encoder/decoder 2420, multiple registers 2450, and an MDIO/I2C interface 2460. The processor 2440 is a hardware device for executing software instructions. The processor 2440 can be any custom made or commercially available processor, a central processing unit (CPU), an auxiliary processor among several processors associated with the server 200, a semiconductor-based microprocessor (in the form of a microchip or chip set), or generally any device for executing software instructions.

In an exemplary embodiment, the processor 2440 is configured to process and provide performance monitoring (PM) data and alarming based on the overhead and FEC from the G.709 encoder/decoder 2420. Additionally, the processor 2440 is configured to export PM and alarm data off the optical transceiver 2440 through the MDIO/I2C interface 2460, such as described herein in FIGS. 8 and 10a-10b. For example, the processor 2440 can be configured to bridge data on the MDIO/I2C interface 2460 through unused, undefined, reserved, or optional registers in the MSA specification to provide an MSA-compliant mechanism to report the data to the host system 2402. Additionally, the processor 2440 can export the PM and alarm data to a far-end, such as in FIG. 18, through overhead in the G.709 encoder/decoder 2420.

As described herein, the G.709 encoder/decoder 2420 is configured to transmit/receive a signal to/from the host I/O 2410. The signal is decoded/encoded with FEC and de-framed/framed with overhead, such as described in FIG. 11. The G.709 encoder/decoder 2420 is configured to strip out incoming overhead, and process the overhead in conjunction with the processor 2440. Advantageously, the integration of framing, FEC, and OAM&P into the MSA optical transceiver 2400 enables performance monitoring and alarming at a carrier-grade level without extra equipment. This functionality is integrated into the optical transceiver 2400 while preserving the existing MSA specifications. Accordingly, the optical transceiver 2400 can operate in any MSA-compliant host system 2402. The host system 2402 can be configured to retrieve PMs and alarms from the optical transceiver 2400 through software modifications only, i.e. to read the registers used for this data.

The optical transceiver 2400 can operate in a transparent mode and an enhanced mode. In the transparent mode, the module can be used with existing host device 2402 driver software without any alteration. In this mode, the OTN framing and Forward Error Correction features are always turned on but all associated Overhead Management information is terminated within the optical transceiver 2400 and is transparent to the host device 2402 driver software. The optical transceiver 2400 is built with the necessary intelligence to recognize the 10GE PHY mode (LAN PHY or WAN PHY) the host device 2402 wants to configure, by monitoring register "2.7.0" PCS Type Selection, and sets all appropriate OTN frame registers, VCXO frequencies, etc. . . . to accommodate the proper OTN bit rate for the mode selected. In the Transparent Mode, the optical transceiver 2400 offers 4× higher DWDM performance and enhanced reach thanks to the Forward Error Correction coding gain feature.

In the Enhanced mode, in addition to selecting a LAN or WAN PHY, the host can also turn-on and off the OTN and FEC features. In this mode, the host has full accessibility to all the OTN G.709 OAM features so that an ITU OTN compliant 10 Gbps optical interface can be supported and exposed to a higher layer software entity. Management data from and to the host is supported via the standard MDIO/I2C interface 2460 (so no hardware change is necessary). Network operators can access various components of the overhead on the optical transceiver 2400 through the host system 2402 and the MDIO/I2C interface 2460. The host system 2402 can be configured to retrieve various PMs and alarm information from the registers 2450 through the MDIO/I2C interface 2460. This information can be imported through the host system 2402 to an EMS system for access by network operators. The present disclosure contemplates access to all alarms in ITU-T G.709, all six Tandem Connection Monitoring (TCM) bytes in G.709, far end monitoring as specified in G.709, loopbacks, historical and real-time PM values for FEC, section, and path, and the like.

Figure 25:
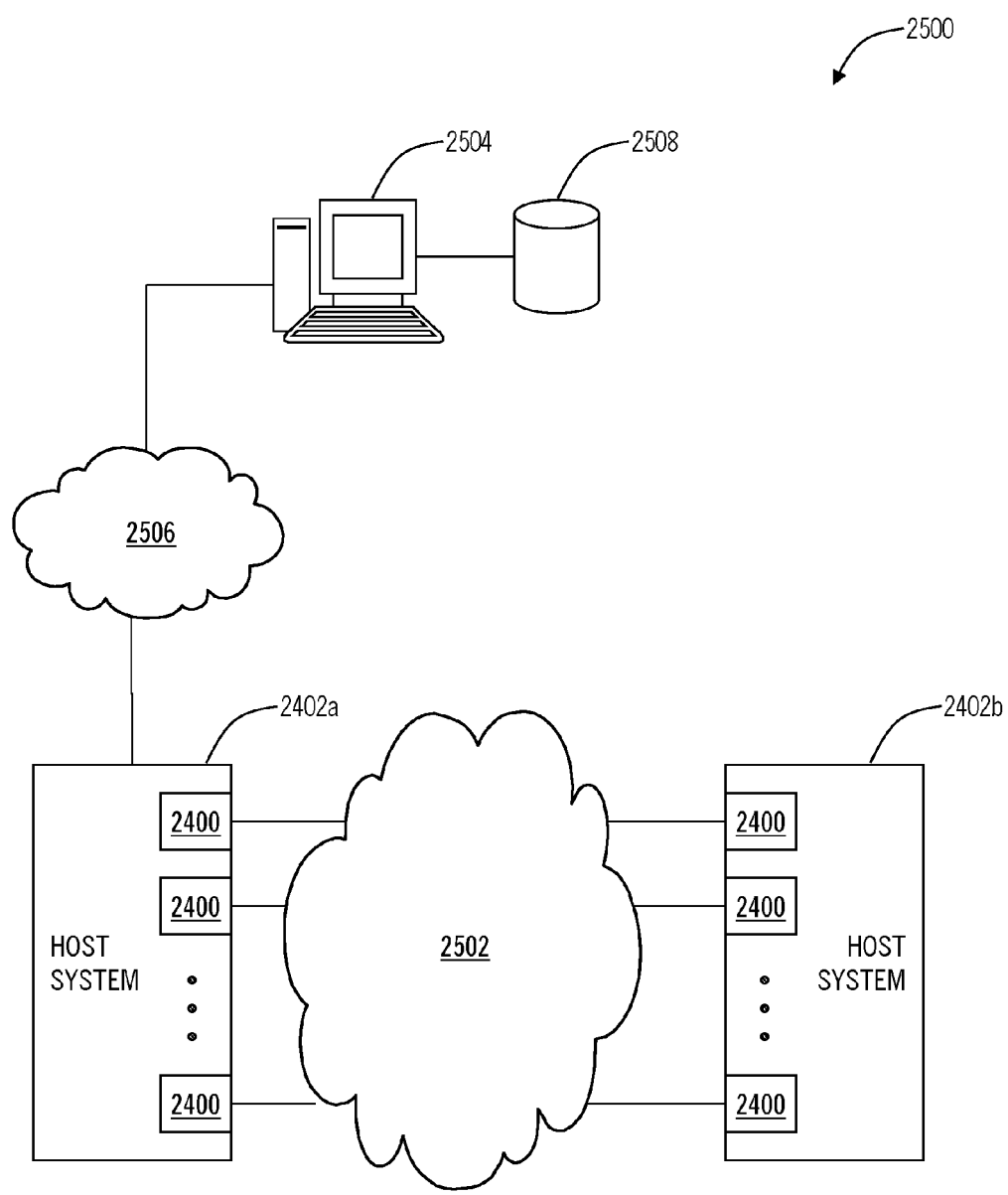
FIG. 25 is a network diagram with two host systems including multiple optical transceivers.

Referring to FIG. 25, a network 2500 is illustrated with two host systems 2402a, 2402b including multiple optical transceivers 2400 according to an exemplary embodiment. Each host system 2402a, 2402b includes multiple optical transceivers 2400 connected to one another over an optical network 2502. For example, the optical network 2502 can include optical fibers, DWDM filters, amplifiers, regenerators, and the like. In this exemplary embodiment, the host system 2402a is configured through software to access the overhead, PMs, and alarms associated with each optical transceiver 2400. Local optical transceivers 2400 to the host system 2402a are accessed through an MDIO or I2C interface. The far end optical transceivers 2400 in the host system 2402b are accessed through far end monitoring mechanisms available in G.709. The host system 2402a is communicatively coupled to an element management system/network management system (EMS/NMS) 2504 through a data communications network (DCN) 2506.

The EMS/NMS 2504 is generally configured to control all OAM&P aspects of the host system 2402*a*, 2402*b*. The EMS/NMS 2504 operates on a server and may include a connection to a data store 2508 to store PM, alarm, and other related information associated with the host systems 2402*a*, 2402*b*. The EMS/NMS 2504 is configured to allow a network operator to access the overhead, PMs, and alarms on the optical transceivers 2400. For example, the EMS/NMS 2504 can include software modules to control all aspects of OAM&P associated with each optical transceiver 2400, and store PMs, alarms, etc. in the data store 2508. Effectively, the present disclosure provides a virtual transponder within each optical transceiver 2400 without requiring extra equipment, such as external transponders, or extra circuitry on the host system 2402 to provide framing, FEC, and OAM&P.

Additionally, the G.709 framing, FEC, and OAM&P can be user-provisionable allowing the optical transceiver 2400 to operate with or without these functions. For example, the optical transceiver 2400 can be set to provide framing and FEC, but not to provide OAM&P. This may be utilized in an application where neither host system 2402 is configured to communicate to the optical transceiver 2400 to retrieve the alarms and PMs. However, the optical transceivers 2400 can still operate providing additional link budget and performance through the framing and FEC. Alternatively, FEC can be disabled with just framing and OAM&P enabled.

The optical transceiver 2400 can provide various digital PM data including FEC-related, path-related, and section-related values. Additionally, the optical transceiver 2400 can provide far end values. In an exemplary embodiment, the optical transceiver 2400 can provide the following digital PM data based on the overhead and FEC processing of the G.709 encoder/decoder 2420 and the processor 2440. These PMs can be processed and store through the registers 2450.

| Size | Name | Description | Count Definition |
|---|---|---|---|
| 3 bytes | F-CE | FEC- Corrected Error Symbols | Increment for each FEC corrected symbol (Symbol = 1 Byte) |
| 3 bytes | F-CE-FE | FEC- Corrected Error Symbols- Far End | Increment for each FEC corrected symbol (Symbol = 1 Byte) |
| 2 bytes | F-CER | FEC- Corrected Error Ratio | Listed as BER (e.g. $6 \times 10^{-7}$) |
| 2 bytes | F-CER-FE | FEC- Corrected Error Ratio- Far End | Listed as BER (e.g. $6 \times 10^{-7}$) |
| 2 bytes | P-BIP | Path- BIP Error Count (Selectable as Block or individual count) | Increment per BIP error or errored frame received |
| 2 bytes | P-BBE | Path- Background Block Error | Increment 1 per second in which BIP error is seen |
| 2 bytes | P-ES | Path- Errored Seconds | Increment 1 per second in which any of the frames are errored |
| 2 bytes | P-SES | Path- Severely Errored Seconds | Increment 1 per second in which 15% of the frames are errored |
| 2 bytes | P-UAS | Path- Unavailable Seconds | Increment 1 per second in which the frame is defined as unavailable (loss of sync or 10 consecutive seconds of SES) |
| 2 bytes | P-BIP-FE[1] | Path- BIP Error Count- Far End (Selectable as Block or individual count) | Increment per BIP error or errored frame received |
| 2 bytes | P-BBE-FE[1] | Path- Background Block Error- Far End | Increment 1 per second in which BIP error is seen |
| 2 bytes | P-SES-FE[1] | Path- Severely Errored Seconds- Far End | Increment 1 per second in which 15% of the frames are errored |
| 2 bytes | P-UAS-FE[1] | Path- Unavailable Second- Far End | Increment 1 per second in which the frame is defined as unavailable (loss of sync or 10 consecutive seconds of SES) |
| 2 bytes | S-BIP | Section- BIP Error Count (Selectable as Block or individual count) | Increment per BIP error or errored frame received |
| 2 bytes | S-BBE | Section- Background Block Error | Increment 1 per second in which BIP error is seen |
| 2 bytes | S-ES | Section- Errored Seconds | Increment 1 per second in which any of the frames are errored |
| 2 bytes | S-SES | Section- Severely Errored Seconds | Increment 1 per second in which 15% of the frames are errored |
| 2 bytes | S-UAS | Section- Unavailable Seconds | Increment 1 per second in which the frame is defined as unavailable (loss of sync or 10 consecutive seconds of SES) |
| 2 bytes | S-BIP-FE[1] | Section- BIP Error Count- Far End (Selectable as Block or individual count) | Increment per BIP error or errored frame received |
| 2 bytes | S-BBE-FE[1] | Section- Background Block Error- Far End | Increment 1 per second in which BIP error is seen |
| 2 bytes | S-SES-FE[1] | Section- Severely Errored Seconds- Far End | Increment 1 per second in which 15% of the frames are errored |

-continued

| Size | Name | Description | Count Definition |
|---|---|---|---|
| 2 bytes | S-UAS-FE[1] | Section- Unavailable Second- Far End | Increment 1 per second in which the frame is defined as unavailable (loss of sync or 10 consecutive seconds of SES) |

[1] All far end PMs are inferred through the Backward Error Indicator (BEI) counter in the SM and PM overhead bytes. UAS is identified through the BEI and Remote Defect Indicator (RDI) conditions.

The optical transceiver 2400 can support all available alarms in G.709. In an exemplary embodiment, the optical transceiver 2400 is configured to support the following alarms. These can be available from the MDIO/I2C interface 2460. For example in XENPAK, the alarms can be used to trigger the link alarm status interrupt (LASI) with masking capability.

| Alarms | Description |
|---|---|
| LOS | Loss of Signal |
| LOF | Loss of Frame |
| LOM | Loss of Multiframe |
| S-AIS | Section-Alarm Indication Signal |
| S-BDI | Section-Backward Defect Indicator |
| P-AIS | Path-Alarm Indication Signal |
| Tk-AIS | TCM(k)- Alarm Indication Signal |
| P-OCI | Path-Open Connection indicator |
| Tk-OCI | TCM(k)-Open Connection indicator |
| P-LCK | Path-Locked |
| Tk-LCK | TCM(k)-Locked |
| P-BDI | Path-Backward Error indicator. |
| Tk-BDI | TCM(k)-Backward Error indicator. |
| P-PTM | Path-Payload Type Mismatch |
| Tk-PTM | TCM(k)-Payload Type Mismatch |
| S-TTIM | Section-Trail Trace Identifier Mismatch |
| P-TTIM | Path-Trail Trace Identifier Mismatch |
| Tk-TTIM | TCM(k)-Trail Trace Identifier Mismatch |

The optical transceiver 2400 can provide proactive warnings to network operators based on the integrated FEC within the module. Advantageously, this provides carrier-grade performance within the confines of existing MSA specifications. In an exemplary embodiment, the optical transceiver 2400 is configured to provide degraded or excessive bit error performance alarms, such as:

| Alarms | Description |
|---|---|
| S-EXC | Section- Excessive Errors Present |
| S-DEG | Section- Degraded Performance |
| P-DEG | Path- Degraded Performance |

The optical transceiver 2400 can support the reporting of alarms when performance monitoring threshold counters are passed. Additionally, these thresholds can be user-definable on the optical transceiver 2400. These Threshold Crossing Alarms (TCAs) are listed in the table below.

| Alarms | Description |
|---|---|
| S-TH-BBE | Section- Threshold- Background Block Error Threshold |
| S-TH-ES | Section- Threshold- Errored Seconds |
| S-TH-SES | Section- Threshold- Severely Errored Seconds |
| S-TH-UAS | Section- Threshold- Unavailable Seconds |
| S-TH-BBE-FE | Section- Threshold- Background Block Error Threshold- Far End |
| S-TH-SES-FE | Section- Threshold- Severely Errored Seconds- Far End |
| S-TH-UAS-FE | Section- Threshold- Unavailable Seconds- Far End |
| P-TH-BBE | Path- Threshold- Background Block Error Threshold |
| P-TH-ES | Path- Threshold- Errored Seconds |
| P-TH-SES | Path- Threshold- Severely Errored Seconds |
| P-TH-UAS | Path- Threshold- Unavailable Seconds |
| P-TH-BBE-FE | Path- Threshold- Background Block Error Threshold- Far End |
| P-TH-SES-FE | Path- Threshold- Severely Errored Seconds- Far End |
| P-TH-UAS-FE | Path- Threshold- Unavailable Seconds- Far End |
| Tk-TH-BBE | TCM(k)- Threshold- Background Block Error Threshold |
| Tk-TH-ES | TCM(k)- Threshold- Errored Seconds |
| Tk-TH-SES | TCM(k)- Threshold- Severely Errored Seconds |
| Tk-TH-UAS | TCM(k)- Threshold- Unavailable Seconds |
| Tk-TH-BBE-FE | TCM(k)- Threshold- Background Block Error Threshold- Far End |
| Tk-TH-SES-FE | TCM(k)- Threshold- Severely Errored Seconds- Far End |
| Tk-TH-UAS-FE | TCM(k)- Threshold- Unavailable Seconds- Far End |

Figure 26:
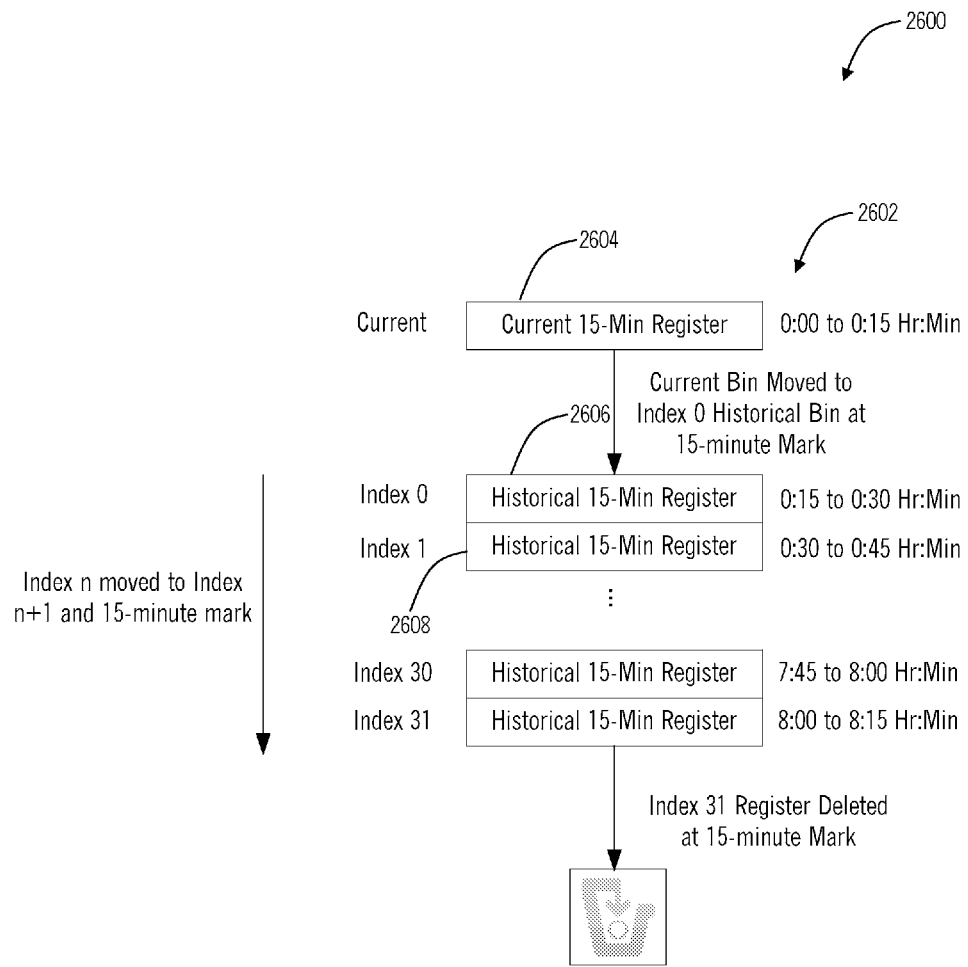
FIG. 26 is a diagram of a real-time and historical PM mechanism to provide current and historical PM values in the optical transceiver of FIG. 24.

Referring to FIG. 26, a real-time and historical PM mechanism 2600 is illustrated to provide current and historical PM values in the optical transceiver 2400 according to an exemplary embodiment. The present disclosure provides carrier-grade transmission performance and OAM to otherwise Datacom-managed networks. An important part of carrier-grade networks is the ability to retrieve PM parameters in real-time and in historical views. Accordingly, the present disclosure supports carrier grade PM current and historical views with the use of 15-minute binned counters 2602. For example, the 15-minute binned counters 2602 can be included in the registers 2450 in FIG. 24. 15-minute binning of PM data is commonly used in carrier-grade equipment and Element Management Systems (EMS) to allow a clear record of historical performance to verify Service Level Agreements (SLAs) or to troubleshoot signal degradation or failure after the event has occurred and passed. The present disclosure integrates this functionality within an MSA-compliant optical transceiver in a manner that preserves the MSA specifications while adding this additional functionality.

The real-time and historical PM mechanism 2600 includes multiple registers 2602 for each PM value that is stored in real-time and historically. In an exemplary embodiment, the real-time and historical PM mechanism 2600 includes 32 registers 2602 for each PM value, and the real-time and historical PM mechanism 2600 is performed for the following PM values:

| Section | Path |
| --- | --- |
| S-BBE(-FE) | P-BBE(-FE) |
| S-ES(-FE) | P-ES(-FE) |
| S-SES(-FE) | P-SES(-FE) |
| S-UAS(-FE) | P-UAS(-FE) |

The real-time and historical PM mechanism 2600 utilizes an on-board timer on the optical transceiver 2400. The on-board timer can be synchronized to a clock on the host system 2402. The on-board timer, which is set to expire in 15-minutes by default, autonomously transfers all current 15-minute binned PM values from a current 15-minute register 2604 to a historical 15-minute binned register 2606. Additionally, the PM value in the historical 15-minute binned register 2606 is transferred to a historical 15-minute binned register 2608 representing the next 15 minutes. This process is repeated for all of the historical 15-minute binned registers with the values in the last historical 15-minute binned register deleted. Each current and historical binned register 2602 is retrievable by the MDIO/I2C interface 2460 and the processor 2440. Additionally, the 15-minute current register 2604 may be cleared and reset under MDIO control.

Optionally, a user can select to disable the 15-minute binned PM registers 2602 and allow the registers 2602 to count to their maximum memory space until the register is read and cleared by the MDIO/I2C interface 2460. Additionally, the 15-minute binned PM registers 2602 can be read and/or cleared from a far end through the processor 2440. Validity flags are kept for each binned register 2602. If the signal is lost or the host resets the 15-minute PM bins, the validity flag will change to false. A host management system in the host system 2402 can retrieve the 15-minute binned values and store them in a larger array for long term performance management history.

Figure 27:
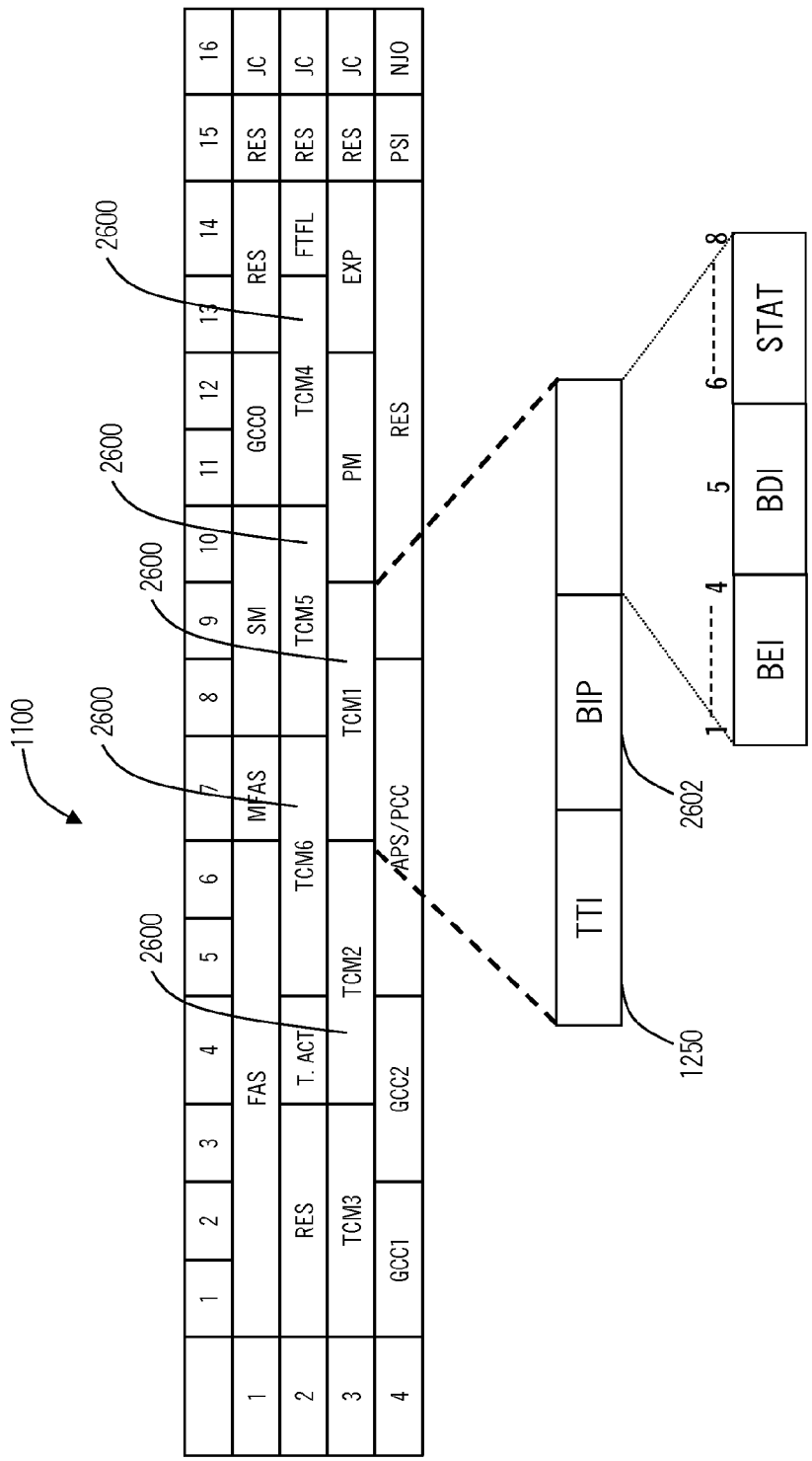
FIG. 27 is a diagram of G.709 overhead illustrating the support of all six of the Tandem Connection Monitoring (TCM) overhead bytes.

Referring to FIG. 27, the optical transceiver 2400 supports all six of the Tandem Connection Monitoring (TCM) overhead 2600 in the G.709 overhead 1100 according to an exemplary embodiment. Each TCM overhead 2600 includes the TTI 1250, Bit Interleaved Parity-8 (BIP-8) 2602, a Backward Error Indicator (BEI) 2604, a Backward Defect Indicator (BDI) 2606, and a Status 2608. BIP-8 2602 provides an indication of link health for the TCM 2600 through an error count. BEI 2604 provides the number of bit errors detected at the other end of the TCM overhead 2600 connection. BDI 2606 provides an indication that the other end of the TCM overhead 2600 connection has detected an error, and Status 2608 provides status bits indicating availability of this TCM overhead connection 2600 as well as alarm indications. The availability of TCM overhead in the optical transceiver 2400 allows network operators to monitor end-to-end service through G.709 mechanisms even where multiple networks are involved. For example, this enables an operator to utilize the optical transceiver 2400 in a CPE device and allows end users visibility of a limited path. Also, it allows the operator full end-to-end network visibility. Within the Path overhead, G.709 specifies the option of user defined layer definitions identified as Tandem Connection Monitoring (TCM) layers. The intent of TCMs allows the user to define the beginning and end location of their custom Och layer. OTN XENPAK allows the definition of two such separate TCMs for use of custom layer monitoring. These TCMs are defined as TCM1 and TCM2 in the OTN Xenpak specification. Each TCM contains independent alarming, performance monitoring and maintenance signaling.

Figure 28:
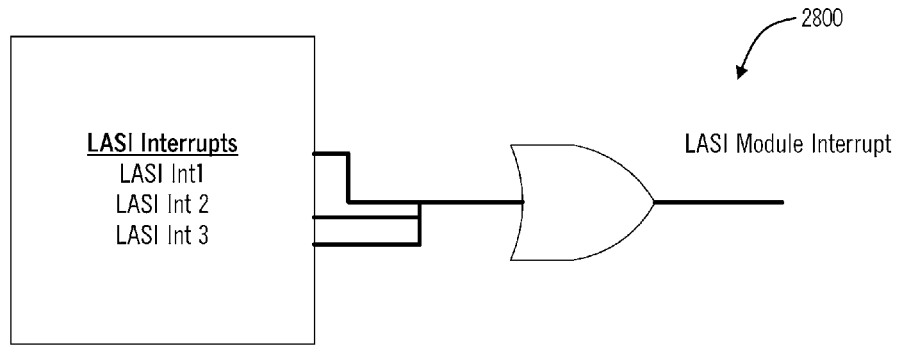
FIGS. 28-31 are logic diagrams illustrating a mechanism for triggering the link alarm status interrupt (LASI) in the XENPAK MSA.
Figure 29:
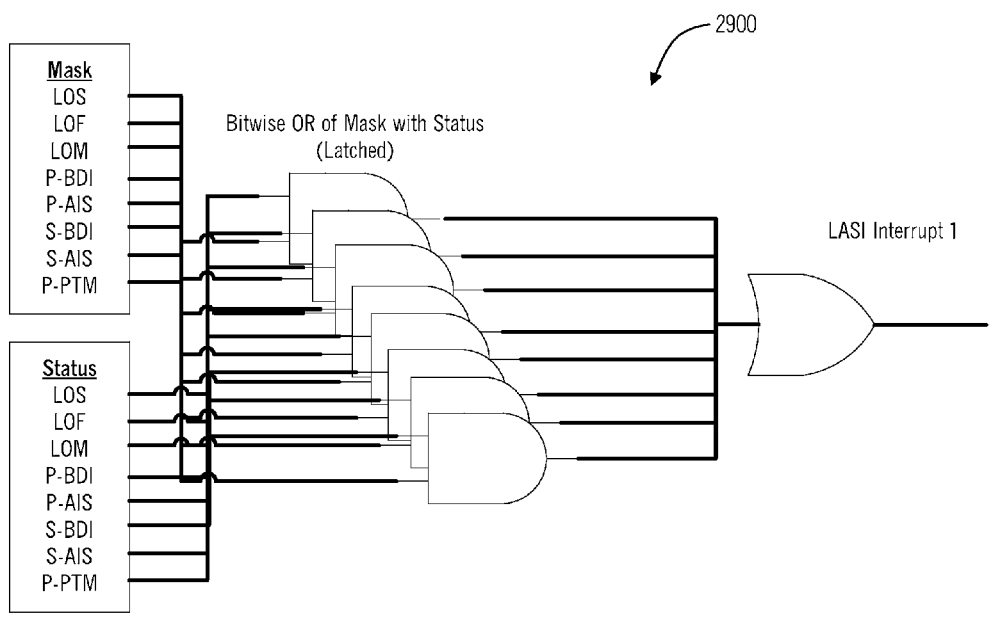
Figure 30:
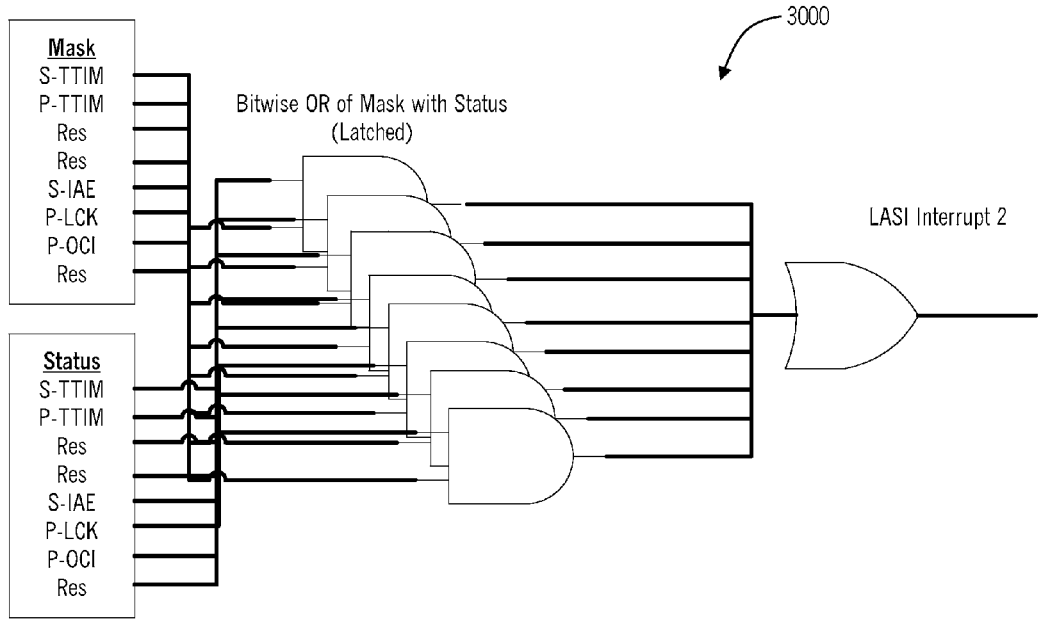
Figure 31:
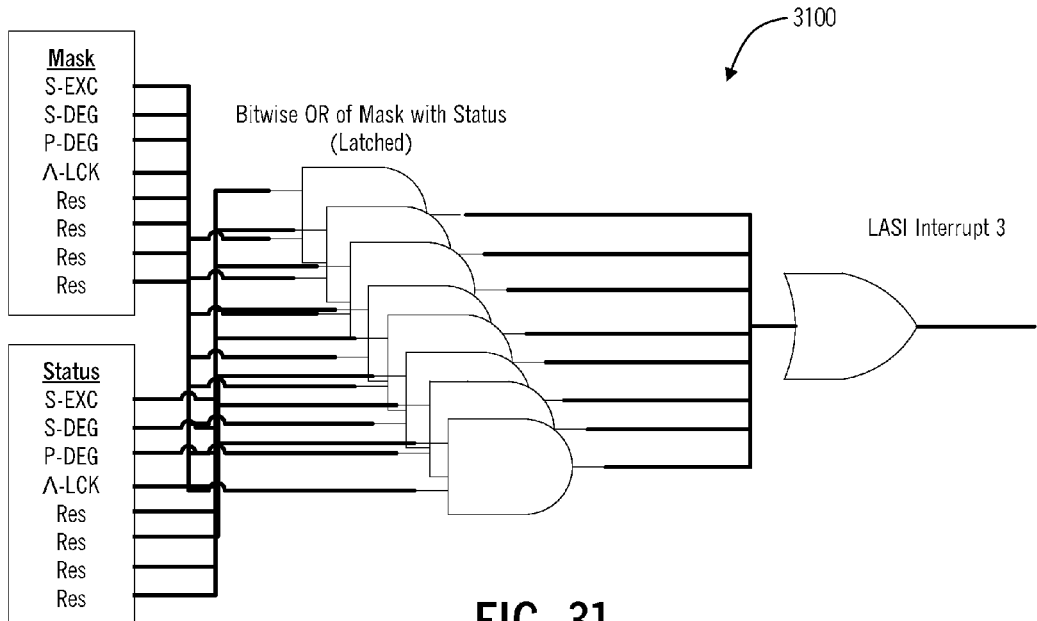

Referring to FIGS. 28-31, the present disclosure can be utilized to provide alarming with the link alarm status interrupt (LASI) in the XENPAK MSA according to an exemplary embodiment. The addition of G.709 and FEC into a XENPAK-compliant MSA transceiver requires an additional field in the LASI interrupt capabilities and status register. The XENPAK LASI is the general interrupt defined by the XENPAK MSA group to alert the host of actions required during a failure scenario in the XENPAK module. If the optical transceiver 2400 alarming is enabled, the XENPAK LASI is exerted and reflected in the 31.0010h.7 bit. When the LASI is triggered, the host must read XENPAK MSA MDIO register 1.9005 and 31.0010h.7 to verify where the error occurred. FIG. 28 illustrates an exemplary logic diagram 2800 for triggering the LASI module interrupt. Here, the LASI module interrupt is triggered responsive to a logical OR of three interrupts, LASI Intl 1, 2, and 3. FIGS. 29-32 illustrate exemplary logic diagrams 2900, 3000, 3100 for the three interrupts, LASI Intl 1, 2, and 3. Each of the three interrupts, LASI Intl 1, 2, and 3 is formed through a bitwise OR of a mask with a status AND.

The following parameters are supported in the 1.9005 register: The 30.0010h bit 7 shows if the LASI was triggered for optical layer faults. In general, most optical layer faults will also trigger downstream faults in the other devices. When the alarm is seen as active from the optical layer function, the MDIO registers in MMD 30 Status 4, 5 and 6 can be monitored for alarmed conditions. The LASI interrupt above is triggered by an optical layer block fault detection. Each fault may be used to trigger the LASI interrupt. Each register fault bit may be masked by the user to avoid LASI interrupt assertion if such an alarm is not supported by the host. The optical layer LASI interrupt is divided into several layers, each of which is graphically in FIGS. 28-31. The highest layer, shown in FIG. 28 feeds directly into the LASI interrupt and is shown in register 30.0010h bit 7.

Figure 32:
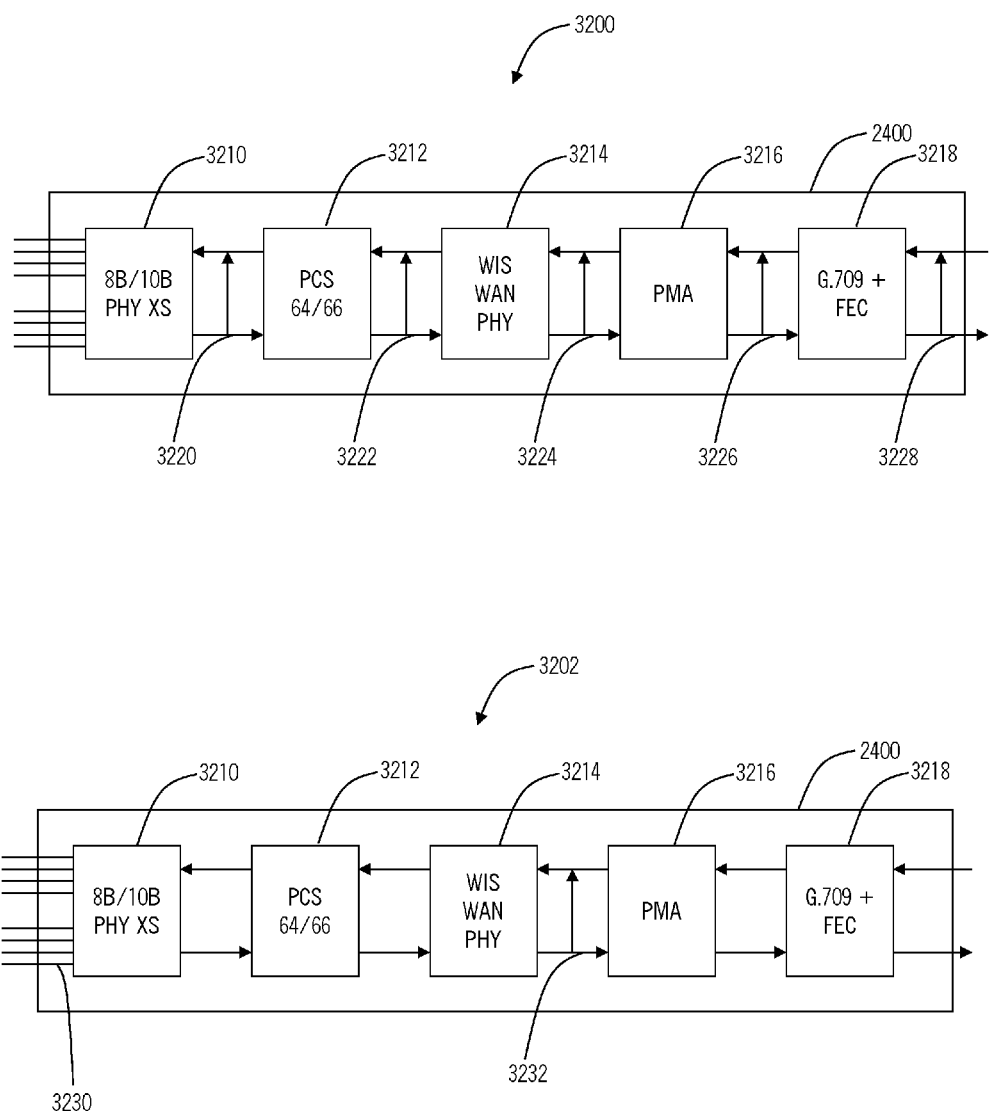
FIG. 32 is a block diagram illustrating both system and network loopbacks in the optical transceiver of FIG. 24.

Referring to FIG. 32, the optical transceiver 2400 supports both system and network loopbacks 3200, 3202. System loopbacks 3200 are designed to loopback the system towards the host after processing by various parts of the optical transceiver 2400. The network loopback 3202 loops the traffic towards the OTN network after processing. Many loopbacks support a data override mode, in which the traffic in loopback mode is also passed through the non-loopback path as normal. All loopbacks 3200, 3202 are supported via the MDIO/I2C interface 2460 interface. In the exemplary embodiment of FIG. 32, the optical transceiver 2400 is illustrated as a XENPAK-compliant module. The loopbacks 3200, 3202 are also contemplated in other MSA-compliant modules as described herein. The XENPAK-compliant module includes an 8B/10B PHY XS section 3210, a PCS 64/66 section 3212, a WIS WAN PHY section 3214, a Physical Media Attachment (PMA) section 3216, and a G.709+FEC section 3218. The system loopbacks 3200 can include a PHY XS system loopback 3220, a PCS system loopback 3222, a WIS system loopback 3224, a PMA system loopback 3326, and a G.709+FEC system loopback 3228. The network loopbacks 3202 can include a PHY XS network loopback 3230 and a PMA network loopback 3232.

Figure 33:
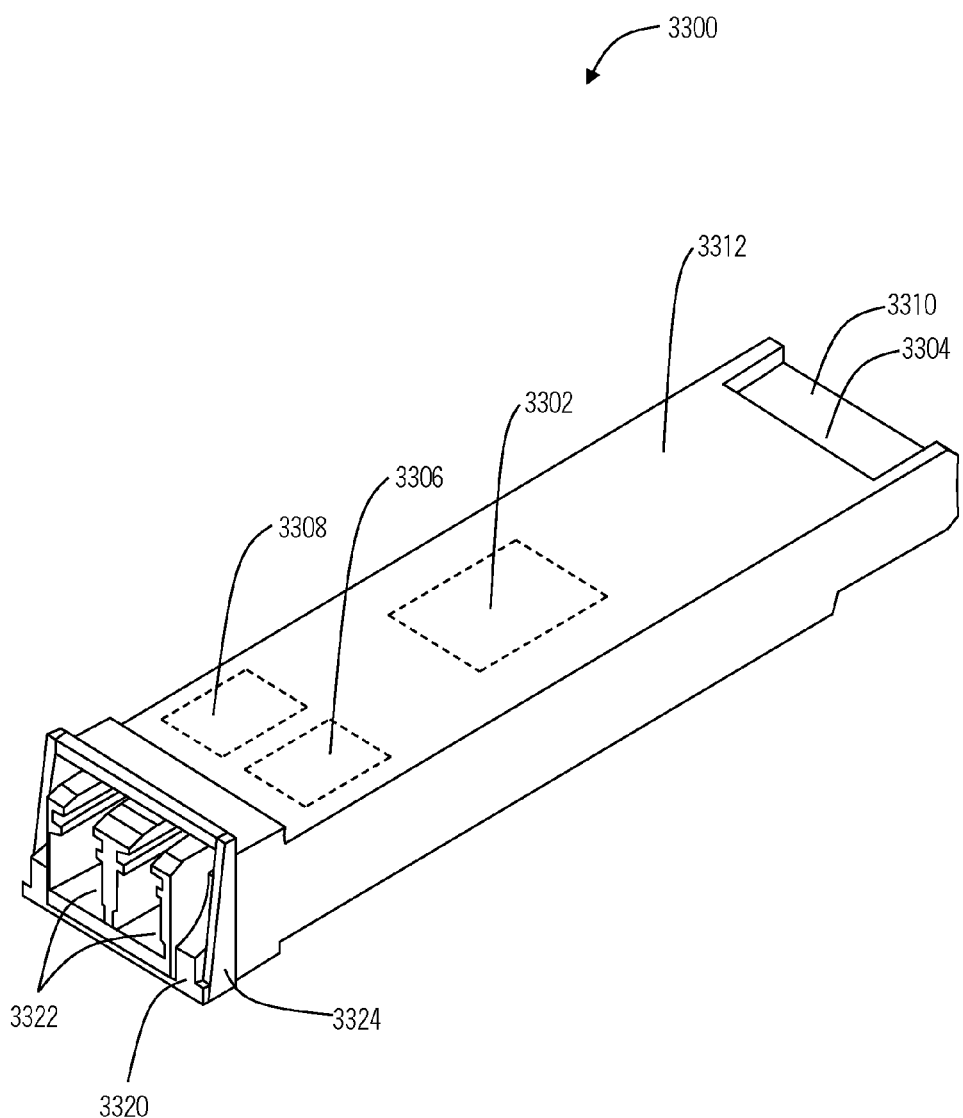
FIG. 33 is a perspective view of the optical transceiver of FIG. 24.

Referring to FIG. 33, a perspective view of the optical transceiver 2400 is illustrated according to an exemplary embodiment. The optical transceiver 2400 includes integrated circuitry 3302 mounted therein to a printed circuit board 3304 that incorporates embodiments of the disclosure. As discussed previously, the integrated circuitry 3302 may be one or more application specific integrated circuits (ASICs) to support both the electronics of the Tx/Rx 2430. The integrated circuitry 3302 can be configured to provide the functionality described herein with regard to the present disclosure. The optical transceiver 2400 further includes a light transmitter 3306 (i.e., an EO converter) and a light receiver 3308 (i.e., an OE converter). The optical transceiver 2400 can be compatible with CFP and variants thereof (e.g., CFP2, CFP4, CXP), CDFP and variants thereof (e.g., CDFP2, CDFP4, etc.), MSA-100GLH, CCRx, QSFP and variants thereof (e.g., future QSFP+, QSFP2), 10×10, XFP, 300-pin, XPAK, X2, XENPAK MSAs, and other proprietary or standard packages.

The printed circuit board 3304 includes top and bottom pads (top pads illustrated) to form an edge connection 3310 to couple to a socket of a host device 2402. A housing 3312 couples around the printed circuit board 3304 to protect and shield the integrated circuitry 3302 and other components in the transceiver 2400. Note, the housing 3312 is typically defined in the MSA. A front fiber optic plug receptacle 3320 is provided with openings 3322 to interface with one or more fiber optic cables and their plugs. A mechanical latch/release mechanism 3324 can be provided as part of the optical transceiver 2400. While the optical transceiver 2400 has been described has having both light transmission and light reception capability, it may be a fiber optic transmitter module with light transmission only or a fiber optic receiver module with light reception only.

Figure 34:
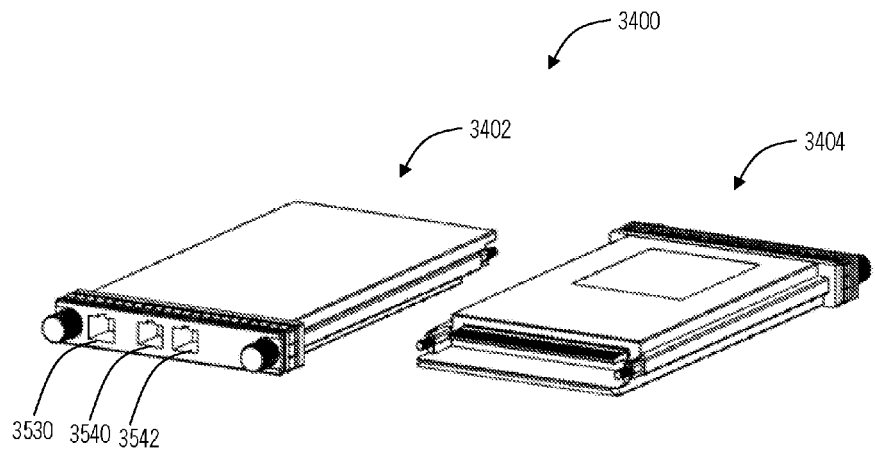
FIG. 34 is a perspective view a CFP module.

Referring to FIG. 34, in an exemplary embodiment, a perspective diagram illustrates a CFP module 3400 in a front view 3402 and a rear view 3404. The present disclosure can incorporate the integrated functionality described herein in 40 Gb/s and 100 Gb/s optical transceivers such as CFP and variants thereof (e.g., CFP2, CFP4, CXP), CDFP and variants thereof (e.g., CDFP2, CDFP4, etc.), MSA-100GLH, CCRx, QSFP and variants thereof (e.g., QSFP+, QSFP2), 10×10, and the like. The CFP module 3400 is compliant to the CFP MSA Rev. 1.4 (June 2010) (available at www.cfp-msa.org and incorporated by reference herein). The CFP MSA defines a hot-pluggable optical transceiver form factor to enable 40 Gb/s and 100 Gb/s applications, including next-generation High Speed Ethernet (40 GbE and 100 GbE). The electrical interface may include a nominal signaling lane rate is 10 Gbit/s per lane with various electrical interface specifications such as CAUL, XLAUI, OTL4.10, OTL3.4, and STL256.4. Other variants of CFP may include CFP2 which uses a signaling lane rate of 25 Gbit/s per lane or CFP4 which uses a signaling lane of 100G. For example, the CFP MSA has an electrical interface of 4×10G (XLAUI) or 10×10G (CAUI), the CFP2 MSA has an electrical interface of 4×25G (CAUI2 or CPPI2). Another variant of CFP may include CDFP which uses a signaling lane rate of 25 Gbit/s per lane and has an electrical interface of 16×25G providing 400G. The CXP MSA was created to satisfy the high-density requirements of the data center, targeting parallel interconnections for 12×QDR InfiniBand (120 Gbps), 100 GbE, and proprietary links between systems collocated in the same facility. The InfiniBand Trade Association (www.infinibandta.org) is currently standardizing the CXP. The CXP is 45 mm in length and 27 mm in width, making it slightly larger than an XFP. It includes 12 transmit and 12 receive channels in its compact package.

The OIF MSA-100GLH Multisource Agreement (IA) provides a 100G Long-Haul DWDM Transmission Module—Electromechanical (MSA-100GLH) for optical line interface applications. The OIF MSA-100GLH (available at www.oiforum.com/public/documents/OIF-MSA-100GLH-EM-01.0.pdf) specifically addresses 100G Polarization Multiplexed Quadrature Phase Shift Keying (PM-QPSK) long-haul DWDM, but the MSA strives to remain modulation format and data rate agnostic whenever practical to maximize applicability to future market requirements. The interface IC(s) and module electrical interface are generically specified to allow vendor specific customization of multilane "M-lane"~11 Gbit/s interfaces. Module electrical interfaces include but are not limited to the following: a) Simple bit multiplex; b) OTL4.10 [I2]; c) SFI-S [I3]; and d) OTL3.4 [I2] (for 40G applications). The QSFP MSA and variants (QSFP+, QSFP2, etc.) defines electrical interfaces, management interfaces, optical interfaces, mechanical specifications and the like for a multimode laser providing 40G and 100G clients. Specifically, QSFP provides four electrical interfaces at 10G (XLPPI) and four optical interfaces at 10G. QSFP2 provides 100G via four 25G interfaces. The MSA for QSFP may be accessed at ftp.seagate.com/sff/INF-8438.PDF.

The 10×10 MSA provides a low cost 100 GbE solution over single mode fiber using 10×10G, i.e. ten 10G signals in parallel. Specifically, the 10×10 MSA is available at www.10x10msa.org/. The 10×10 MSA is compliant with IEEE 802.3ba CAUI, MLD, MAC structure, and the CFP MSA. Of note, the 10×10 MSA utilizes the same form factor as CFP for electrical, mechanical, and firmware interfaces. Those of ordinary skill in the art will recognize that CFP and variants thereof (e.g., CFP2, CFP4, CDFP, CXP), MSA-100GLH, CCRx, QSFP and variants thereof (e.g., QSFP+, QSFP2), 10×10, etc. are presented as exemplary embodiments, and the present disclosure contemplates use of integrated framing, FEC, PMs, OAM&P, alarming, etc. with any particular MSA agreement including newly defined agreements.

Figure 35:
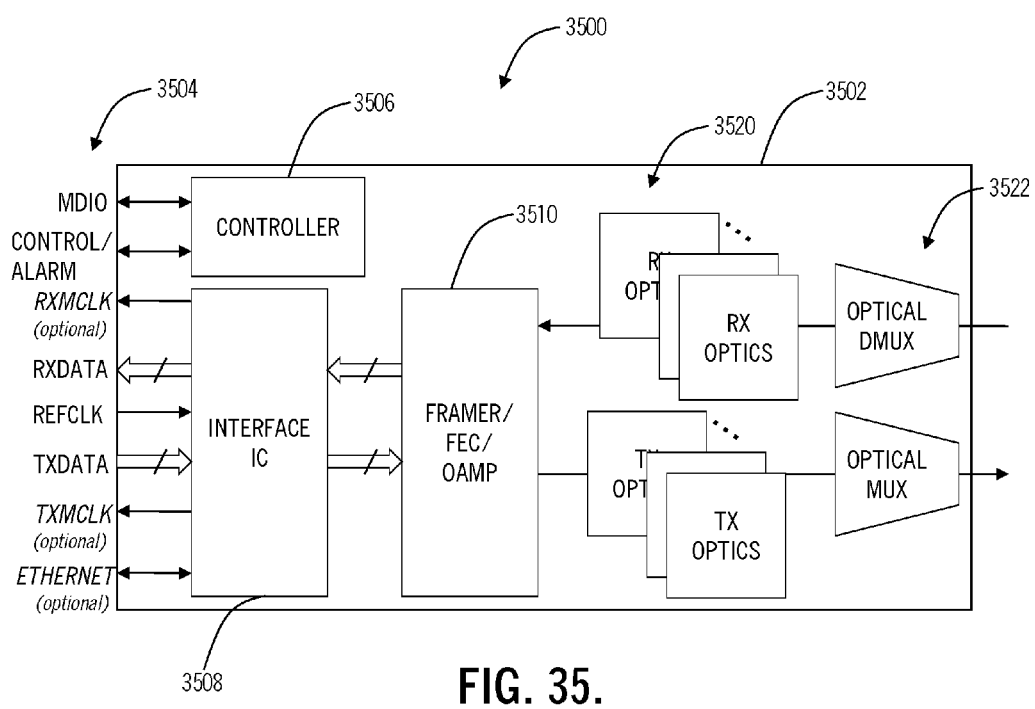
FIG. 35 is a block diagram of a CFP module with integrated framing, FEC, PMs, OAM&P, alarming, etc. while preserving the CFP MSA specifications.

Referring to FIG. 35, in an exemplary embodiment, a block diagram illustrates a CFP module 3500 with integrated framing, FEC, PMs, OAM&P, alarming, etc. while preserving the CFP MSA specifications. As described herein, the CFP module 3500 is configured to interoperate with any standard CFP host system without requiring hardware and/or software modification of the CFP host system. Optionally, the CFP host system may include software modifications to communicate OAM&P, PM, etc. data on/off the CFP module 3500 using standardized CFP communications techniques. The CFP module 3500 and the CFP host system are hot-pluggable. In particular, the CFP module 3500 includes a physical housing 3502 that is illustrated in FIG. 34. The CFP module 3500 includes a plurality of interfaces 3504 that interconnect with the CFP host system. For example, the plurality of interfaces 3504 may include an MDIO, a control/alarm interface, an optional receive monitor clock (RXM-CLK), receive data (RXDATA), a reference clock (REF-CLK), transmit data (TXDATA), an optional transmit monitor clock (TXMCLK), and an optional communications interface. The optional communications interface may directly provide OAM&P, PM, etc. data from the CFP module 3500, and the optional communications interface may include I2C, Serial Peripheral Interface (SPI), RS-232, Ethernet, Ethernet over Universal Serial Bus (USB), Proprietary USB, and the like.

The CFP module 3500 includes a controller 3506, an interface integrated circuit 3508, a framer/FEC/OAM&P circuit 3510, optical interfaces 3520, and optical demulitplexer/multiplexer 2522. It should be appreciated that the block diagram of FIG. 35 is an oversimplified illustration of the CFP module 3500 and a practical embodiment may include other components which are not illustrated. The controller 3506, the interface integrated circuit 3508, and the framer/FEC/OAM&P circuit 3510 generally include electrical circuits, such as, ASICs, FPGAs, microprocessors, digital signal processors, or other types of logic processing devices configured to operate on digital electrical signals. The controller 3506 is generally configured to operate the functionality of the CFP module 3500 and to interface MDIO, control, and alarming data to the CFP host system. The interface integrated circuit 3508 is configured to provide the various interfaces to/from the CFP host system. The framer/FEC/OAM&P circuit 3510 is configured to provide framing, FEC, and OAM&P on a client signal within the CFP module 3500 while concurrently preserving the MSA specifications such that the CFP module 3500 can operate in any CFP compliant host system. In an exemplary embodiment, the controller 3506, the interface integrated circuit 3508, and the framer/FEC/OAM&P circuit 3510 may be integrated in a single circuit. In another exemplary embodiment, the interface integrated circuit 3508 and the framer/FEC/OAM&P circuit 3510 may be integrated in a single circuit. In yet another exemplary embodiment, the various circuits 3506, 3508, 3510 may be realized in separate circuits with interconnects therebetween.

As described herein, the CFP module 3500 includes the framer/FEC/OAM&P circuit 3510 integrated within the CFP module 3500 for providing integrated framing, FEC, OAM&P, etc. within a standard CFP MSA compliant device. That is, the CFP module 3500 may operate in any CFP compliant host device, and has the added functionality of integrated framing, FEC, OAM&P, etc. In an exemplary embodiment, the framer/FEC/OAM&P circuit 3510 is configured to frame each 10G in 4×10G or each 25G in 4×25G in an OTN-based wrapper with OAM&P overhead and FEC. In another exemplary embodiment, the framer/FEC/OAM&P circuit 3510 is configured to frame the 4×10G as a single 40G or the 4×25G as a single 100G in an OTN-based wrapper with OAM&P overhead and FEC. Generally, the framer/FEC/OAM&P circuit 3510 may operate in a similar fashion as described herein with other MSAs such as XFP, XPAK, XENPAK, X2, XFP-E, SFP, SFP+, and 300-pin.

In an exemplary embodiment, the interfaces 3504 may include a communications interface that is shown on the front of the CFP module 3400 in FIG. 34 as Ethernet port 3530 in addition to optical ports 3540, 3542. In the CFP MSA, the optical ports 3540, 3542 provide optical transmit and receive ports. The present disclosure may add the Ethernet port 3530 as a third port on the front of the CFP module 3500 for purposes of OAM&P, PMs, etc. That is, the controller 3506 may include an Ethernet switch which provides notification of alarming, PM, OAM&P, etc. data to/from the CFP module 3500. The Ethernet port 3530 allows a full complement of OTN overhead data to be pulled off the CFP module 3500 such as opposed to the reduced OTN overhead described in FIG. 11. Also, the Ethernet port 3530 may be connected in a daisy chain fashion to other Ethernet ports 3530 on other CFP modules 3500 with one of the daisy chained Ethernet port 3530 connected to a network management system. The Ethernet port 3530 is presented for illustration purposes, and this may alternatively be any of I2C, SPI, RS-232, Ethernet, Ethernet over USB, Proprietary USB, and the like. In another exemplary embodiment, the CFP module 3500 may utilize the standard MDIO interface in the interfaces 3504 to provide OAM&P data to/from the CFP module 3500. The CFP module utilizes MDIO IEEE 802.3 clause 45 for its management interface. The CFP MDIO implementation is defined in a separate document entitled, "CFP MSA Management Interface Specification".

Similarly as described herein, the CFP module 3500 may utilize undefined or optional registers to provide OAM&P data to the host system.

Additionally, the Ethernet port 3530 can be used with the various other MSAs described herein such as the various 40G and 100G MSA implementations. Of note, the present disclosure provides advanced functionality internal to the various transceivers while concurrently supporting backward compatibility with any host device compliant to the associated MSA standards. In an exemplary embodiment, the various transceivers can be used without providing OAM&P data related to the advanced functionality to the host device. For example, the use of the transceivers described herein may be to provide extra distance, margin, etc. and the OAM&P data developed within the transceiver for this extra functionality may not be provided to the host system. Here, the host system may not have software functionality to read this OAM&P data. An exemplary objective of the Ethernet port 3530 is to provide this OAM&P data in a manner that is transparent to the host system. Specifically, the host system in this exemplary embodiment requires no modification—it simply operates in accordance with the MSA specifications. Concurrently, the transceivers described herein provide additional functionality—OAM&P, framing, FEC, integrated amplification, etc.—and this associated OAM&P data can be obtained directly through the Ethernet port 3530 or equivalent. Further, the Ethernet port 3530 can ultimately communicate to a management system that manages the OAM&P of the transceiver along with other transceivers and integration into other software platforms and management systems.

Figure 36:
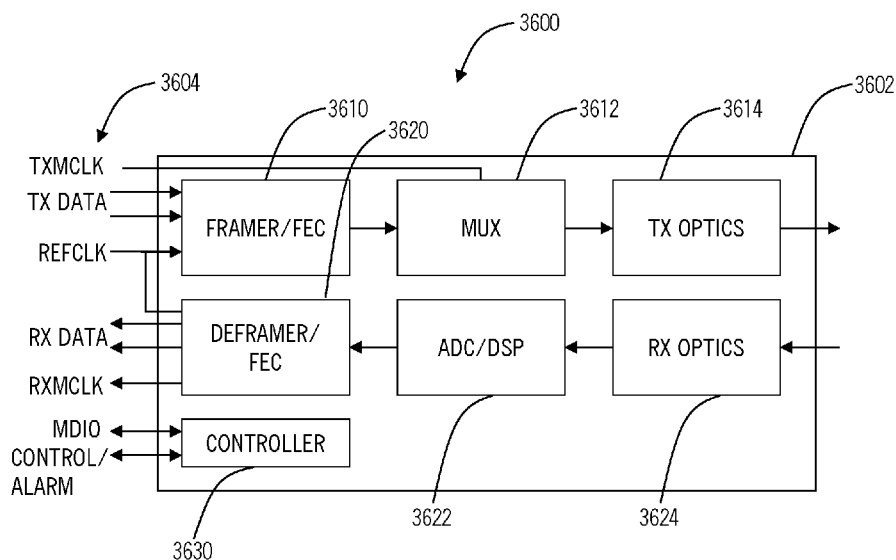
FIG. 36 is a block diagram of an OIF MSA-100GLH module with integrated framing, FEC, PMs, OAM&P, alarming, etc. while preserving the OIF MSA-100GLH MSA specifications.

Referring to FIG. 36, in an exemplary embodiment, a block diagram illustrates an OIF MSA-100GLH module 3600 with integrated framing, FEC, PMs, OAM&P, alarming, etc. while preserving the OIF MSA-100GLH MSA specifications. As described herein, the OIF MSA-100GLH module 3600 is configured to interoperate with any standard OIF MSA-100GLH host system without requiring hardware and/or software modification of the OIF MSA-100GLH host system. Optionally, the OIF MSA-100GLH host system may include software modifications to communicate OAM&P, PM, etc. data on/off the OIF MSA-100GLH module 3600 using standardized OIF MSA-100GLH communications techniques. The OIF MSA-100GLH module 3600 includes a physical housing 3602. The OIF MSA-100GLH module 3600 includes a plurality of interfaces 3604 that interconnect with the OIF MSA-100GLH host system. For example, the plurality of interfaces 3604 may include an MDIO, a control/alarm interface, a receive monitor clock (RXMCLK), receive data (RXDATA), a reference clock (REFCLK), transmit data (TXDATA), a transmit monitor clock (TXMCLK), and the like.

In the transmit direction, the OIF MSA-100GLH module 3600 includes a framer/FEC circuit 3610, a multiplexer 3612, and transmit optics 3614. In the receive direction, the OIF MSA-100GLH module 3600 includes a deframer/FEC circuit 3620, an ADC/DSP 3622, and receive optics 3624. Further, the OIF MSA-100GLH module 3600 includes a controller 3630 configured to monitor and control the OIF MSA-100GLH module 3600 as well as provide the MDIO connection to a host system. In an exemplary embodiment, the framer/FEC circuit 3610, the multiplexer 3612, the deframer/FEC circuit 3620, and the ADC/DSP 3622 are part of a single circuit, ASIC, etc. In another exemplary embodiment, the framer/FEC circuit 3610 and the deframer/FEC circuit 3620 are part of a single circuit, ASIC, etc. The framer/FEC circuit 3610 is configured to receive a client signal from the host system (TX DATA) and to encapsulate/frame the client signal in an OTN wrapper with FEC, OAM&P overhead, etc. The multiplexer 3612 is configured to deserialize an output of the framer/FEC circuit 3610 for the transmit optics 3614. In an exemplary embodiment, the transmit optics 3614 include native 40G or 100G line rates using polarization multiplexing, differential QPSK, and combinations thereof. The receive optics 3624 are configured to receive a line signal and provide the line signal to the ADC/DSP 3622 for conversion to multiple lanes at lower rates and for signal conditioning. The deframer/FEC circuit 3620 is configured to decapsulate/deframe the line signal and provide the client signal to the host system. Similar to the CFP module 3500, the OIF MSA-100GLH module 3600 utilizes MDIO IEEE 802.3 clause 45 for its management interface. The OIF MSA-100GLH module 3600 may utilize undefined or optional registers to provide OAM&P data to the host system via the MDIO. Also, the OIF MSA-100GLH module 3600 may include an Ethernet port similar to the Ethernet port 3530.

Figure 37:
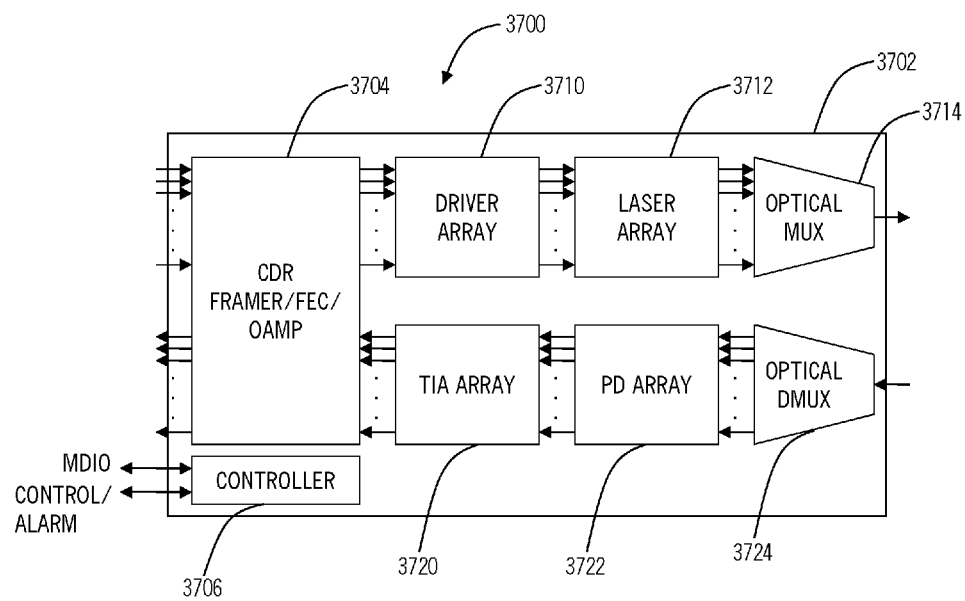
FIG. 37 is a block diagram of a 10×10 module with integrated framing, FEC, PMs, OAM&P, alarming, etc. while preserving the 10×10 MSA specifications.

Referring to FIG. 37, in an exemplary embodiment, a block diagram illustrates a 10×10 module 3700 with integrated framing, FEC, PMs, OAM&P, alarming, etc. while preserving the 10×10 and CFP MSA specifications. As described herein, the 10×10 module 3700 is configured to interoperate with any standard 10×10 MSA host system without requiring hardware and/or software modification of the 10×10 MSA host system. Optionally, the 10×10 MSA host system may include software modifications to communicate OAM&P, PM, etc. data on/off the 10×10 module 3700 using standardized 10×10/CFP MSA communications techniques. The 10×10 module 3700 includes a physical housing 3702. The 10×10 module 3700 also includes a CDR/framer/FEC/OAM&P circuit 3704 and a controller 3706 each of which interfaces to the 10×10 MSA host system. The circuit 3704 is configured to perform clock and data recovery and to generally interface to the host system with ten lanes of 10G. Additionally, the circuit 3704 is configured to provide framing, FEC, OAM&P, alarming, etc. within the 10×10 module 3700 while still maintaining compatibility with the 10×10 MSA and the CFP MSA. The 10×10 module 3700 further includes on the transmit side a driver array 3710, a laser array 3712, and an optical multiplexer 3714 which collectively drive ten wavelengths at 10G each and then combine them via the multiplexer 3714, On the receive side, the 10×10 module 3700 includes a transimpedance amplifier array 3720, a photodiode array 3722, and an optical demultiplexer 3724 which collectively receive a WDM signal of ten wavelengths at 10G each and demultiplex and convert to electrical for processing by the circuit 3704. Note, since the 10×10 MSA is also compliant with the CFP MSA, the 10×10 module 3700 may use similar mechanisms as described herein with respect to the CFP module 3500 for communicating to the host system or through the Ethernet port 3530.

FIGS. 34-37 illustrate exemplary embodiments using CFP, CDFP, OIF MSA-100GLH, and 10×10. Those of ordinary skill in the art will recognize the present disclosure contemplates adding framing, FEC, OAM&P, alarming, etc. into any current or future MSA including emerging 40G, 100G, 400G, 1T, etc. MSAs. That is, the present disclosure strives to integrate additional functionality into optical transceivers while maintaining compatibility with existing host systems, i.e. while preserving MSA specifications for mechanical characteristics, management interfaces, electrical characteristics, optical characteristics, thermal requirements, and the like.

Figure 38:
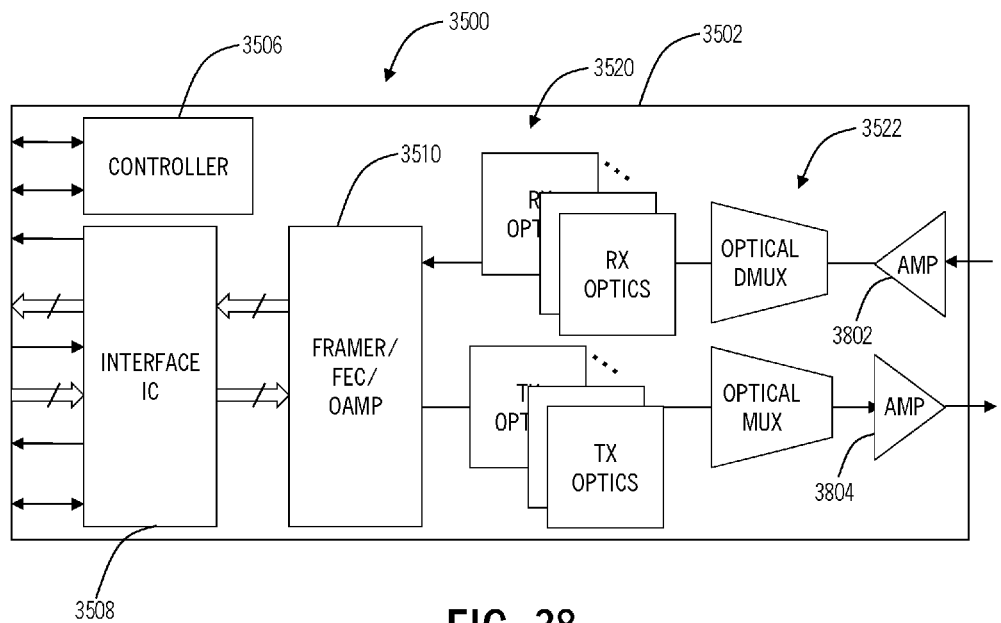
FIG. 38 is a block diagram of the CFP module of FIG. 35 with integrated amplifiers while preserving the CFP MSA specifications.
Figure 39:
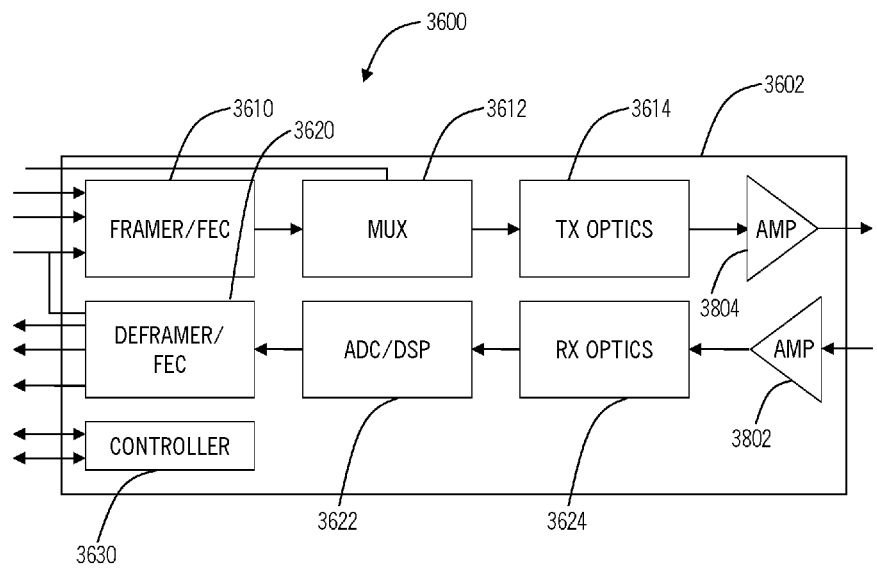
FIG. 39 is a block diagram of an OIF MSA-100GLH module of FIG. 36 with integrated amplifiers while preserving the OIF MSA-100GLH MSA specifications.
Figure 40:
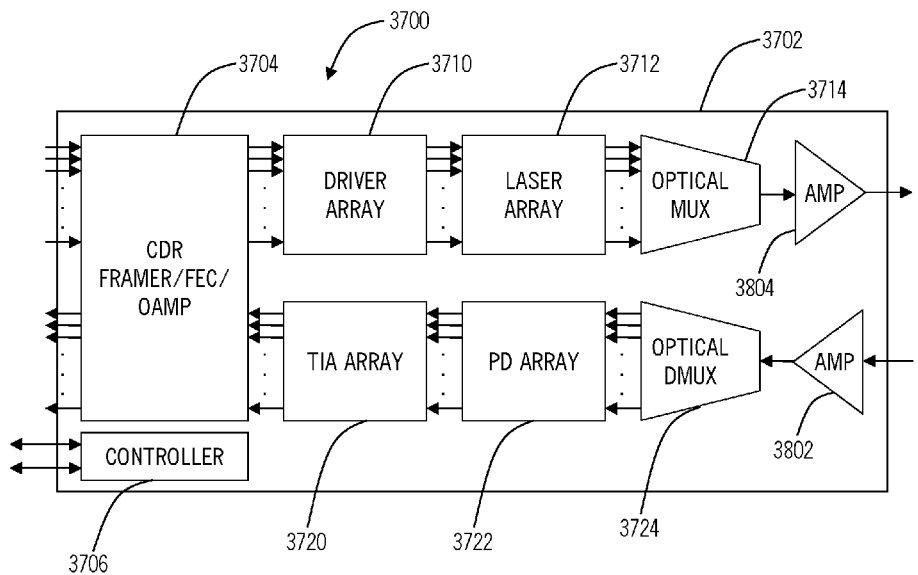
FIG. 40 is a block diagram of a 10×10 module of FIG. 37 with integrated amplifiers while preserving the 10×10 MSA specifications.

Referring to FIGS. 38-40, in exemplary embodiments, the CFP module 3500, the OIF MSA-100GLH module 3600, and the 10×10 module 3700 can include integrated amplifiers 3802, 3804. The amplifiers 3802, 3804 can be erbium doped fiber amplifiers (EDFAs), semiconductor optical amplifiers, etc. The amplifier 3802 is a pre amplifier connected before receiver optics and the amplifier 3804 is a post amplifier connected after transmitter optics. That is, the amplifier 3802 is configured to amplify received signals prior to receiver optical components and the amplifier 3804 is configured to amplify transmitted signals from transmitter optical components prior to outputting the signals. The various transceiver modules 3500, 3600, 3700 can also include additional components such as a switch in-line with the amplifiers 3802, 3804 thereby enabling the amplifiers 3802, 2804 to be removed and turned off when not required. For example, when enabled, the switch can be configured to provide optical signals to the amplifiers 3802, 3804, and when disabled, the switch can be configured to remove the amplifiers 3802, 3804 from the optical path. Note, the amplifiers 3802, 3804 can be individually controlled and enabled/disabled separately. In this manner, the amplifiers 3802, 3804 can provide significantly more performance than is specified in the associated MSAs for the transceiver modules 3500, 3600, 3700.

Again, consistent with the foregoing descriptions, the amplifiers 3802, 3804 are integrated within the transceiver modules 3500, 3600, 3700 in a manner that preservers backward compatibility with the MSA specifications such that the transceiver modules 3500, 3600, 3700 with the amplifiers 3802, 3804 can be used in any MSA-compliant host device whether or not the host device is configured to support the amplifiers 3802, 3804. In an exemplary embodiment, the host device can control and monitor the amplifiers 3802, 3804 via the various communication mechanisms described herein such as via software support to communicate via MSA-defined registers, etc. In another exemplary embodiment, the Ethernet port 3530 can be used to control and monitor the amplifiers 3802, 3804 such as via a management system or the like. In yet another exemplary embodiment, the amplifiers 3802, 3804 can be monitored and controlled via custom commands through the host system to the transceiver modules 3500, 3600, 3700 where there is no support directly through the host system.

Figure 41:
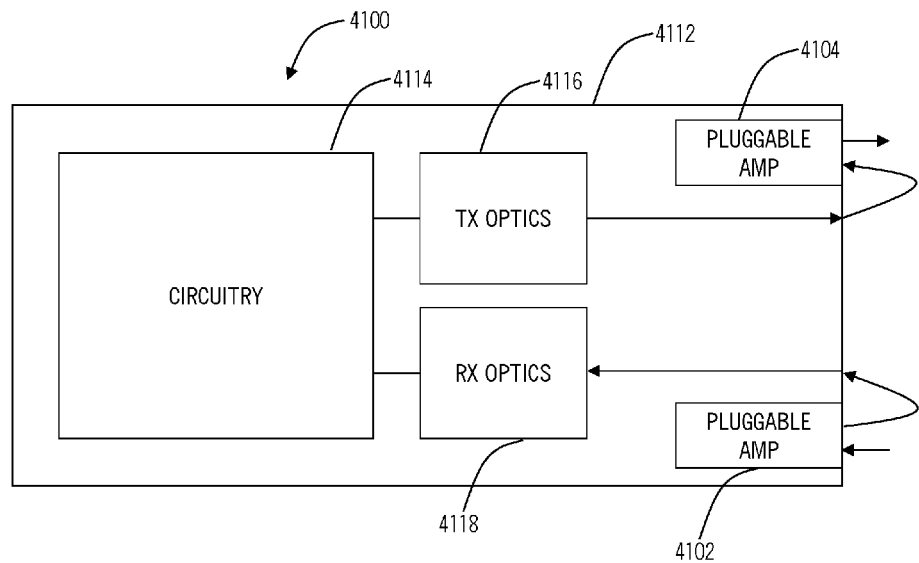
FIG. 41 is a block diagram of a transceiver with pluggable amplifiers contained therein.

Referring to FIG. 41, in an exemplary embodiment, a block diagram illustrates an optical transceiver 4100 with pluggable amplifiers 4102, 4104 contained therein. The transceiver 4100 can be any of the foregoing MSA-compliant transceivers described herein, such as specifically the transceiver modules 3500, 3600, 3700. The transceiver 4100 includes a physical housing 4112 that may be defined by the associated MSA, circuitry 4114, transmitter optics 4116, and receiver optics 4118. The circuitry 4114 can include the various components described herein for interfacing the transceiver 4100 to an MSA-compliant host device, for serializing/deserializing, FEC, framing, OAM&P, modulation, etc. The transmitter optics 4116 and the receiver optics 4118 can include various optical components such as modulators, demodulators, lasers, receivers, multiplexers, demultiplexers, etc. Variously, the transmitter optics 4116 and the receiver optics 4118 are configured, in conjunction with the circuitry 4114, to form composite optical signals as defined by the associated MSA specification.

The physical housing 4112 includes input ports for the pluggable amplifiers 4102, 4104 such that the pluggable amplifiers 4102, 4104 can be selectively inserted as needed for the transceiver 4100. The pluggable amplifier 4102 is a pre amplifier and the pluggable amplifiers 4104 is a post amplifier. When inserted, the pluggable amplifiers 4102, 4104 are physically connected in-line with the transmitter optics 4116 and the receiver optics 4118 via a small optical fiber cable on the front of the physical housing 4112. Note, the pluggable amplifiers 4102, 4104 can be separately used, e.g. if only a pre amplifier is needed, only the pluggable amplifier 4102 is inserted and the pluggable amplifier 4104 is omitted. As described herein, the transceiver 4100 maintains its compatibility with the MSA specifications such that it may be operated in any MSA-compliant host device. Further, the pluggable amplifiers 4102, 4104 are transparent to the MSA-compliant host device, but may be monitored by the host device using the various communication mechanisms described herein.

Figure 42:
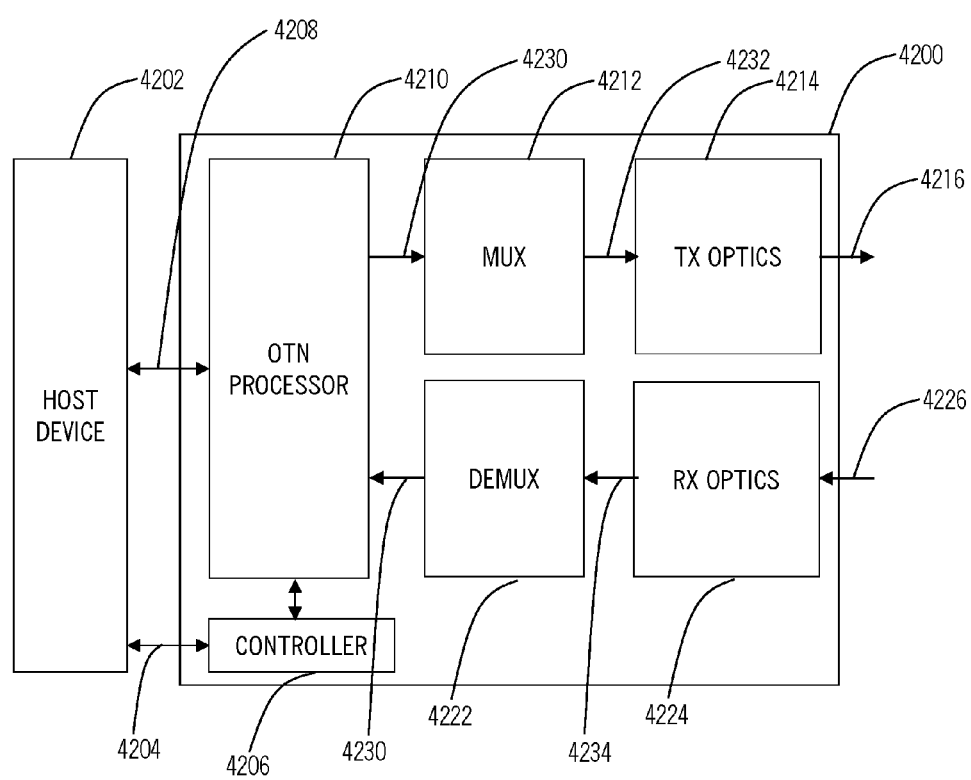
FIG. 42 is a block diagram illustrates a pluggable optical transceiver supporting 40G, 100G, 200G, 400G, etc. with framing and FEC integrated in the pluggable optical transceiver, separate and independent from a host device.

Referring to FIG. 42, in an exemplary embodiment, a block diagram illustrates a pluggable optical transceiver 4200 supporting 40G, 100G, 200G, 400G, etc. with framing and FEC integrated in the pluggable optical transceiver 4200, separate and independent from a host device 4202. The pluggable optical transceiver 4200 can include foregoing MSA-compliant transceivers described herein. The pluggable optical transceiver 4200 also contemplates future MSAs supporting 40G, 100G, 200G, 400G, etc. An exemplary objective of the pluggable optical transceiver 4200 is to perform on-board framing, FEC, and/or OAM&P independent and separate from the host device 4202. In an exemplary embodiment, the framing, FEC, and/or OAM&P is performed without involvement or the knowledge of the host device 4202. This allows advanced functionality support in the pluggable optical transceiver 4200 in any type of the host device 4202, which supports the MSA that the pluggable optical transceiver 4200 is backwards compatible. In other exemplary embodiments, the pluggable optical transceiver 4200 can provide OA&MP data related to the framing, FEC, and/or OAM&P to the host device 4202. For example, the OA&MP data can be provided via a communication link 4204 between a controller 4206 on the pluggable optical transceiver 4200 and the host device 4202. The communication link 4202 can use any of the techniques described herein and can include, without limitation, MDIO, I2C, etc.

A communication link 4208 is configured to provide data between the pluggable optical transceiver 4200 and the host device 4202. The communication link 4208 includes one or more electrical signaling lanes to provide an aggregate of 40G, 100G, 200G, 400G, etc. The communication link 4208 may include a nominal signaling lane rate is 10 Gbit/s per lane with various electrical interface specifications such as CAUI, XLAUI, OTL4.10, OTL3.4, and STL256.4. Other variants may use a signaling lane rate of 25 Gbit/s per lane. For example, the CFP MSA has an electrical interface of 4×10G (XLAUI) or 10×10G (CAUI), the CFP2 MSA has an electrical interface of 4×25G (CAUI2 or CPPI2), and the CFP4 MSA has an electrical interface of 100G. For 200G, 400G, etc., other variants are also contemplates such as 20×10G, 40×10G, 8×25G, 16×25G, 8×50G, 10×40G, 4×100G, etc. That is, the communication link 4208 can be expresses as N×M where N is an integer signifying a number of red in the communication link 4208 and M is a bit rate value signifying a bit rate for each of the N signaling lanes.

The pluggable optical transceiver 4200 includes an OTN processor 4210 coupled to the communication link 4208. The OTN processor 4210 is configured to perform advanced integrated functions including framing, FEC, and/or OAM&P, within the pluggable optical transceiver 4200. Again, the advanced integrated functions are performed independently and separately from the host device 4202. In some embodiments, associated OAM&P data is provided to the host device 4202 from the OTN processor 4210 though the controller 4206 and the communication link 4204. The OTN processor 4210 communicates bidirectionally with the host device 4202 through the communication link 4208. For TX/RX, the OTN processor 4210 outputs data to a multiplexer section 4212 and TX optics 4124 for an optical output 4216, and the OTN process 4210 receives data from a demultiplexer section 4222 which receives data from RX optics 4224 which receives an optical input 4226. In this manner, the pluggable optical transceiver 4200 provides 40G, 100G, 200G, 400G, etc. between the host device 4202 and the optical output 4216 and the optical input 4226. The communication link 4208 can be referred to as interface circuitry configured to interface with the host device 4202 for providing a high-speed signal between the host device 4202 and the pluggable optical transceiver 4200. The OTN processor 4210 can be referred to as framing and forward error correction circuitry configured to provide framing and forward error correction related to the high-speed signal.

The multiplexer section 4212 is configured to receive one or more signaling lanes from the OTN processor 4210 through a communication link 4230. The multiplexer section 4212 is configured to process output data from the OTN processor 4210 for presentation to the TX optics 4124. For example, in an exemplary embodiment, the communication link 4230 has X signaling lanes and an output of the multiplexer section 4212 on a communication link 4232 has Y signaling lanes, X≠Y. In another exemplary embodiment, X=Y. For example, in a 100G device, X may equal 10 lanes and Y may equal 4 lanes. Other embodiments are also contemplated.

The TX optics 4124 include lasers and modulators to take data from the communication link 4232 and optically transmit it on the optical output 4216. The TX optics 4124 can include WDM/DWDM/CWDM components to transmit each of the Y signaling lanes on a separate wavelength. Each of the Y signaling lanes is used to modulate a wavelength. The TX optics 4124 can include any transmission technique such as direct detection, coherent, polarization multiplexing, etc. In an exemplary embodiment, where Y=4 lanes, the TX optics 4124 may include 4×28G DWDM transmission for a 100G client. Here, 4 wavelengths are used to transport a 112G signal (the difference between 100G and 112G being the framing overhead and FEC). That is, the TX optics 4124 can include components supporting Y wavelength transmission, for each of the Y signaling lanes from the communication link 4232. The optical output 4216 is a WDM/DWDM/CWDM signal with the Y wavelengths.

The optics 4224 and the demultiplexer section 4222 perform the opposite functionality on the optical input 4226 as the TX optics 4124 and the multiplexer section 4212. That is, the pluggable optical transceiver 4200 is configured to connect to another pluggable optical transceiver 4200 via an optical link, with the optical output 4216 from a first pluggable optical transceiver 4200 being the optical input 4226 of a second pluggable optical transceiver 4200 and the optical input 4226 of the first pluggable optical transceiver 4200 being the optical output 4216 from the first pluggable optical transceiver 4200. The RX optics include receivers and demodulators to take optical data from the optical input 4226 and convert it to electrical signals output on a communication link 4234 which has Y signaling lanes to correspond to the communication link 4232. The demultiplexer section 4222 receives the Y signaling lanes from the communication link 4234 and provides X signaling lanes on a communication link 4236 to the OTN processor 4210.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure and are intended to be covered by the following claims.

What is claimed is:

1. A pluggable optical transceiver configured to operate in a host device, the pluggable optical transceiver comprising:
   a housing configured to interface with the host device;
   a transmitter and a receiver in the housing;
   electronic dispersion compensation circuitry communicatively coupled to the transmitter and the receiver, wherein the electronic dispersion compensation circuitry is configured to compensate dispersion associated with signals associated with the transmitter and the receiver, and wherein the electronic dispersion compensation circuitry is in the housing, operating independent and separate from the host device;
   interface circuitry configured to interface a dispersion compensated signal to the host device;
   framing circuitry configured to provide framing to the signals from the transmitter and the receiver; and
   forward error correction circuitry configured to provide forward error correction to the signals from the transmitter and the receiver,
   wherein the interface circuitry, the framing circuitry, and the forward error correction circuitry is in the housing, operating independent and separate from the host device.

2. The pluggable optical transceiver of claim 1, further comprising:
   interface circuitry communicatively coupled to the host device, when the pluggable optical transceiver is plugged into the host device, and communicatively coupled to the electronic dispersion compensation circuitry, wherein the interface circuitry is configured to interface a dispersion compensated signal to the host device.

3. The pluggable optical transceiver of claim 1, further comprising:
   framing circuitry communicatively coupled to the electronic dispersion compensation circuitry, wherein the framing circuitry is configured to provide framing to the signals from the transmitter and the receiver, wherein the framing circuitry is in the housing, operating independent and separate from the host device.

4. The pluggable optical transceiver of claim 1, further comprising:
   forward error correction circuitry communicatively coupled to the electronic dispersion compensation circuitry, wherein the forward error correction circuitry is configured to provide forward error correction to the signals from the transmitter and the receiver, wherein the forward error correction circuitry is in the housing, operating independent and separate from the host device.

5. The pluggable optical transceiver of claim 1, wherein the pluggable optical transceiver is compliant to a multi source agreement, wherein the host device is configured to operate compliant devices to the multi source agreement, and wherein the electronic dispersion compensation circuitry operates independent from the multi source agreement such that compatibility is preserved between the pluggable optical transceiver and the host device.

6. The pluggable optical transceiver of claim 1, further comprising:
   Optical Transport Network framing circuitry communicatively coupled to the electronic dispersion compensation circuitry, wherein the Optical Transport Network framing circuitry frames the signals from the transmitter and the receiver within the pluggable optical transceiver which interface non-framed signals with the host device.

7. The pluggable optical transceiver of claim 1, wherein the electronic dispersion compensation circuitry is configured to compensate electrically optical fiber chromatic and/or polarization mode dispersion on the signals.

8. A pluggable optical transceiver method, wherein the pluggable optical transceiver is configured to operate in a host device, the pluggable optical method comprising:
   providing a housing configured to interface with the host device;
   providing a transmitter and a receiver in the housing;
   providing electronic dispersion compensation circuitry communicatively coupled to the transmitter and the receiver, wherein the electronic dispersion compensation circuitry is configured to compensate dispersion associated with signals associated with the transmitter and the receiver, and wherein the electronic dispersion compensation circuitry is in the housing, operating independent and separate from the host device;
   providing interface circuitry configured to interface a dispersion compensated signal to the host device;
   providing framing circuitry configured to provide framing to the signals from the transmitter and the receiver; and
   providing forward error correction circuitry configured to provide forward error correction to the signals from the transmitter and the receiver,
   wherein the interface circuitry, the framing circuitry, and the forward error correction circuitry is in the housing, operating independent and separate from the host device.

9. The pluggable optical transceiver method of claim 8, further comprising:
   providing interface circuitry communicatively coupled to the host device, when the pluggable optical transceiver is plugged into the host device, and communicatively coupled to the electronic dispersion compensation circuitry, wherein the interface circuitry is configured to interface a dispersion compensated signal to the host device.

10. The pluggable optical transceiver method of claim 8, further comprising:
    providing framing circuitry communicatively coupled to the electronic dispersion compensation circuitry, wherein the framing circuitry is configured to provide framing to the signals from the transmitter and the receiver, wherein the framing circuitry is in the housing, operating independent and separate from the host device.

11. The pluggable optical transceiver method of claim 8, further comprising:
    providing forward error correction circuitry communicatively coupled to the electronic dispersion compensation circuitry, wherein the forward error correction circuitry is configured to provide forward error correction to the signals from the transmitter and the receiver, wherein the forward error correction circuitry is in the housing, operating independent and separate from the host device.

12. The pluggable optical transceiver method of claim 8, wherein the pluggable optical transceiver is compliant to a multi source agreement, wherein the host device is configured to operate compliant devices to the multi source agreement, and wherein the electronic dispersion compensation circuitry operates independent from the multi source agreement such that compatibility is preserved between the pluggable optical transceiver and the host device.

13. The pluggable optical transceiver method of claim 8, further comprising:
providing Optical Transport Network framing circuitry communicatively coupled to the electronic dispersion compensation circuitry, wherein the Optical Transport Network framing circuitry frames the signals from the transmitter and the receiver within the pluggable optical transceiver which interface non-framed signals with the host device.

14. The pluggable optical transceiver method of claim 8, wherein the electronic dispersion compensation circuitry is configured to compensate electrically optical fiber chromatic and/or polarization mode dispersion on the signals.

15. A pluggable optical transceiver configured to operate in a host device, the pluggable optical transceiver comprising:
a transmitter and a receiver;
electronic dispersion compensation circuitry communicatively coupled to the transmitter and the receiver, wherein the electronic dispersion compensation circuitry is configured to compensate dispersion associated with signals associated with the transmitter and the receiver;
interface circuitry configured to interface a dispersion compensated signal to the host device;
framing circuitry configured to provide framing to the signals from the transmitter and the receiver; and
forward error correction circuitry configured to provide forward error correction to the signals from the transmitter and the receiver,
wherein the interface circuitry, the framing circuitry, and the forward error correction circuitry is in the housing, operating independent and separate from the host device.

16. The pluggable optical transceiver of claim 15, wherein the framing circuitry is configured to operate according to Optical Transport Network.

17. The pluggable optical transceiver of claim 15, wherein the electronic dispersion compensation circuitry is configured to compensate electrically optical fiber chromatic and/or polarization mode dispersion on the signals.

* * * * *